(12) United States Patent
Ueno et al.

(10) Patent No.: US 6,600,180 B1
(45) Date of Patent: Jul. 29, 2003

(54) SEMICONDUCTOR DEVICE, METHOD OF MANUFACTURING THE SAME AND EXPOSURE MASK FOR IMPLANTATION

(75) Inventors: Syuuichi Ueno; Tomohiro Yamashita; Hirokazu Sayama, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 63 days.

(21) Appl. No.: 09/614,730

(22) Filed: Jul. 12, 2000

(30) Foreign Application Priority Data

Jan. 19, 2000 (JP) ........................................ 2000-010579

(51) Int. Cl.[7] .............................................. H01L 27/10
(52) U.S. Cl. ........................ 257/206; 257/202; 257/203; 257/204; 257/205; 257/296; 257/297; 257/298; 257/299; 257/300; 257/368; 257/797
(58) Field of Search .............................. 257/202–206, 257/296–300, 368, 797

(56) References Cited

U.S. PATENT DOCUMENTS 5,510,636 A * 4/1996 Murata ........................ 257/206
6,144,079 A * 11/2000 Shirahata et al. ............ 257/392

FOREIGN PATENT DOCUMENTS

| JP | 61-268057 | * | 11/1986 |
| JP | 62-40727 |   | 2/1987 |
| JP | 63-211739 | * | 9/1988 |

* cited by examiner

Primary Examiner—Nathan J. Flynn
Assistant Examiner—Ahmed N. Sefer
(74) Attorney, Agent, or Firm—Oblon, Spivak, McClelland, Maier & Neustadt, P.C.

(57) ABSTRACT

A semiconductor device suppressing increase of the number of types of exposure mask for implantations, preventing complication of manufacturing steps and suppressing the manufacturing cost and manufacturing steps therefor are provided. An impurity implantation region (R81) is formed by first implantation with an exposure mask for implantation having an opening at the lower right and this exposure mask for implantation is turned over for forming another impurity implantation region (R82) by second implantation, thereby forming three types of impurity implantation regions including the impurity implantation region (R81) formed through the first implantation, the impurity implantation region (R82) formed through the second implantation and still another impurity implantation region (R83) formed through the first implantation and the second implantation. Four types of regions inclusive of a region (R84) not subjected to impurity implantation can be formed with a single type of exposure mask for implantation. Such implantation regions can be formed also by rotating the exposure mask for implantation.

9 Claims, 53 Drawing Sheets

SEMICONDUCTOR DEVICE, METHOD OF MANUFACTURING THE SAME AND EXPOSURE MASK FOR IMPLANTATION

BACKGROUND OF THE INVENTION

1. Field of the Invention

The present invention relates to a semiconductor device and a method of manufacturing the same, and more particularly, it relates to a semiconductor device having a plurality of types of transistors and a method of manufacturing the same.

2. Description of the Background Art

In recent years, refinement and multi-functionalization of a semiconductor device progress to develop a semiconductor device comprising a plurality of circuit parts having different functions and having a plurality of types of transistors.

For example, a system LSI comprises a mass-storage memory cell part, a logic part operating at a high speed, a peripheral circuit part and the like. In the system LSI, transistors forming the respective circuit parts are different in required performance from each other, leading to the necessity of arranging a plurality of types of transistors.

While a plurality of types of masks must be prepared in order to form the transistors, the number of the types of the required masks is increased in proportion to the number of the types of the transistors, to disadvantageously complicate manufacturing steps and increase the manufacturing cost.

SUMMARY OF THE INVENTION

A semiconductor device according to a first aspect of the present invention at least comprises a first impurity region of a first impurity concentration having a first pattern formed in a target layer, a second impurity region having a second pattern symmetrical with the first pattern formed in the target layer with a second impurity concentration and a symmetrical third impurity region having a third impurity concentration corresponding to the total of the first and second impurity concentrations formed in the target layer.

In the semiconductor device according to the first aspect, three types of impurity regions can be obtained through two impurity introduction steps by forming the third impurity region in steps of forming the first and second impurity regions, for example, whereby the semiconductor device can be obtained through simplified manufacturing steps.

According to a second aspect of the present invention, the first and second patterns are rotation-symmetrical.

In the semiconductor device according to the second aspect, the first and second impurity regions are so rotation-symmetrically arranged that the first impurity region can be formed by introducing an impurity through an exposure mask for implantation having a pattern corresponding to the first impurity region and the second impurity region can be formed by thereafter rotating the exposure mask for implantation, for example, whereby the number of types of exposure mask for implantations can be reduced for manufacturing the semiconductor device at a low cost.

According to a third aspect of the present invention, the first and second patterns are line-symmetrical.

In the semiconductor device according to the third aspect, the first and second impurity regions are so line-symmetrically arranged that the first impurity region can be formed by introducing an impurity through an exposure mask for implantation having a pattern corresponding to the first impurity region and the second impurity region can be formed by thereafter turning over the exposure mask for implantation, for example, whereby the number of types of exposure mask for implantations can be reduced for manufacturing the semiconductor device at a low cost.

According to a fourth aspect of the present invention, the first and second impurity concentrations are different from each other.

In the semiconductor device according to the fourth aspect, circuits having different functions can be formed on the basis of the first and second impurity regions by rendering the first and second impurity concentrations different from each other.

According to a fifth aspect of the present invention, the first and second impurity concentrations are identical to each other.

In the semiconductor device according to the fifth aspect, first and second impurity regions symmetrical also in concentration can be obtained by rendering the first and second impurity concentrations identical to each other and a plurality of semiconductor devices identical in structure to each other can be obtained by dividing the first and second impurity regions to include the third impurity region respectively. Thus, the manufacturing cost for the semiconductor device can be reduced.

An exposure mask for implantation according to a sixth aspect of the present invention is employed for manufacturing the semiconductor device according to the first aspect and used in a first or second arrangement state to satisfy the symmetry between the first and second patterns for forming a pattern for implanting an impurity into the target layer corresponding to the first impurity region and the third impurity region when used in the first arrangement state and implanting an impurity into the target layer in regions corresponding to the second impurity region and the third impurity region when used in the second arrangement state.

In the exposure mask for implantation according to the sixth aspect, the third impurity region can be formed in steps of forming the first and second impurity regions.

A semiconductor device according to a seventh aspect of the present invention at least comprises a plurality of first impurity regions of a first impurity concentration having predetermined patterns formed in a target layer and a symmetrical second impurity region having a second impurity concentration integral times the first impurity concentration formed in the target layer, and the respective predetermined patterns of the plurality of first impurity regions are formed in symmetry.

In the semiconductor device according to the seventh aspect, the second impurity region having a concentration obtained by multiplying the first impurity concentration by the number of the first impurity regions can be obtained as the maximum concentration region, and a plurality of types of impurity regions having different concentrations ranging from the first impurity concentration to the aforementioned maximum concentration can be formed with a single type of exposure mask for implantation depending on the pattern formed on the exposure mask for implantation.

According to an eighth aspect of the present invention, each of the predetermined patterns of the plurality of first impurity regions is rotation-symmetrical.

In the semiconductor device according to the eighth aspect, the plurality of first impurity regions are so rotation-symmetrically arranged that the initial first impurity region can be formed by introducing an impurity through an exposure mask for implantation having a pattern corresponding to the first impurity regions and the second first impurity region can be formed by thereafter rotating the exposure mask for implantation, for example, whereby the number of types of exposure mask for implantations can be reduced and the manufacturing cost for the semiconductor device can also be reduced.

According to a ninth aspect of the present invention, each of the predetermined patterns of the first impurity regions is line-symmetrical.

In the semiconductor device according to the ninth aspect, the plurality of first impurity regions are so line-symmetrically arranged that the initial first impurity region can be formed by introducing an impurity through an exposure mask for implantation having a pattern corresponding to the first impurity regions and the second first impurity region can be formed by thereafter turning over the exposure mask for implantation, for example, whereby the number of types of exposure mask for implantations can be reduced and the manufacturing cost for the semiconductor device can also be reduced.

A method of manufacturing a semiconductor device according to a tenth aspect of the present invention comprises a step of (a) forming an implantation pattern at least having a first impurity region of a first impurity concentration having a first pattern formed in a target layer, a second impurity region having a second impurity concentration formed in the target layer with a second pattern symmetrical with the first pattern and a symmetrical third impurity region having a third impurity concentration corresponding to the total of the first and second impurity concentrations formed in the target layer, and the step (a) includes steps of (a-1) preparing an exposure mask for implantation used in a first or second arrangement state to satisfy the symmetry between the first and second patterns for transferring a pattern for implanting an impurity into the target layer corresponding to the first impurity region and the third impurity region when used in the first arrangement state and for implanting an impurity into the target layer in regions corresponding to the second impurity region and the third impurity region when used in the second arrangement state, (a-2) using the exposure mask for implantation in the first arrangement state for ion-implanting the impurity into the target layer in regions corresponding to the first impurity region and the third impurity region to be in the first impurity concentration, and (a-3) using the exposure mask for implantation in the second arrangement state for ion-implanting the impurity into the target layer in the region corresponding to the second impurity region to be in the second impurity concentration while increasing the impurity concentration of the target layer in the region corresponding to the third impurity region for forming the third impurity region.

In the method of manufacturing a semiconductor device according to the tenth aspect, the first to third impurity regions can be formed by using a single type of exposure mask for implantation in various arrangement states, whereby the number of exposure mask for implantations required for manufacturing the semiconductor device can be reduced for reducing the manufacturing cost.

According to an eleventh aspect of the present invention, the second arrangement state of the exposure mask for implantation is rotated by 180° with respect to the first arrangement state, and the first and second impurity regions are rotation-symmetrically-arranged through the steps (a-2) and (a-3).

In the method of manufacturing a semiconductor device according to the eleventh aspect, the second impurity region is formed by rotating the exposure mask for implantation after forming the first impurity region, whereby the number of types of exposure mask for implantations can be reduced for reducing the manufacturing cost.

According to a twelfth aspect of the present invention, the second arrangement state of the exposure mask for implantation is obtained by turning over the exposure mask for implantation with respect to the first arrangement state, and the first and second impurity regions are line-symmetrically arranged through the steps (a-2) and (a-3).

In the method of manufacturing a semiconductor device according to the twelfth aspect, the second impurity region is formed by turning over the exposure mask for implantation after forming the first impurity region, whereby the number of types of exposure mask for implantations can be reduced for reducing the manufacturing cost.

According to a thirteenth aspect of the present invention, the method of manufacturing a semiconductor device according to the tenth aspect further comprises a step of (b) dividing the implantation pattern by dicing after the step (a).

In the method of manufacturing a semiconductor device according to the thirteenth aspect, a semiconductor device having an asymmetrical implantation pattern can be obtained by dividing the symmetrical implantation pattern by dicing.

According to a fourteenth aspect of the present invention, the step (b) includes a step of setting a dicing line at least on the third impurity region.

In the method of manufacturing a semiconductor device according to the fourteenth aspect, the symmetrical implantation pattern can be divided into asymmetrical implantation patterns partially including the third impurity region having a relatively high concentration on an arbitrary position by setting the dicing line on the third impurity region.

According to a fifteenth aspect of the present invention, an alignment mask for aligning the exposure mask for implantation is arranged on the target layer, and the exposure mask for implantation has first and second alignment marks to be superposed with the alignment mask in the first and second arrangement states respectively.

In the method of manufacturing a semiconductor device according to the fifteenth aspect, the exposure mask for implantation has the first and second alignment marks to be superposed with the alignment mark in the first and second arrangement states respectively, whereby misalignment of the mask position can be prevented also when varying the arrangement state of the exposure mask for implantation.

According to a sixteenth aspect of the present invention, the first and second alignment marks include marks indicating whether the exposure mask for implantation is used in the first arrangement state or in the second arrangement state.

In the method of manufacturing a semiconductor device according to the sixteenth aspect, it follows that the alignment marks include arrangement information, whereby it is possible to recognize whether the exposure mask for implantation is used in the first arrangement state or in the second arrangement state.

A method of manufacturing a semiconductor device according to a seventeenth aspect of the present invention comprises a step of (a) forming an implantation pattern at least comprising a plurality of first impurity regions of a first impurity concentration having predetermined patterns formed in a target layer and a symmetrical second impurity region having a second impurity concentration integral times the first impurity concentration formed in the target layer with the predetermined patterns of the plurality of first impurity regions formed in symmetry, and the step (a) includes steps of (a-1) preparing an exposure mask for implantation used in an arrangement state varied along a rule satisfying the symmetry of the respective predetermined patterns thereby transferring a pattern for successively implanting an impurity into the target layer corresponding to the plurality of first impurity regions and repetitively implanting an impurity into the target layer corresponding to the second impurity region, and (a-2) successively ion-implanting the impurity into the target layer in regions corresponding to the plurality of first impurity regions to be in the first impurity concentration and increasing the impurity concentration of the target layer corresponding to the second impurity region thereby forming the second impurity region, while varying the arrangement state of the exposure mask for implantation along the rule.

In the method of manufacturing a semiconductor device according to the seventeenth aspect, impurity implantation into the second impurity region is repeated every time the arrangement state of the exposure mask for implantation is varied along the prescribed rule for forming each first impurity region, whereby the second impurity region having a concentration obtained by multiplying the first impurity concentration by the number of the first impurity regions can be obtained as the maximum concentration region, and a plurality of types of impurity regions having different concentrations ranging from the first impurity concentration to the aforementioned maximum concentration can be formed with a single type of exposure mask for implantation depending on the pattern formed on the exposure mask for implantation. Thus, the number of types of exposure mask for implantations can be reduced for reducing the manufacturing cost.

According to an eighteenth aspect of the present invention, the rule is a rule of varying the arrangement state by rotating the exposure mask for implantation by predetermined angles, and the plurality of first impurity regions are rotation symmetrically arranged respectively through the step (a-2).

In the method of manufacturing a semiconductor device according to the eighteenth aspect, the exposure mask for implantation is rotated by a prescribed angle for forming the first impurity regions, whereby the first impurity regions can be formed in a number obtained by dividing 360° by the angle of rotation and the concentration of the second impurity region can be increased by the number of the first impurity regions.

According to a nineteenth aspect of the present invention, the rule is a rule of turning over the exposure mask for implantation in different directions by a prescribed number of times, and the plurality of first impurity regions are line-symmetrically arranged respectively through the step (a-2).

In the method of manufacturing a semiconductor device according to the nineteenth aspect, the exposure mask for implantation is turned over in different directions by a prescribed number of times for forming the first impurity regions, whereby a single type of exposure mask for implantation can be used at least for four implantation steps.

According to a twentieth aspect of the present invention, an alignment mark for aligning the exposure mask for implantation is arranged on the target layer, and the exposure mask for implantation has a plurality of alignment marks to be superposed with the alignment mark following variation of the arrangement state respectively.

In the method of manufacturing a semiconductor device according to the twentieth aspect, the exposure mask for implantation has the plurality of alignment marks to be superposed with the alignment mask following variation of the arrangement state respectively, whereby misalignment of the mask position can be prevented also when varying the arrangement state of the exposure mask for implantation.

According to a twenty-first aspect of the present invention, the plurality of alignment marks include a mark indicating in which arrangement state the exposure mask for implantation is used.

In the method of manufacturing a semiconductor device according to the twenty-first aspect, it follows that the alignment marks include arrangement information, whereby it is possible to recognize in which arrangement state the exposure mask for implantation is used.

A method of manufacturing a semiconductor device according to a twenty-second aspect of the present invention comprises a step of (a) forming symmetrical first and second wire patterns in a target layer, the first and second wire patterns have wire parts and contact parts respectively, and the step (a) includes steps of (a-1) preparing an exposure mask for wire formation forming a pattern used in a first or second arrangement state to satisfy the symmetry of the first and second wire patterns for forming a pattern for defining the wire part of the first wire pattern and defining the contact part of the second wire pattern when used in the first arrangement and removing the wire part from the second wire pattern and removing the contact part from the first wire pattern when used in the second arrangement state, (a-2) employing the exposure mask for wire formation in the first arrangement state for removing the target layer corresponding to the wire part in the first wire pattern and removing the target layer corresponding to the contact part in the second wire pattern, (a-3) employing the exposure mask for wire formation in the second arrangement state for removing the target layer corresponding to the contact part in the first wire pattern thereby forming a first etching pattern corresponding to the wire part and the contact part of the first wire pattern and removing the target layer corresponding to the wire part in the second wire pattern thereby forming a second etching pattern corresponding to the wire part and the contact part of the second wire pattern, and (a-4) filling a predetermined conductive material in the first and second etching patterns for forming the first and second wire patterns.

In the method of manufacturing a semiconductor device according to the twenty-second aspect, the first and second wire patterns symmetrically arranged in plan view are formed by varying the arrangement state of a single type of exposure mask for wire formation through the so-called dual damascene method, whereby a plurality of equal wire patterns can be simultaneously obtained for reducing the manufacturing cost.

According to a twenty-third aspect of the present invention, the second arrangement state of the exposure mask for wire formation is rotated by 180° with respect to the first arrangement state, and the first and second wire patterns are rotation-symmetrically arranged through the steps (a-2) to (a-4).

In the method of manufacturing a semiconductor device according to the twenty-third aspect, underlayers corresponding to the wire parts and the contact parts in the first and second wire patterns are alternately removed by rotating the exposure mask for wire formation, whereby the number of types of exposure mask for implantations can be reduced for reducing the manufacturing cost.

According to a twenty-fourth aspect of the present invention, the second arrangement state of the exposure mask for wire formation is obtained by turning over the exposure mask for wire formation with respect to the first arrangement state, and the first and second wire patterns are line-symmetrically arranged through the steps (a-2) to (a-4).

In the method of manufacturing a semiconductor device according to the twenty-fourth aspect, underlayers corresponding to the wire parts and the contact parts in the first and second wire patterns are alternately removed by turning over the exposure mask for wire formation, whereby the number of types of exposure mask for implantations can be reduced for reducing the manufacturing cost.

According to a twenty-fifth aspect of the present invention, the method of manufacturing a semiconductor device according to the twenty-second aspect further comprises a step of (b) dividing the first wire pattern and the second wire pattern by dicing after the step (a).

In the method of manufacturing a semiconductor device according to the twenty-fifth aspect, the first wire pattern and the second wire pattern are divided by dicing, whereby a plurality of semiconductor devices having equal wire patterns can be simultaneously obtained.

According to a twenty-sixth aspect of the present invention, an alignment mark for aligning the exposure mask for wire formation is arranged on the target layer, and the exposure mask for wire formation has first and second alignment marks to be superposed with the alignment mark in the first and second arrangement states respectively.

In the method of manufacturing a semiconductor device according to the twenty-sixth aspect, the exposure mask for wire formation has the first and second alignment marks to be superposed with the alignment mark in the first and second arrangement states respectively, whereby misalignment of the mask position can be prevented also when varying the arrangement state of the exposure mask for wire formation.

According to a twenty-seventh aspect of the present invention, the first and second alignment marks include a mark indicating whether the exposure mask for wire formation is used in the first arrangement state or in the second arrangement state.

In the method of manufacturing a semiconductor device according to the twenty-seventh aspect, it follows that the alignment marks include arrangement information, whereby it is possible to recognize whether the exposure mask for wire formation is used in the first arrangement state or in the second arrangement state.

An object of the present invention is to provide a semiconductor device suppressing increase of the number of types of masks for preventing complication of manufacturing steps and suppressing the manufacturing cost, a method of manufacturing the same and an exposure mask for implantation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

<Basic Concept of the Invention>

The basic concept of the present invention is now described with reference to FIGS. 1, 2A, 2B, 3A and 3B.

Figure 1:
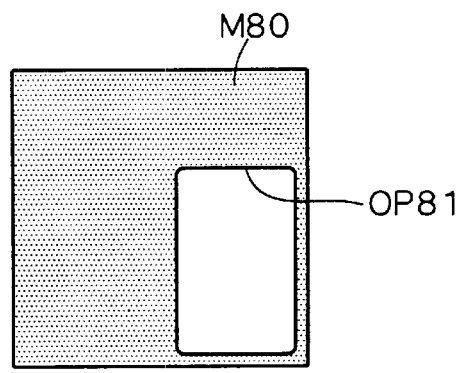
FIGS. 1, 2A, 2B, 3A and 3B are plan views illustrating the basic concept of the present invention.

FIG. 1 is a plan view showing the structure of a rectangular exposure mask for implantation M80 having a rectangular opening OP81. It is assumed that the exposure mask for implantation M80 is normally positioned when the opening OP81 is located at the lower right.

Figure 2A:
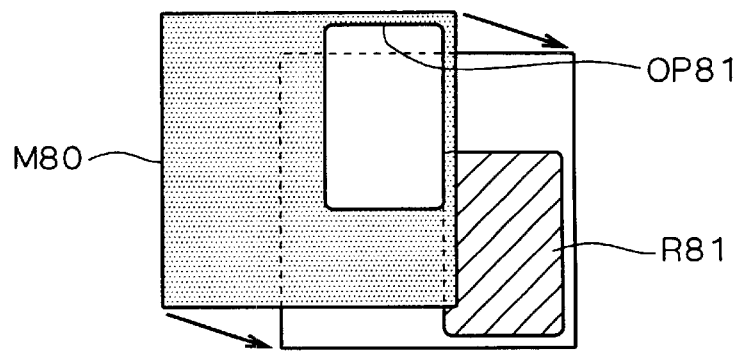

FIG. 2A typically shows a state of performing impurity implantation into a semiconductor substrate by performing pattern transfer to resist (not shown) with the exposure mask for implantation M80 in the normal position for forming an impurity implantation region R81 in the semiconductor substrate, thereafter turning over the exposure mask for implantation M80 to locate the opening OP81 at the upper right, arranging the same on the semiconductor substrate and performing pattern transfer to resist (not shown) so that the opening OP81 is partially superposed with the impurity implantation region R81.

Figure 2B:
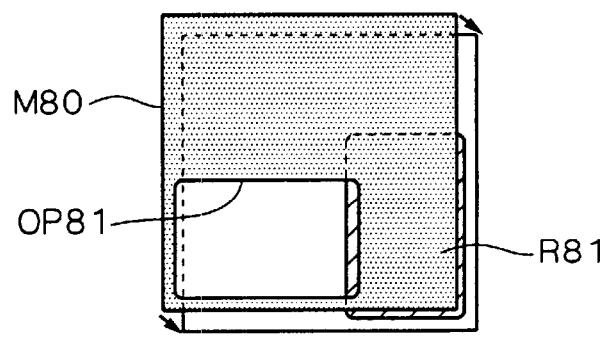

FIG. 2B typically shows a state of performing impurity implantation into a semiconductor substrate by performing pattern transfer to resist (not shown) with the exposure mask for implantation M80 in the normal position for forming an impurity implantation region R81 in the semiconductor substrate, thereafter rotating the exposure mask for implantation M80 by 90° to locate the opening OP81 at the lower left, arranging the same on the semiconductor substrate and performing pattern transfer to resist (not shown) so that the opening OP81 is partially superposed with the impurity implantation region R81.

Figure 3A:
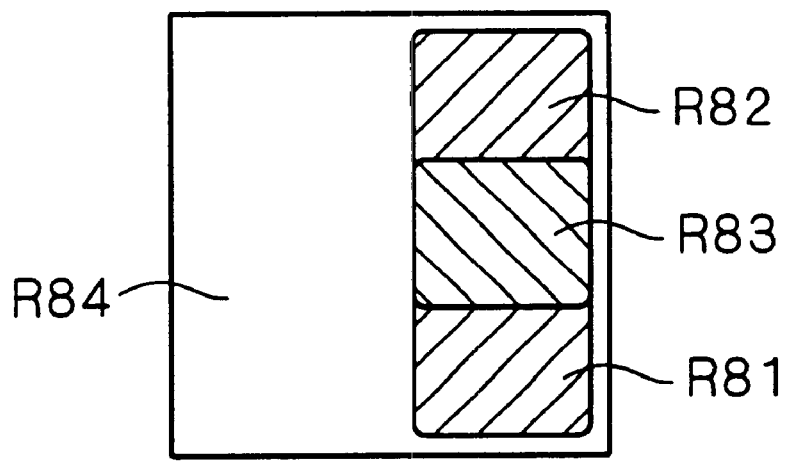
Figure 3B:
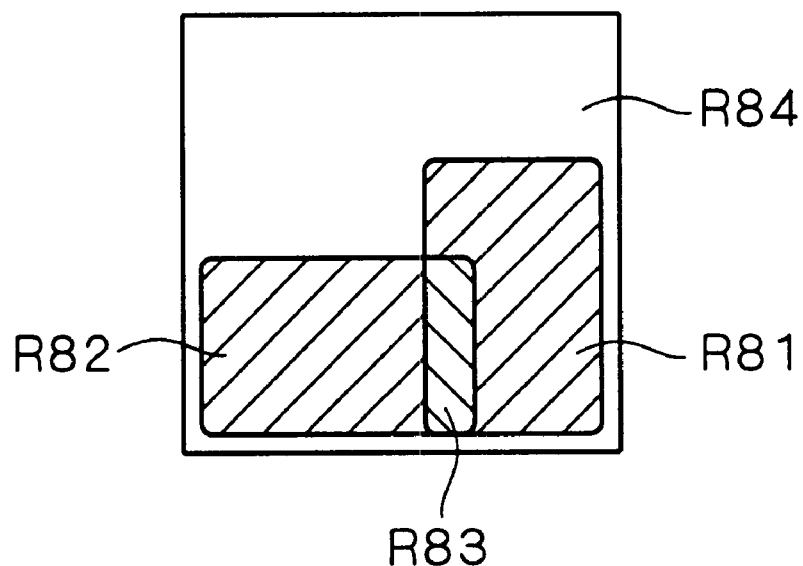

According to either technique, three types of ion implantation regions, i.e., the impurity implantation region R81 formed through the first implantation, the impurity implantation region R82 formed through the second implantation and an impurity implantation region R83 formed through the first implantation and the second implantation are obtained as shown in FIG. 3A or 3B. Thus, four types of regions, inclusive of a region R84 not subjected to impurity implantation, can be formed with the single type of exposure mask for implantation M80.

The present invention has been proposed on the basis of the technical idea of forming at least three types of impurity implantation regions with a single type of exposure mask for implantation by setting an opening pattern to cause superposed and non-superposed portions before and after rotation (or turnover) when varying the arrangement state of the exposure mask for implantation by rotation (or turnover).

<A. Embodiment 1>
<A-1. Device Structure>

As an embodiment 1 of the present invention, exemplary structures of an implantation pattern in steps of forming a semiconductor device formed by rotation of masks and exemplary structures of mask patterns for forming the implantation pattern are described with reference to FIGS. 4 to 20.

<A-1-1. First Exemplary Structure>

Figure 4:
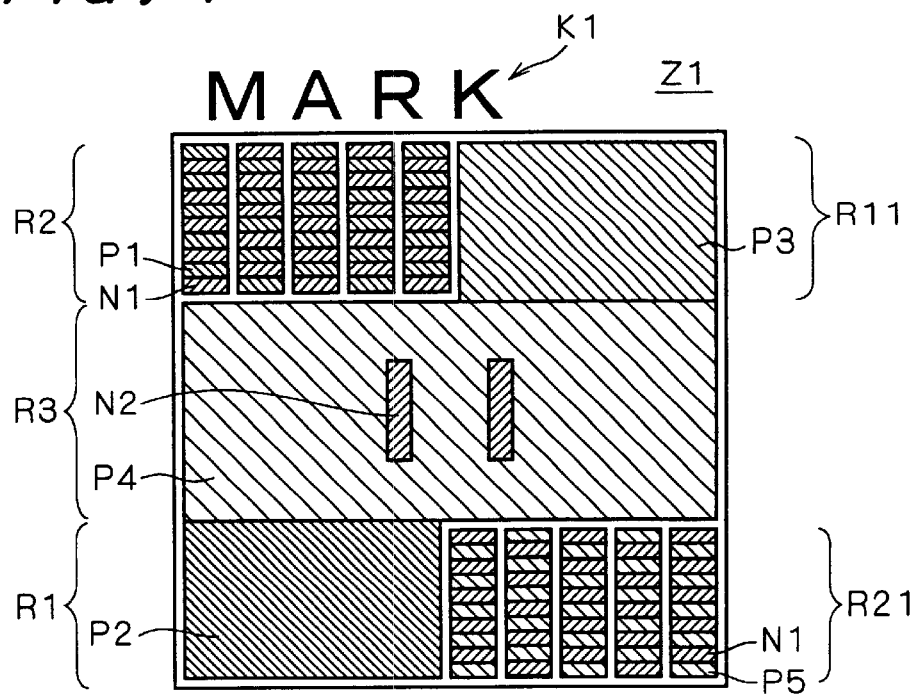
FIG. 4 is a plan view illustrating a first structure of an implantation pattern in an embodiment 1 of the present invention.
Figure 5:
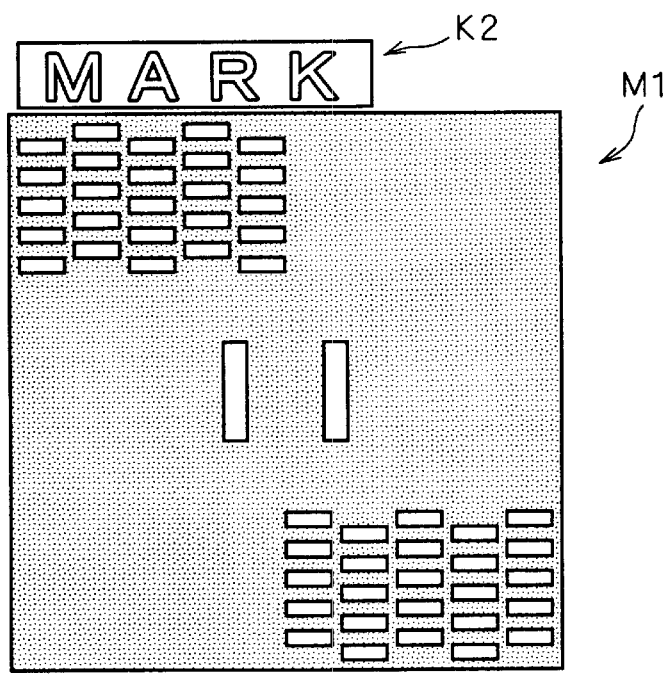
FIGS. 5 and 6 illustrate exposure mask for implantations for manufacturing the first structure of the implantation pattern in the embodiment 1 of the present invention.
Figure 6:
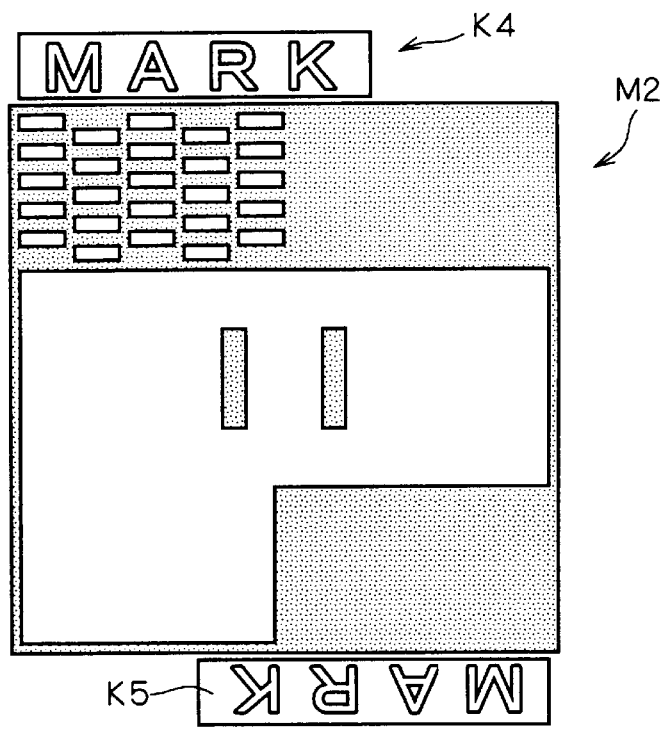

FIG. 4 shows an implantation pattern Z1 for well regions formed on a semiconductor substrate (target layer) as a first exemplary structure of the implantation pattern, and FIGS. 5 and 6 show exposure mask for implantations M1 and M2 for forming this implantation pattern Z1. The implantation pattern Z1 is shown in a simplified manner for convenience of illustration of the present invention.

As shown in FIG. 4, the implantation pattern Z1 has a rectangular shape and generally includes five regions, i.e., a lower left region R1, an upper left region R2, a central region R3, a region R11 diagonal to the region R1 and a region R21 diagonal to the region R2.

An alignment mark K1 for mask alignment is provided on the semiconductor substrate outside the implantation pattern Z1.

While the implantation pattern Z1 is formed on the semiconductor substrate, FIGS. 4 to 6 omit illustration of the semiconductor substrate. This also applies to the drawings of all implantation patterns described later.

The regions R1 and R11 finally define memory cell parts forming a DRAM (Dynamic Random Access Memory) or the like, the regions R2 and R21 finally define logic parts and the region R3 finally defines a peripheral circuit part, for forming a system LSI as a whole.

P-type impurity regions (hereinafter referred to as P regions) P2 and P3 are formed in the regions R1 and R11 as well regions respectively.

The region R2 has such an implantation pattern that a plurality of P regions P1 and a plurality of N-type impurity regions (hereinafter referred to as N regions) N1 are alternately arranged as well regions and such arrays are arranged in parallel.

Similarly, the region R21 has such an implantation pattern that a plurality of P regions P5 and a plurality of N regions N1 are alternately arranged as well regions and such arrays are arranged in parallel.

The region R3 has an implantation pattern provided with two N regions N2 and a P region P4 arranged around the N regions N2 as well regions.

The N regions N1 and N2 have a first impurity concentration, the P regions P1 and P2 have a second impurity concentration, the P regions P3 and P5 have a third impurity concentration, and the P region P4 has a fourth impurity concentration corresponding to the total of the second and third impurity concentrations. The P region P4 has a symmetrical pattern shape.

FIG. 5 shows the exposure mask for implantation M1 for forming the N regions N1 and N2 in a pattern having openings in portions corresponding to the N regions N1 and N2. The mask M1 is provided on its outer edge with an alignment mark K2 to be superposed with the alignment mark K1 on the semiconductor substrate.

FIG. 6 shows the exposure mask for implantation M2 for forming the P regions P1 to P5 in a pattern having openings in portions corresponding to the P regions P1, P2 and P4 in the normal position. The mask M2 is provided on its outer edges with alignment marks K4 and K5 to be superposed with the alignment mark K1 on the semiconductor substrate in the normal position and a reverse position (position rotated by 180° with respect to the normal position) respectively.

In order to form the implantation pattern Z1 with the exposure mask for implantations M1 and M2 having such structures, the exposure mask for implantation M1 is first arranged on the semiconductor substrate to which a resist material is applied for forming a resist pattern by performing pattern transfer through photolithography and ion-implanting an N-type impurity into the semiconductor substrate through the resist pattern thereby forming the N regions N1 and N2 having the first impurity concentration.

Then, the exposure mask for implantation M2 is arranged on the semiconductor substrate formed with the N regions N1 and N2 in the normal position for forming a resist pattern by performing pattern transfer through photolithography and ion-implanting a P-type impurity through the resist pattern thereby forming the P regions P1 and P2 having the second impurity concentration. At this time, P-type impurity ions are implanted also into a portion for forming the P region P4 in the second impurity concentration.

Then, the exposure mask for implantation M2 is arranged on the semiconductor substrate formed with the P regions P1 and P2 in the reverse position for forming a resist pattern by performing pattern transfer through photolithography and ion-implanting a P-type impurity through the resist pattern thereby forming the P regions P3 and P5 having the third impurity concentration while implanting P-type impurity ions into the portion for forming the P region P4 in the third impurity concentration thereby forming the P region P4 having the fourth impurity concentration.

Thus, the exposure mask for implantation M2 has such an opening pattern that superposed and non-superposed portions are present when used in rotation by 180°. Therefore, three types of implantation patterns having different concentrations can be obtained with a single type of mask by setting doses on the normal and reverse positions to different values so that four types of implantation patterns can be obtained with two types of masks inclusive of the exposure mask for implantation M1. The method of forming the implantation pattern Z1 is described in further detail later.

<A-1-2. Second Exemplary Structure>

Figure 7:
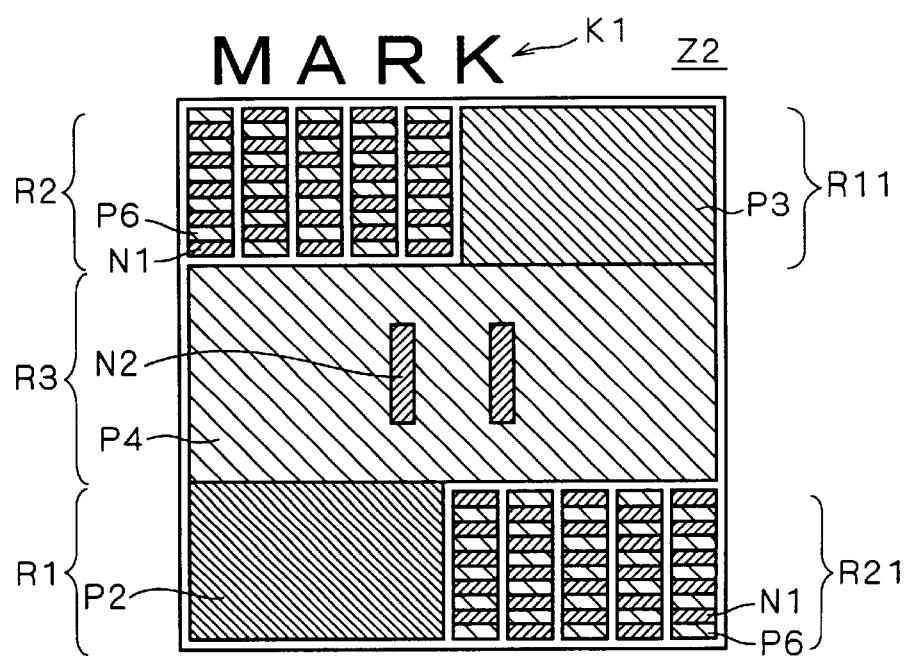
FIG. 7 is a plan view illustrating a second structure of the implantation pattern in the embodiment 1 of the present invention.
Figure 8:
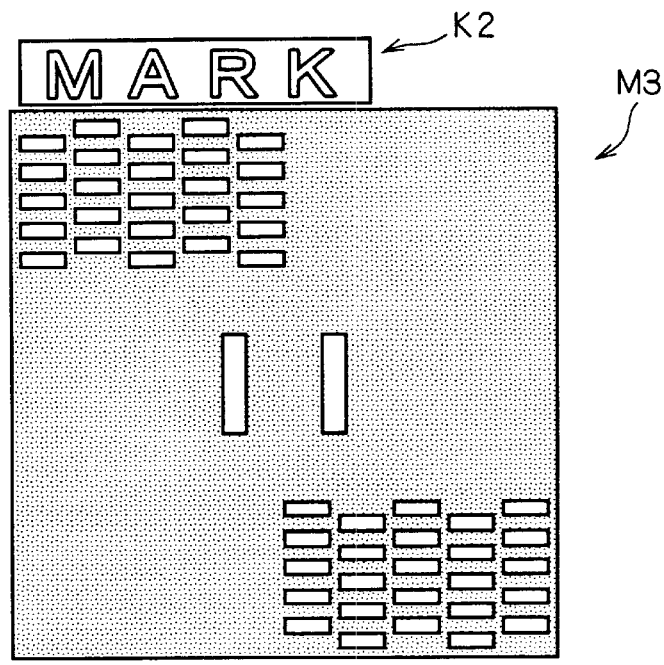
FIGS. 8 and 9 illustrate exposure mask for implantations for manufacturing the second structure of the implantation pattern in the embodiment 1 of the present invention.
Figure 9:
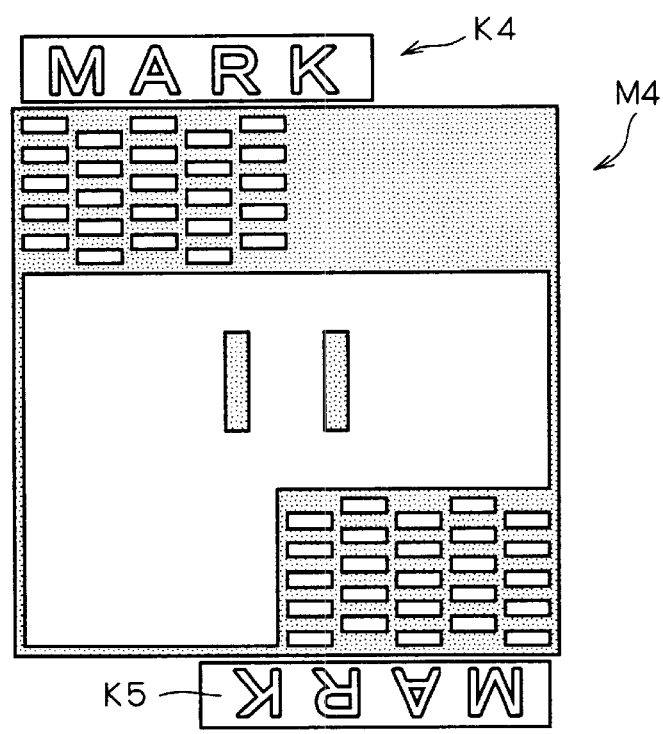

FIG. 7 shows an implantation pattern Z2 for well regions formed on a semiconductor substrate as a second exemplary structure of the implantation pattern, and FIGS. 8 and 9 show exposure mask for implantations M3 and M4 for forming this implantation pattern Z2. The implantation pattern Z2 is shown in a simplified manner for convenience of illustration of the present invention.

As shown in FIG. 7, the implantation pattern Z2 generally includes five regions R1, R2, R3, R11 and R21 for finally forming a system LSI as a whole, similarly to the implantation pattern Zi described with reference to FIG. 4. Parts identical in structure to those of the implantation pattern Z1 are denoted by the same reference numerals, to omit redundant description.

P regions P2 and P3 are formed in the regions R1 and R11 as well regions respectively.

Each of the regions R2 and R21 has such an implantation pattern that a plurality of P regions P6 and a plurality of N regions N1 are alternately arranged as well regions and such arrays are arranged in parallel.

The region R3 has an implantation pattern provided with two N regions N2 and a P region P4 arranged around the N regions N2 as well regions.

The N regions N1 and N2 have a first impurity concentration, the P regions P2 and P3 have second and third impurity concentrations respectively, and the P regions P4 and P6 have a fourth impurity concentration corresponding to the total of the second and third impurity concentrations. The P regions P4 and P6 have symmetrical pattern shapes.

FIG. 8 shows the exposure mask for implantation M3 for forming the N regions N1 and N2, having a pattern formed with openings in portions corresponding to the N regions N1 and N2.

FIG. 9 shows the exposure mask for implantation M4 for forming the P regions P2 to P4 and P6, having a pattern formed with openings in portions corresponding to the P regions P2, P4 and P6 in the normal position.

Referring to FIGS. 8 and 9, parts identical in structure to those of the exposure mask for implantations M1 and M2 described with reference to FIGS. 5 and 6 are denoted by the same reference numerals, to omit redundant description.

In order to form the implantation pattern Z2 with the exposure mask for implantations M3 and M4 having the aforementioned structures, the exposure mask for implantation M3 is first arranged on the semiconductor substrate to which a resist material is applied for forming a resist pattern by performing pattern transfer through photolithography and ion-implanting an N-type impurity into the semiconductor substrate through the resist pattern for forming the N regions N1 and N2 having the first impurity concentration.

Then, the exposure mask for implantation M4 is arranged on the semiconductor substrate formed with the N regions N1 and N2 in the normal position for forming a resist pattern by performing pattern transfer through photography and ion-implanting a P-type impurity through the resist pattern for forming the P region P2 having the second impurity concentration. At this time, P-type impurity ions are implanted also into portions for forming the P regions P4 and P6 in the second impurity concentration.

Then, the exposure mask for implantation M4 is arranged on the semiconductor substrate formed with the P region P2 in a reverse position for forming a resist pattern by performing pattern transfer and ion-implanting a P-type impurity through the resist pattern for forming the P region P3 having the third impurity concentration while implanting P-type impurity ions also into portions for forming the P regions P4 and P6 in the third impurity concentration thereby forming the P regions P4 and P6 having the fourth impurity concentration.

Thus, the exposure mask for implantation M4 has such an opening pattern that superposed and non-superposed portions are present when used in rotation by 180°, whereby three types of implantation patterns having different concentrations can be obtained with a single type of mask by setting doses on the normal and reverse positions to different values so that four types of implantation patterns can be obtained with two types of masks inclusive of the exposure mask for implantation M3.

<A-1-3. Third Exemplary Structure>

Figure 10:
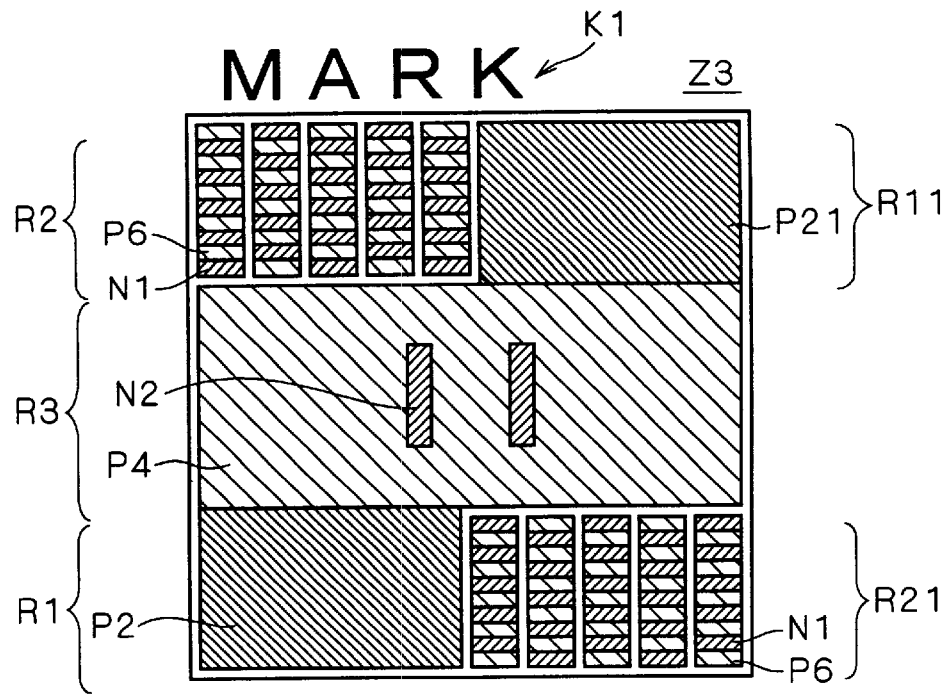
FIG. 10 is a plan view illustrating a third structure of the implantation pattern in the embodiment 1 of the present invention.
Figure 11:
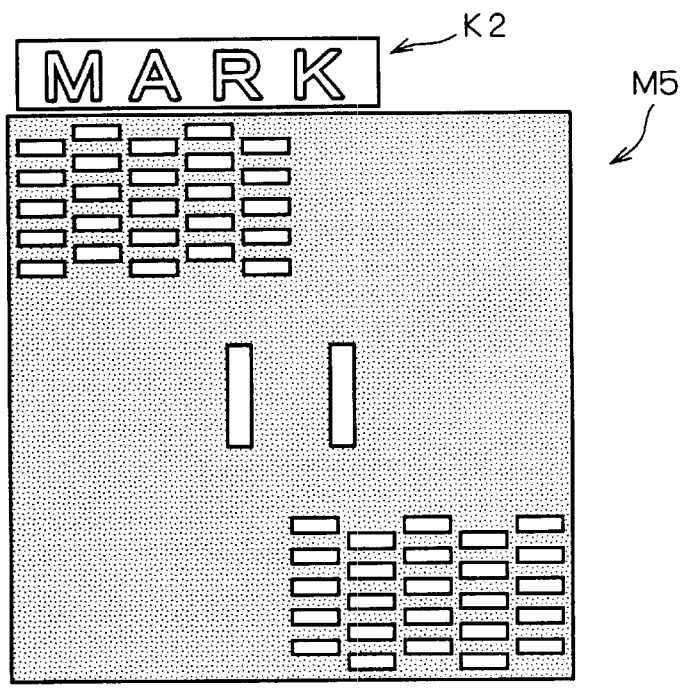
FIGS. 11 and 12 illustrate exposure mask for implantations for manufacturing the third structure of the implantation pattern in the embodiment 1 of the present invention.
Figure 12:
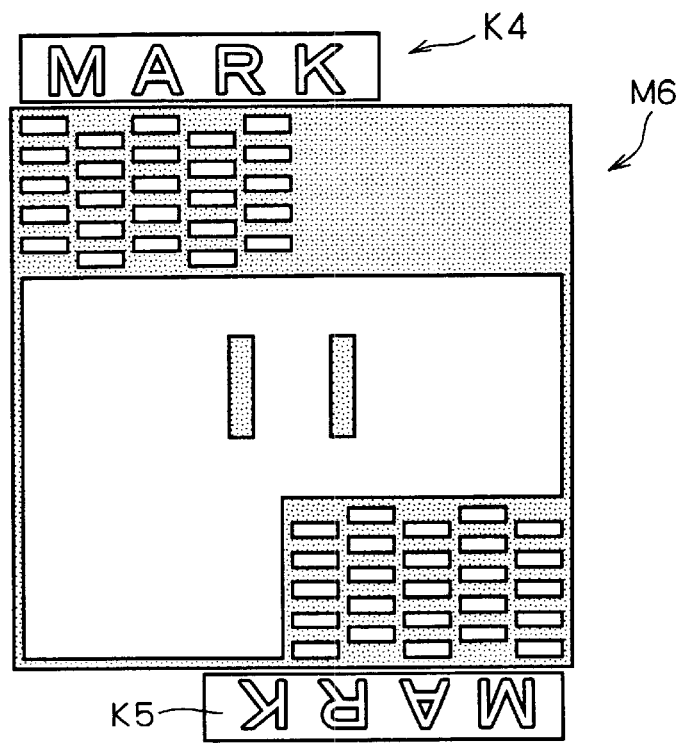

FIG. 10 shows an implantation pattern Z3 for well regions formed on a semiconductor substrate as a third exemplary structure of the implantation pattern, and FIGS. 11 and 12 show exposure mask for implantations M5 and M6 for forming the implantation pattern Z3. The implantation pattern Z3 is shown in a simplified manner for convenience of illustration of the present invention.

As shown in FIG. 10, the implantation pattern Z3 generally includes five regions R1, R2, R3, R11 and R21 and finally forms a system LSI as a whole, similarly to the implantation pattern Z1 described with reference to FIG. 4. Parts identical in structure to those of the implantation pattern Z1 are denoted by the same reference numerals, to omit redundant description.

P regions P2 and P21 are formed in the regions R1 and R1 as well regions.

Each of the regions R2 and R21 has such an implantation pattern that a plurality of P regions P6 and a plurality of N regions N1 are alternately arranged as well regions and such arrays are arranged in parallel.

The region R3 has an implantation pattern provided with two N regions N2 and a P region P4 arranged around the N region N2 as well regions.

The N regions N1 and N2 have a first impurity concentration, the P regions P2 and P21 have a second impurity concentration, and the P regions P4 and P6 have a third impurity concentration twice the second impurity concentration. The P regions P4 and P6 have symmetrical pattern shapes.

FIG. 11 shows the exposure mask for implantation M5 for forming the N regions N1 and N2, having openings in portions corresponding to the N regions N1 and N2.

FIG. 12 shows the exposure mask for implantation M6 for forming the P regions P2, P21, P4 and P6, having openings in portions corresponding to the P regions P2, P4 and P6 in the normal position.

Referring to FIGS. 11 and 12, parts identical in structure to those of the exposure mask for implantations M1 and M2 described with reference to FIGS. 5 and 6 are denoted by the same reference numerals, to omit redundant description.

In order to form the implantation pattern Z3 with the exposure mask for implantations M5 and M6 having the aforementioned structures, the exposure mask for implantation M5 is arranged on the semiconductor substrate to which a resist material is applied, for forming a resist pattern by performing pattern transfer through photolithography and ion-implanting an N-type impurity into the semiconductor substrate through the resist pattern for forming the N regions N1 and N2 having the first impurity concentration.

Then, the exposure mask for implantation M6 is arranged on the semiconductor substrate formed with the N regions N1 and N2 in the normal position, for forming a resist pattern by performing pattern transfer through photolithography and ion-implanting a P-type impurity through the resist pattern for forming the P region P2 having the second impurity concentration. At this time, P-type impurity ions are implanted also into portions for forming the P regions P4 and P6 in the second impurity concentration.

Then, the exposure mask for implantation M4 is arranged on the semiconductor substrate formed with the P region P2 in a reverse position, for forming a resist pattern by performing pattern transfer through photolithography and ion-implanting a P-type impurity in the second impurity concentration through the resist pattern for forming the P region P21 having the second impurity concentration while implanting P-type impurity ions also into portions for forming the P regions P4 and P6 in the second impurity concentration again thereby forming the P regions P4 and P6 having the third impurity concentration.

Thus, the exposure mask for implantation M6 has such an opening pattern that superposed and non-superposed portions are present when used in rotation by 180°, whereby two types of implantation patterns having different concentrations can be obtained with a single type of mask by rendering doses on the normal and reverse positions identical to each other so that three types of implantation patterns can be obtained with two types of masks inclusive of the exposure mask for implantation M5.

The P regions P6 have the third impurity concentration twice the second impurity concentration in the regions R2 and R21 for defining logic parts in the implantation pattern Z3, whereby the degree of integration of the logic parts can be improved for attaining refinement.

While well regions are generally electrically isolated from each other through depletion layers formed on P-N junction interfaces, no transistors can be formed on the portions formed with the depletion layers for isolation. If the well regions have low impurity concentrations, it follows that the depletion layers extend to widen the area allowing no formation of transistors and inhibit integration. When the well regions have high impurity concentrations, however, extension of the depletion layers is suppressed to narrow the area allowing no formation of transistors, and the transistors can be formed up to portions close to the boundaries between the well regions, whereby the degree of integration can be improved. In this case, the concentration of the N regions N1 is also raised in coincidence with that of the P regions P6.

The regions R1 and R11 for defining memory cell parts basically have single well regions, and hence refinement attained by suppression of depletion layers can be expected only in peripheral parts. To the contrary, it is possible to attain such an effect that a junction field can be reduced by reducing the impurity concentration. Further, a leakage current is reduced and a retention time (time for rewriting stored contents) can be set long and hence a memory device reducing power consumption can be implemented.

<A-1-4. Fourth Exemplary Structure>

Figure 13:
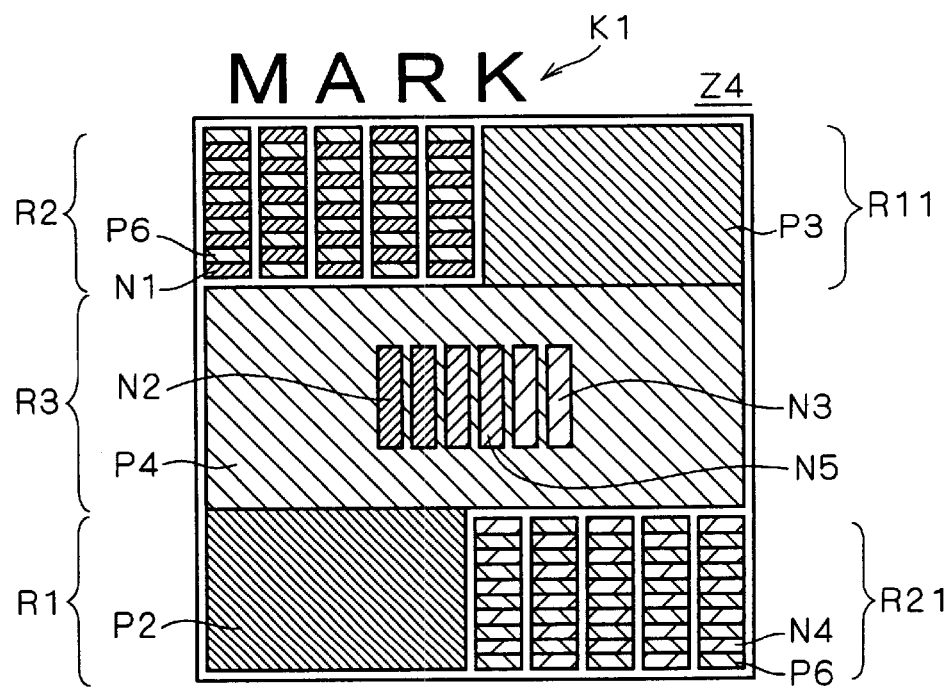
FIG. 13 is a plan view illustrating a fourth structure of the implantation pattern in the embodiment 1 of the present invention.
Figure 14:
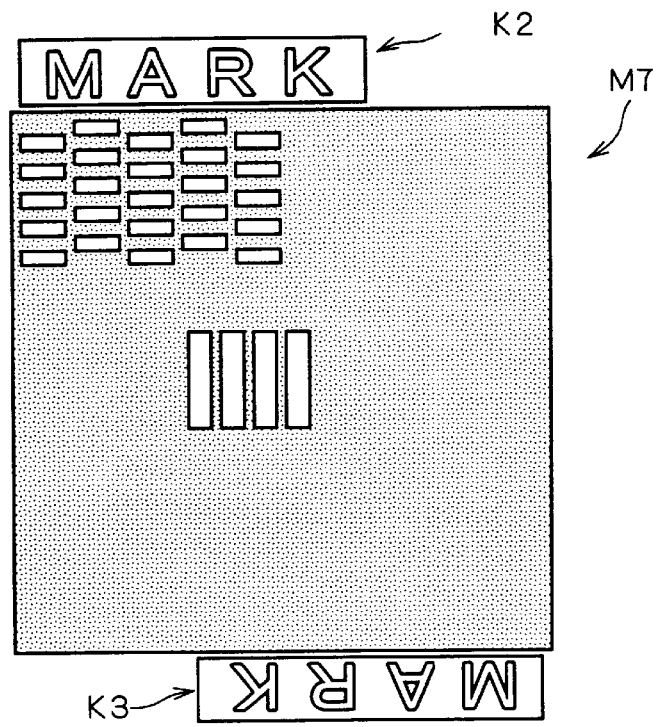
FIGS. 14 and 15 illustrate exposure mask for implantations for manufacturing the fourth structure of the implantation pattern in the embodiment 1 of the present invention.
Figure 15:
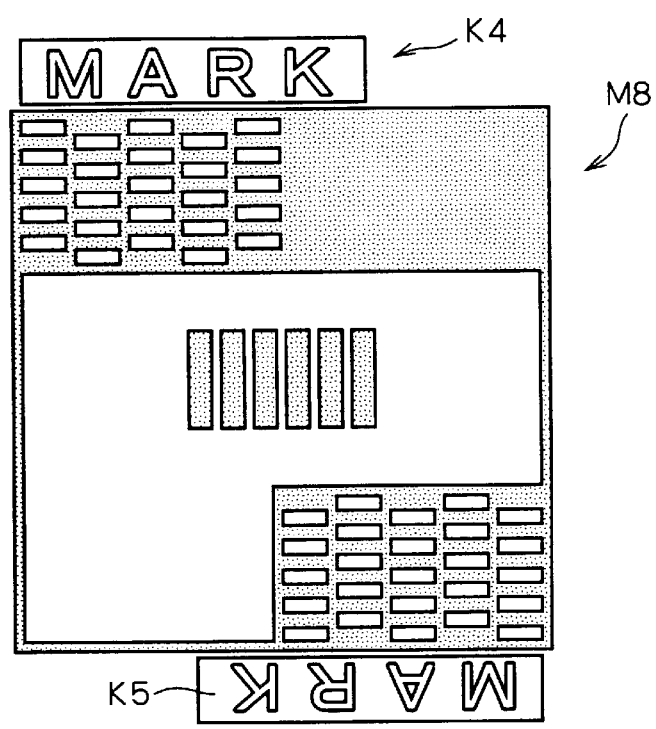

FIG. 13 shows an implantation pattern Z4 for well regions formed on a semiconductor substrate as a fourth exemplary structure of the implantation pattern, and FIGS. 14 and 15 show exposure mask for implantations M7 and M8 for forming this implantation pattern Z4. The implantation pattern Z4 is shown in a simplified manner for convenience of illustration of the present invention.

As shown in FIG. 13, the implantation pattern Z4 generally includes five regions R1, R2, R3, R11 and R21 for finally forming a system LSI as a whole, similarly to the implantation pattern Z1 described with reference to FIG. 4. Parts identical in structure to those of the implantation pattern Z1 are denoted by the same reference numerals, to omit redundant description.

P regions P2 and P3 are formed in the regions R1 and R11 as well regions.

The region R2 has such an implantation pattern that a plurality of P regions P6 and a plurality of N regions N1 are alternately arranged as well regions and such arrays are arranged in parallel.

The region R21 has such an implantation pattern that a plurality of P regions P6 and a plurality of N regions N4 are alternately arranged as well regions and such arrays are arranged in parallel.

The region R3 has an implantation pattern provided with pairs of N regions N2, N5 and N3 successively arranged from left in FIG. 13 and a P region P4 arranged around the N regions N2, N5 and N3 as well regions.

The N regions N1 and N2 have a first impurity concentration, the N regions N3 and N4 have a second impurity concentration, the N regions N5 have a third impurity concentration corresponding to the total of the first and second impurity concentrations, the P region P2 has a fourth impurity concentration, the P region P3 has a fifth impurity concentration, and the P regions P4 and P6 have a sixth impurity concentration corresponding to the total of the fourth and fifth impurity concentrations. The P regions P4 and P6 have symmetrical pattern shapes.

FIG. 14 shows the exposure mask for implantation M7 for forming the N regions N1 to N5, having a pattern formed with openings in portions corresponding to the N regions N1, N2 and N5 in the normal position.

The mask M7 is provided on its outer edges with alignment marks K2 and K3 to be superposed with an alignment mark K1 on the semiconductor substrate in the normal position and a reverse position respectively.

FIG. 15 shows the exposure mask for implantation M8 for forming the P regions P2 to P4 and P6, having a pattern formed with openings in portions corresponding to the P regions P2, P4 and P6 in the normal position.

Referring to FIGS. 14 and 15, parts identical in structure to those of the exposure mask for implantations M1 and M2 described with reference to FIGS. 5 and 6 are denoted by the same reference numerals, to omit redundant description.

In order to form the implantation pattern Z4 with the exposure mask for implantations M7 and M8 having the aforementioned structures, the exposure mask for implantation M7 is first arranged on the semiconductor substrate to which a resist material is applied, for forming a resist pattern by performing pattern transfer through photolithography and ion-implanting an N-type impurity into the semiconductor substrate through the resist pattern thereby forming the N regions N1 and N2 having the first impurity concentration. At this time, N-type impurity ions are implanted also into portions for forming the N regions N5 in the first impurity concentration.

Then, the exposure mask for implantation M7 is arranged on the semiconductor substrate formed with the N regions N1 and N2 in the reverse position for forming a resist pattern by performing pattern transfer through photolithography and ion-implanting an N-type impurity through the resist pattern thereby forming the N regions N3 and N4 having the second impurity concentration. At this time, N-type impurity ions are implanted also into portions for forming the N regions N5 in the second impurity concentration, for forming the N regions N5 having the third impurity concentration.

Then, the exposure mask for implantation M8 is arranged on the semiconductor substrate formed with the N regions N1 to N5, for forming a resist pattern by performing pattern transfer through photolithography and ion-implanting a P-type impurity through the resist pattern thereby forming the P region P2 having the fourth impurity concentration. At this time, P-type impurity ions are implanted also into portions for forming the P regions P4 and P6.

Then, the exposure mask for implantation M8 is arranged on the semiconductor substrate formed with the P region P2 in a reverse position, for forming a resist pattern by performing pattern transfer through photolithography and ion-implanting a P-type impurity in the fifth impurity concentration through the resist pattern thereby forming the P region P3 having the fifth impurity concentration while implanting P-type impurity ions in the fifth impurity concentration also into the portions for forming the P regions P4 and P6 thereby forming the P regions P4 and P6 having the sixth impurity concentration.

Thus, each of the exposure mask for implantations M7 and M8 has such an opening pattern that superposed and non-superposed portions are present when used in rotation by 180°, whereby three types of implantation patterns having different concentrations can be obtained with a single type of mask by setting doses on the normal and reverse positions to different values so that six types of implantation patterns can be obtained with two types of masks, i.e., the exposure mask for implantations M7 and M8.

<A-1-5. Modifications of Alignment Marks>

While each of the exposure mask for implantations used in rotation by 180° has two alignment marks for the normal and reverse positions in the aforementioned first to fourth exemplary structures, these alignment marks are identical to each other and it is impossible to determine whether the exposure mask for implantation is in the normal position or in the reverse position by simply observing the alignment marks.

While the normal and reverse positions can be readily determined in the exposure mask for implantation M2 shown in FIG. 6 having a simple opening pattern, for example, it is difficult to determine the normal or reverse position from the opening pattern if the opening pattern is complicated, leading to a high possibility of a false mask arrangement.

Figure 16:
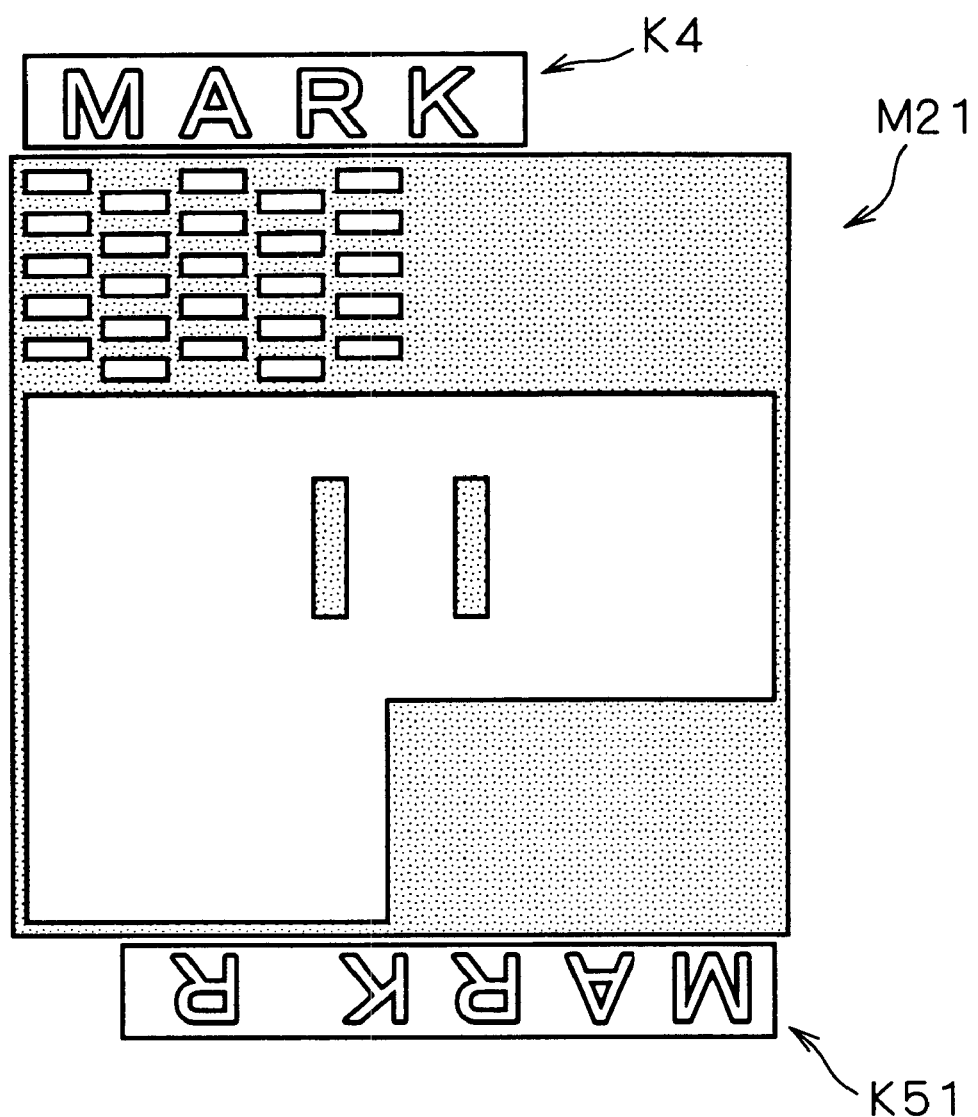
FIG. 16 illustrates a modification of an alignment mark of one of the exposure mask for implantations in the embodiment 1 of the present invention.

Therefore, alignment marks may have different shapes for normal and reverse positions, for preventing erroneous mask arrangement. FIG. 16 shows an example.

FIG. 16 shows an exposure mask for implantation M21 substituting for the exposure mask for implantation M2 described with reference to FIG. 6, having alignment marks K4 and K51 used in normal and reverse positions respectively.

Figure 17:
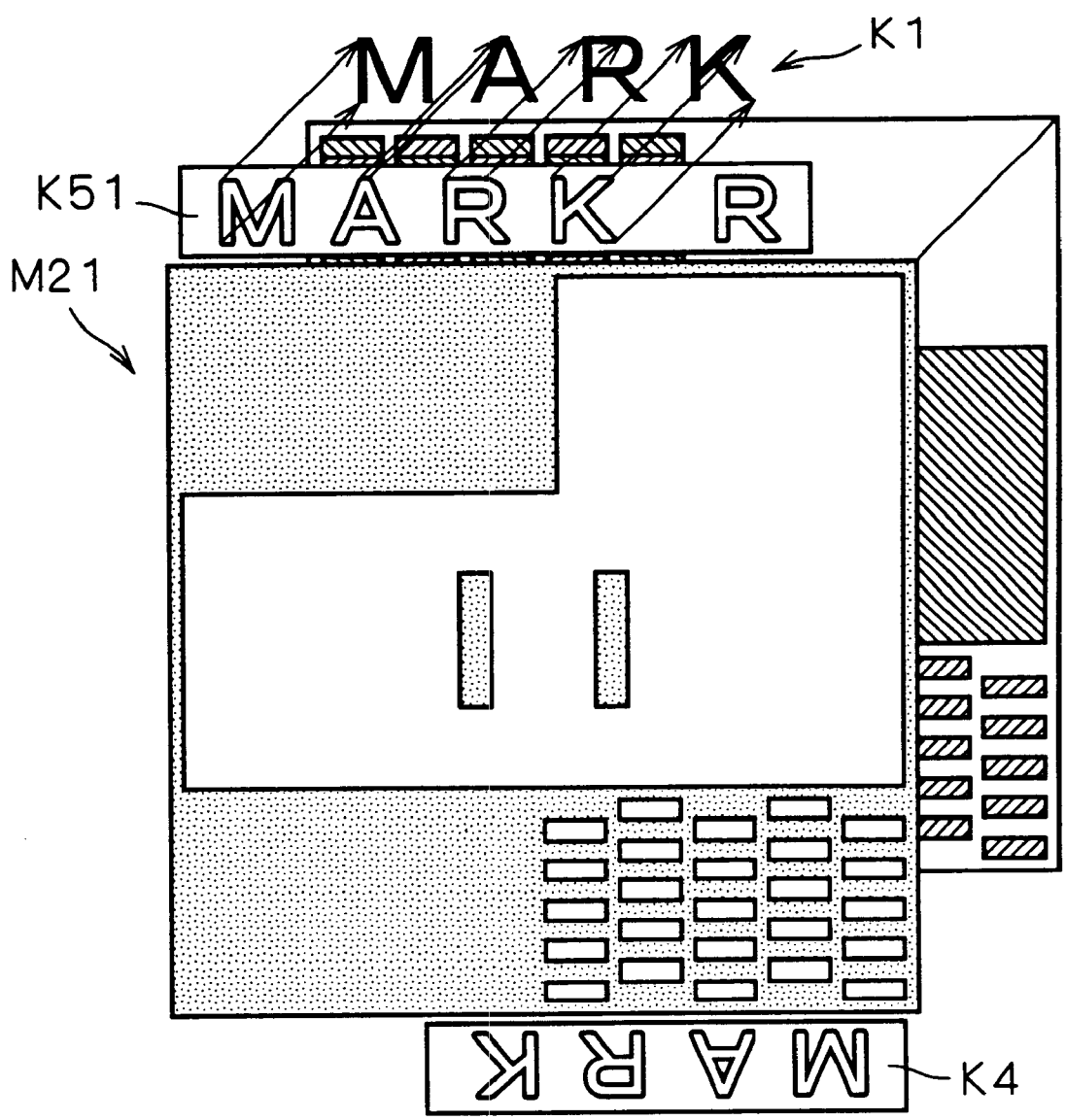
FIG. 17 illustrates a used state of the modification of the alignment mark.

When the alignment mark K51 having a character "R" indicating reversal in addition to characters "MARK" to match with the alignment mark K1 on the semiconductor substrate as shown in FIG. 16 is superposed with the alignment mark K1 on the semiconductor substrate as shown in FIG. 17, such rotational information that the exposure mask for implantation M21 is rotationally used in the reverse position is immediately recognized.

Figure 18:
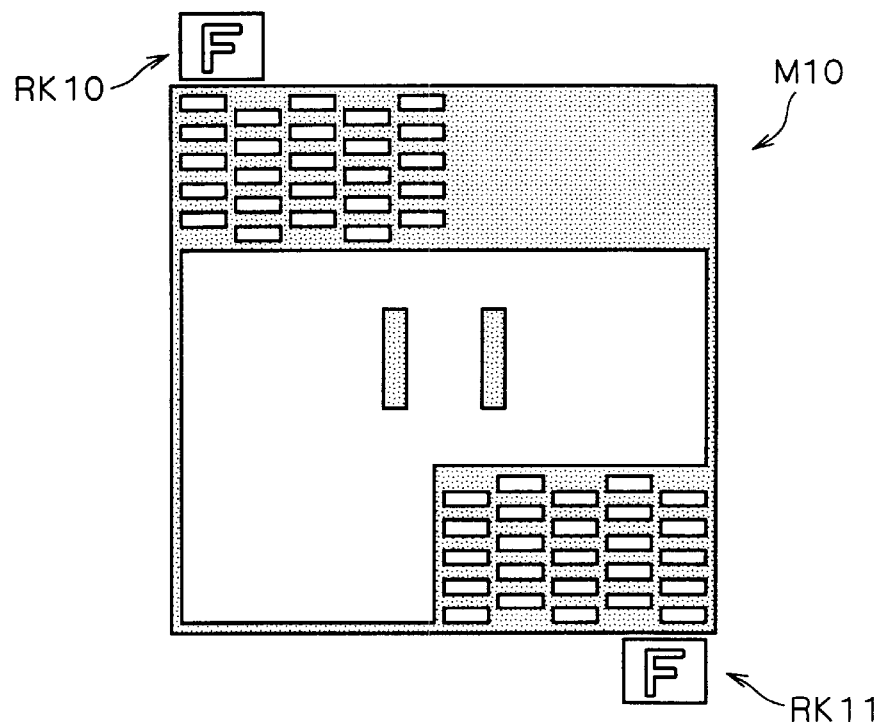
FIGS. 18 to 20 illustrate other modifications of alignment marks of the exposure mask for implantations in the embodiment 1 of the present invention.
Figure 19:
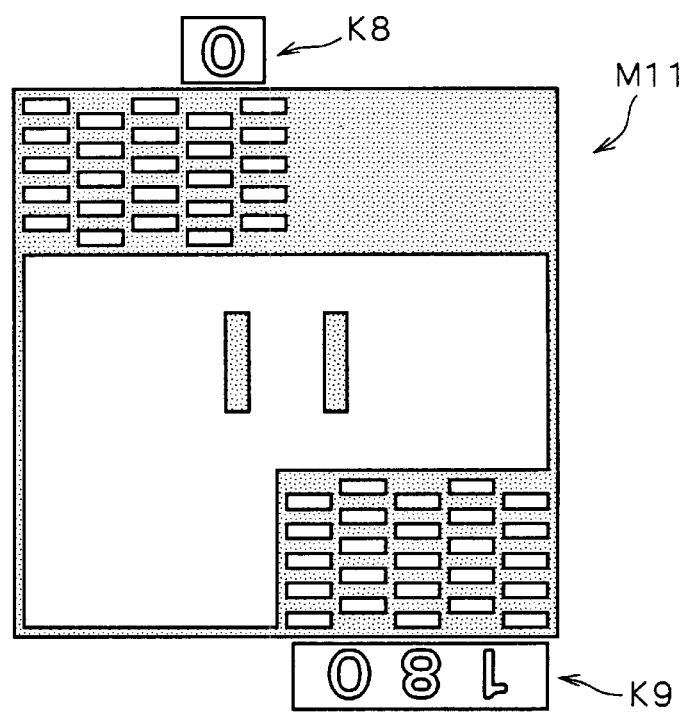

In order to introduce the rotational information into the mask, structures of exposure mask for implantations M10 and M11 shown in FIGS. 18 and 19 may be employed.

The exposure mask for implantation M10 shown in FIG. 18 is provided with rotation marks RK10 and RK11 having rotational information of the mask M10.

While the rotation marks RK10 and RK11 are in the form of the character "F", the rotation mark RK11 is arranged with the vertically reversed character "F" when the mask M10 is used in a reverse position so that such rotational information that the exposure mask for implantation M10 is rotationally used in the reverse position is immediately recognized. In alignment of the exposure mask for implantation M10, it follows that alignment marks are separately arranged.

The exposure mask for implantation M11 shown in FIG. 19 is provided with alignment marks K8 and K9 for normal and reverse positions in the form of numerals "0" and "180" respectively. In this case, an alignment mark on a semiconductor substrate is in the form of the numeral "0". When the alignment mark K9 is superposed with the alignment mark on the semiconductor substrate, therefore, such rotational information that the exposure mask for implantation M1 is rotationally used in the reverse position is immediately recognized.

When using the alignment mark K9, the part of the numeral "0" is superposed with the alignment mark on the semiconductor substrate. The part of the numeral "0" may not be used as the alignment mark but another numeral, character or symbol arranged in proximity to the numeral "0" may be used the an alignment mark, so that the numerals "0" and "180" are used simply as rotational information.

The rotational information of the mask may be introduced not only into the alignment mark(s) but also into the pattern of the mask.

Figure 20:
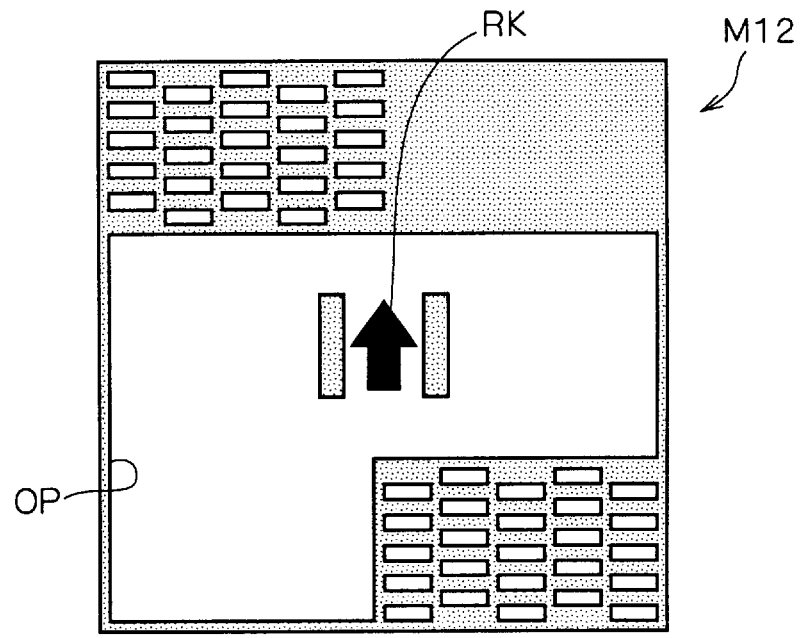

FIG. 20 shows an exposure mask for implantation M12 having an arrow-shaped mark (rotation mark) RK indicating rotational information arranged substantially at the center of an opening OP for ion implantation. Both sides of the rotation mark RK are shading portions defining regions not subjected to ion implantation in the exposure mask for implantation M12. FIG. 20 omits illustration of alignment marks.

The rotation mark RK shown in FIG. 20 is so arranged as to direct the head of the arrow upward in the normal position and it follows that the head of the arrow is directed downward when the exposure mask for implantation M12 is reversed, whereby such rotational information that the exposure mask for implantation M12 is rotationally used in the reverse position is immediately recognized.

Ion implantation can be performed also in a portion under the rotation mark RK by preparing the rotation mark RK from a transparent material for photolithography.

<A-2. Exemplary Manufacturing Method>

As an exemplary manufacturing method for the aforementioned first to fourth exemplary structures, a method of manufacturing the implantation pattern Z1 for well regions described with reference to FIG. 4 is described in further detail with reference to FIGS. 21 to 34.

<A-2-1. Description of Manufacturing Method with Reference to Plan Views>

The manufacturing method is now described with reference to plan views successively showing steps.

Figure 21:
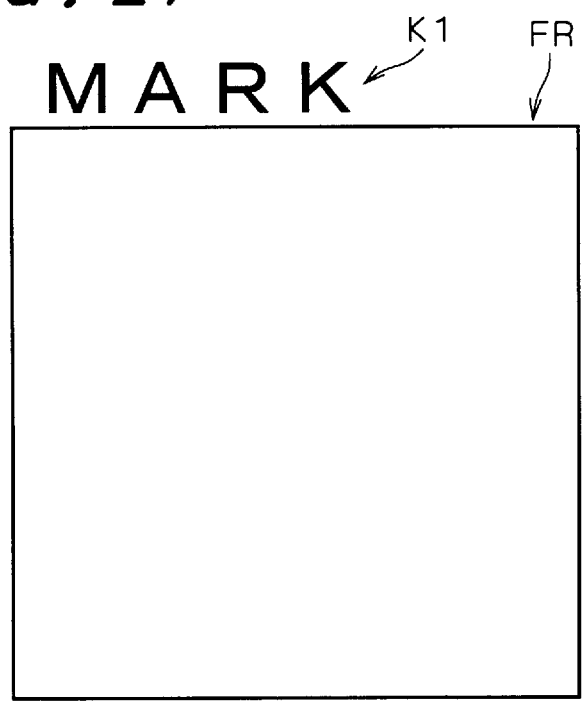
FIGS. 21 to 26 are plan views illustrating steps of manufacturing the implantation pattern in the embodiment 1 of the present invention.

First, the alignment mark K1 is arranged in the vicinity of a device forming region FR on the semiconductor substrate (target layer), as shown in FIG. 21. The alignment mark K1 is formed by irregularizing the surface of the semiconductor substrate or providing a metal film. While a resist material is applied onto the semiconductor substrate, the alignment mark K1 is still visually recognizable after application of the resist material (not shown).

Figure 22:
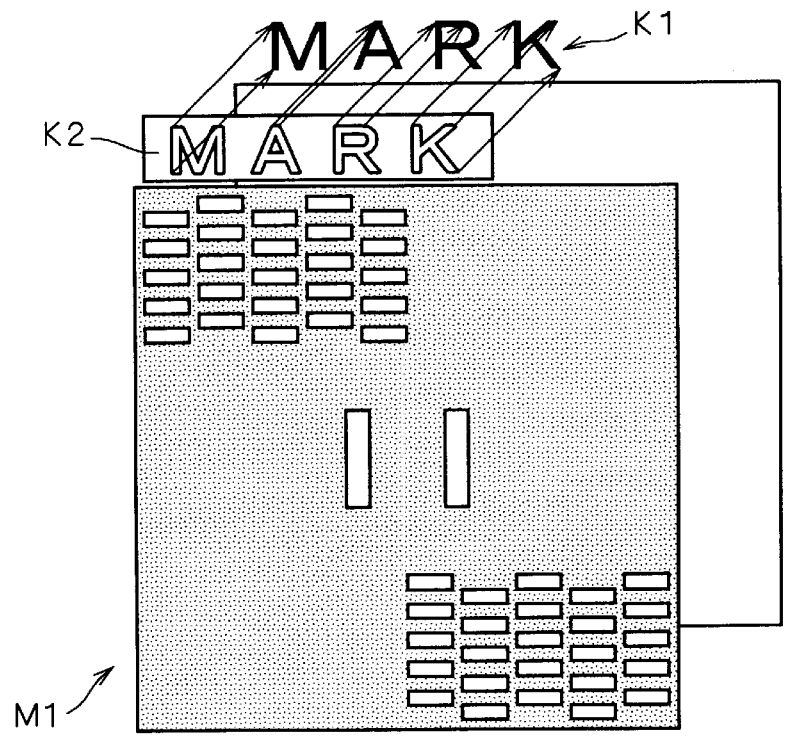
Figure 23:
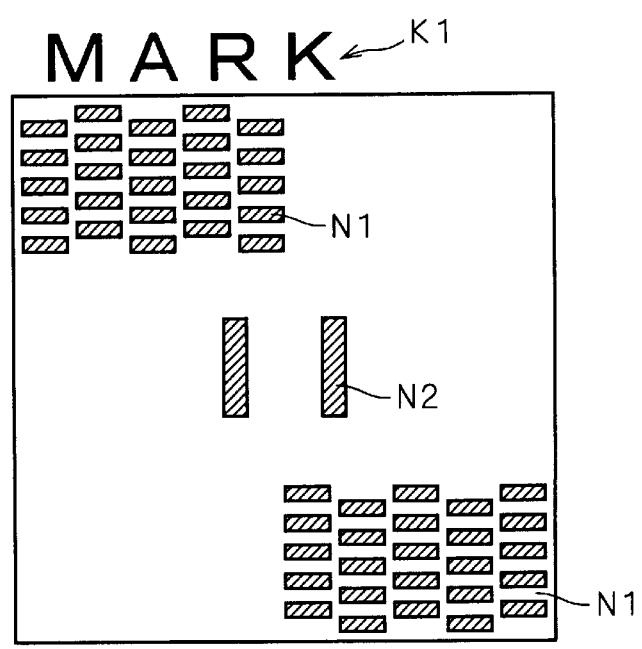

Then, the exposure mask for implantation M1 is so arranged as to superpose the alignment mark K2 with the alignment mark K1 in the step shown in FIG. 22. The mask pattern is transferred to the resist material through photolithography for forming a resist mask (not shown) and an N-type impurity is ion-implanted from above the resist mask in the step shown in FIG. 23, thereby forming the N regions N1 and N2 having the first impurity concentration in the surface of the semiconductor substrate as well regions.

Figure 24:
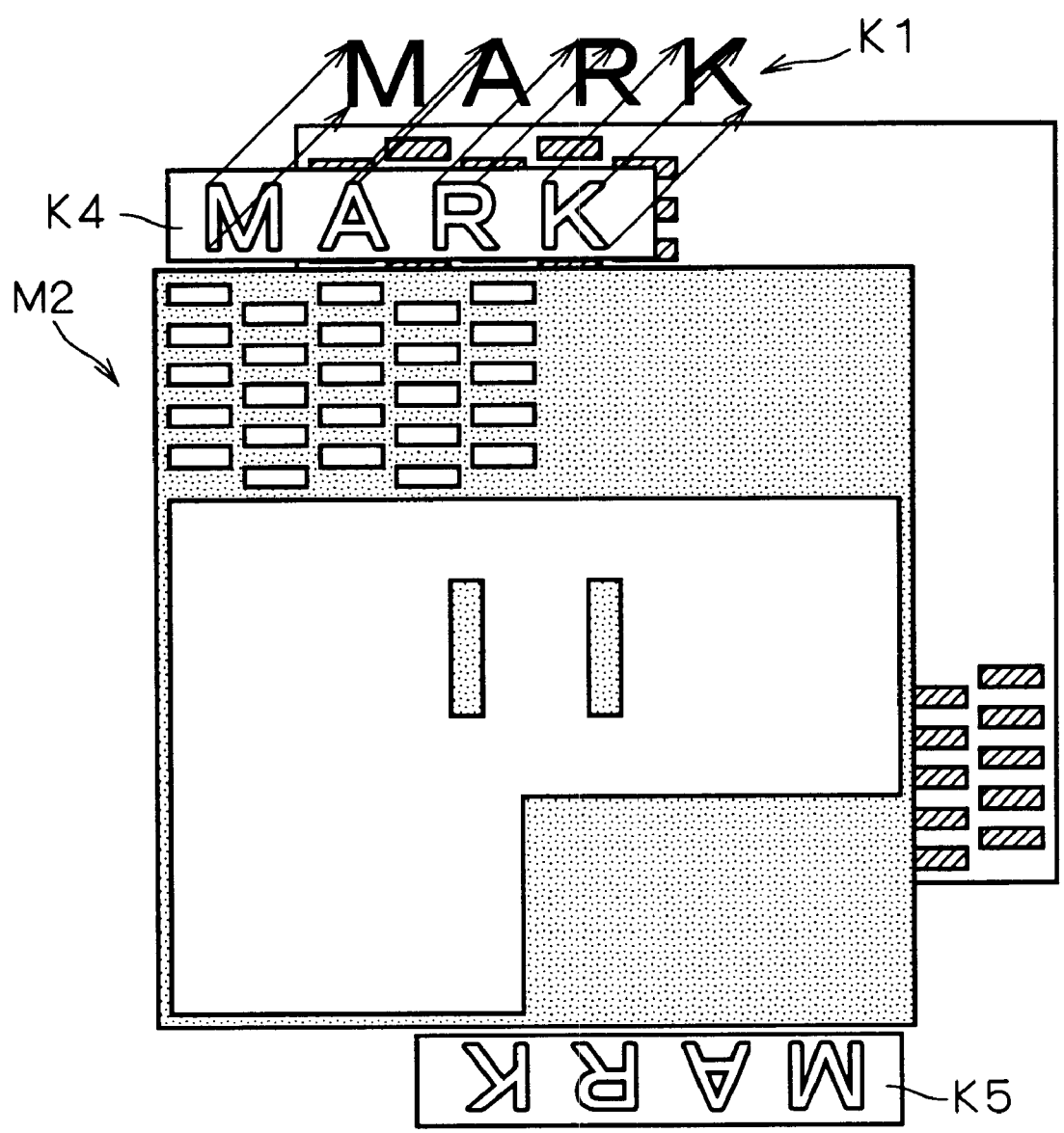
Figure 25:
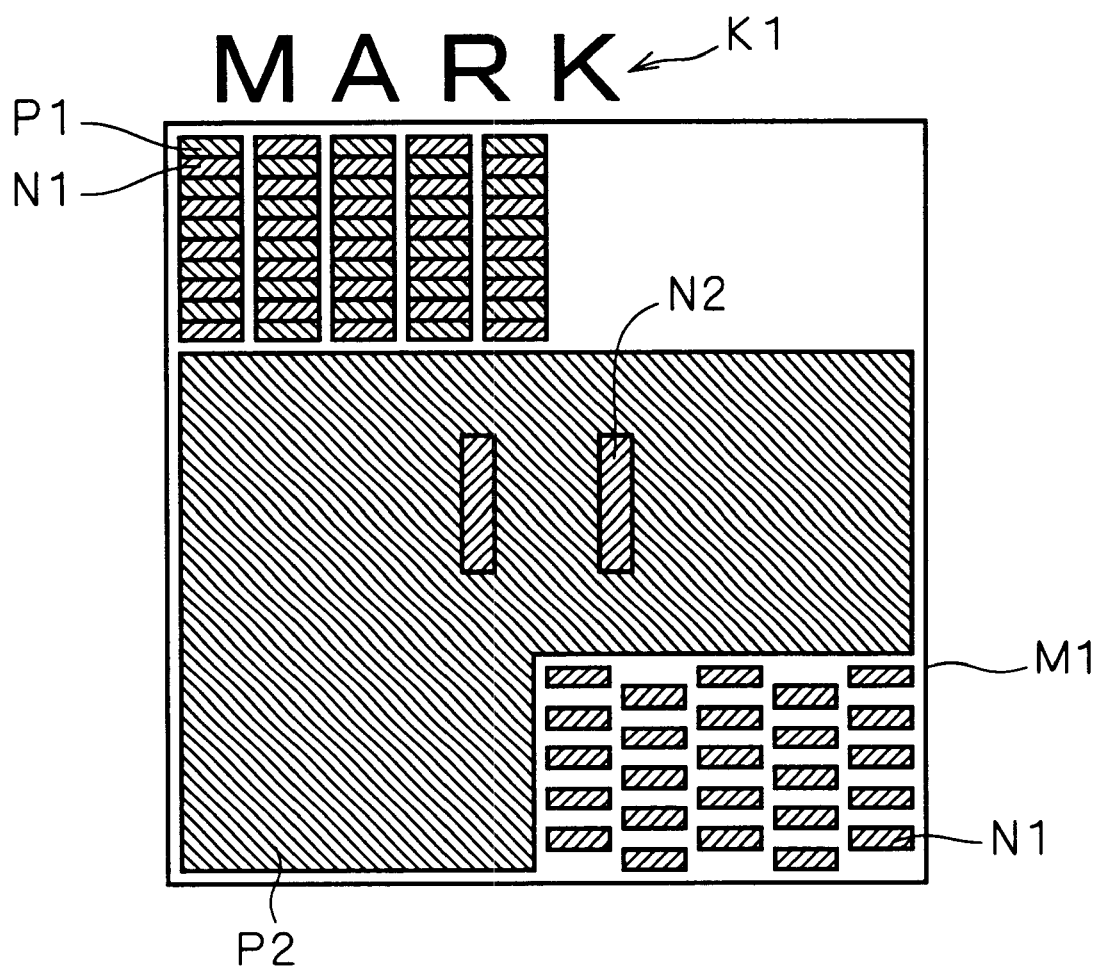

Then, the resist mask is removed, thereafter a new resist material is applied, and the exposure mask for implantation M2 is so arranged on the semiconductor substrate formed with the N regions N1 and N2 as to superpose the alignment mark K4 with the alignment mark K1, as shown in FIG. 24. The mask pattern is transferred to the resist material through photolithography for forming a resist mask (not shown) and a p-type impurity is ion-implanted from above the resist mask in the step shown in FIG. 25, thereby forming the P regions P1 and P2 having the second impurity concentration in the surface of the semiconductor substrate as well regions. At this time, P-type impurity ions are implanted also into the portion for forming the P region P4 in the second impurity concentration.

Figure 26:
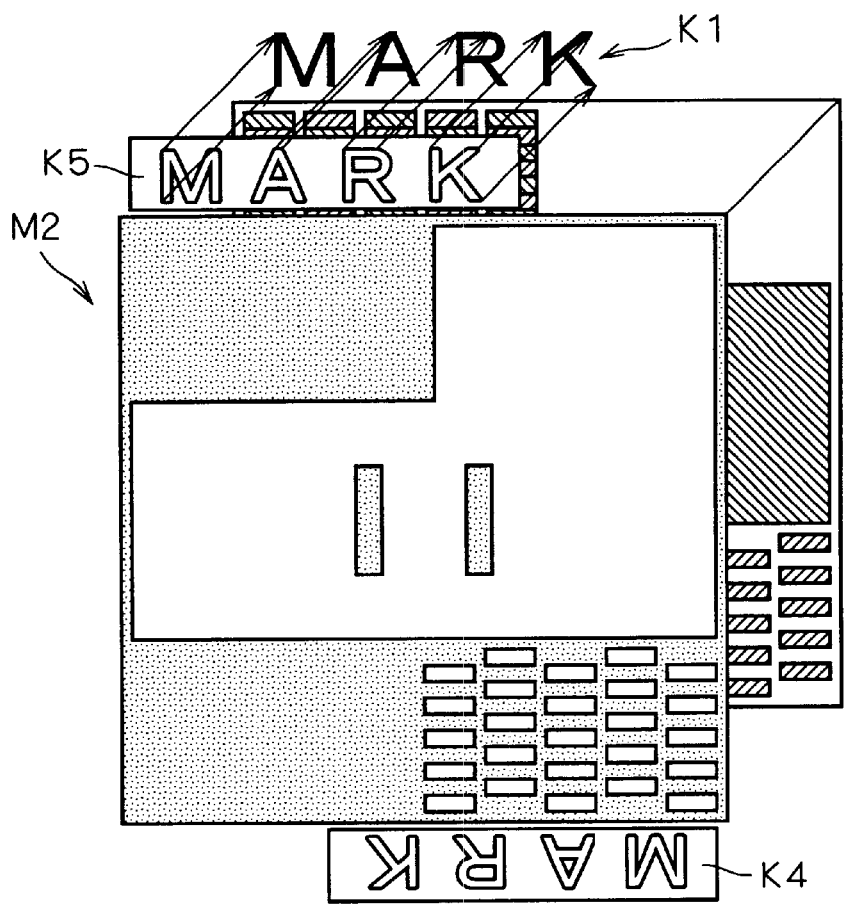

Then, the resist mask is removed, thereafter a new resist material is applied, and the exposure mask for implantation M2 is so arranged on the semiconductor substrate formed with the P regions P1 and P2 as to superpose the alignment mark K5 with the alignment mark K1 as shown in FIG. 26. The mask pattern is transferred to the resist material through photolithography for forming a resist mask (not shown) and a P-type impurity is ion-implanted from above the resist mask for forming the P regions P3 and P5 having the third impurity concentration in the surface of the semiconductor substrate as well regions while implanting P-type impurity ions also into the portion for forming the P region P4 thereby forming the P region P4 having the fourth impurity concentration and obtaining the implantation pattern Z1 shown in FIG. 4.

<A-2-2. Description of Manufacturing Method with Reference to Sectional Views>

The manufacturing method is now described with reference to sectional views successively showing steps.

Figure 27:
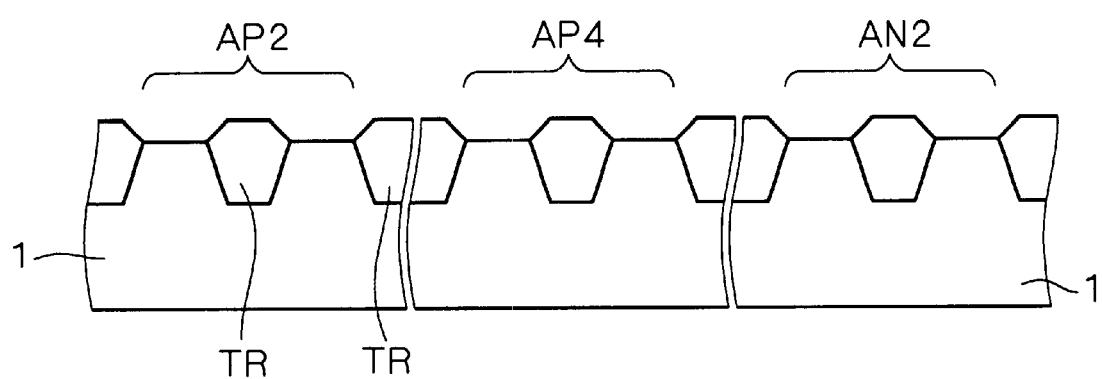
FIGS. 27 to 34 are sectional views illustrating steps of manufacturing the implantation pattern in the embodiment 1 of the present invention.

First, trench isolation structures TR are formed in the surface of the device forming region of the semiconductor substrate 1 (target layer) in a prescribed pattern for defining active regions, as shown in FIG. 27. FIG. 27 representatively shows active regions AP2, AP4 and AN2 formed with the P regions P2 and P4 and the N region N2 later successively from the left.

Figure 28:
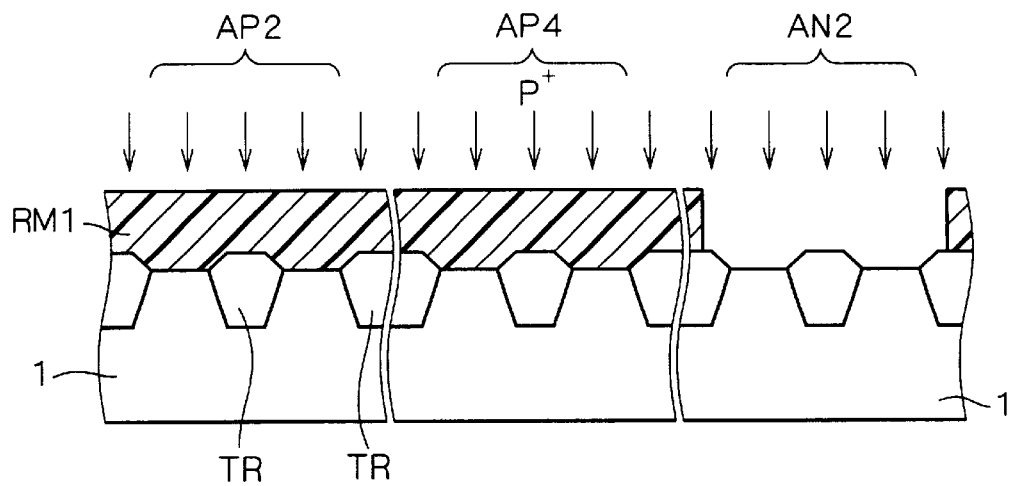
Figure 29:
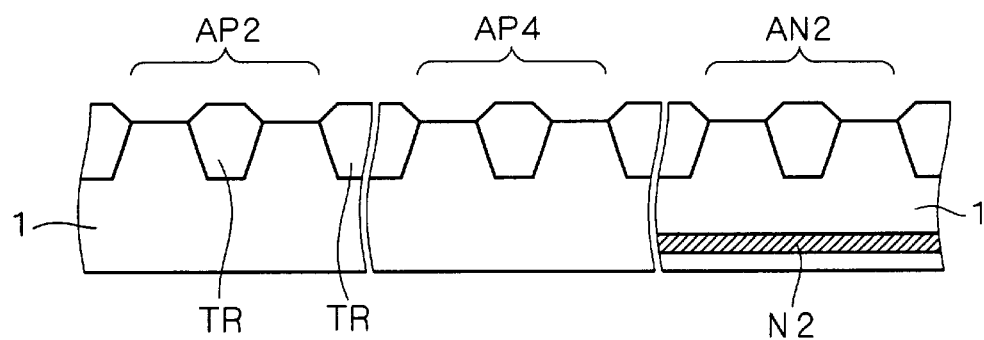

Then, a resist mask RM1 covering the active regions AP2 and AP4 is formed with the exposure mask for implantation M1 (see FIG. 22) as shown in FIG. 28, and phosphorus (P), for example, is ion-implanted as an N-type impurity from above the resist mask RM1 thereby forming the N region N2 in the active region AN2 not covered with the resist mask RM1, as shown in FIG. 29.

The current ion implantation conditions are energy of 1 MeV and a dose of $1.5 \times 10^{13}/cm^2$, for example, and the N region N2 is formed on a position (depth of about 1 μm from the surface) beyond the trench isolation structures TR.

Figure 30:
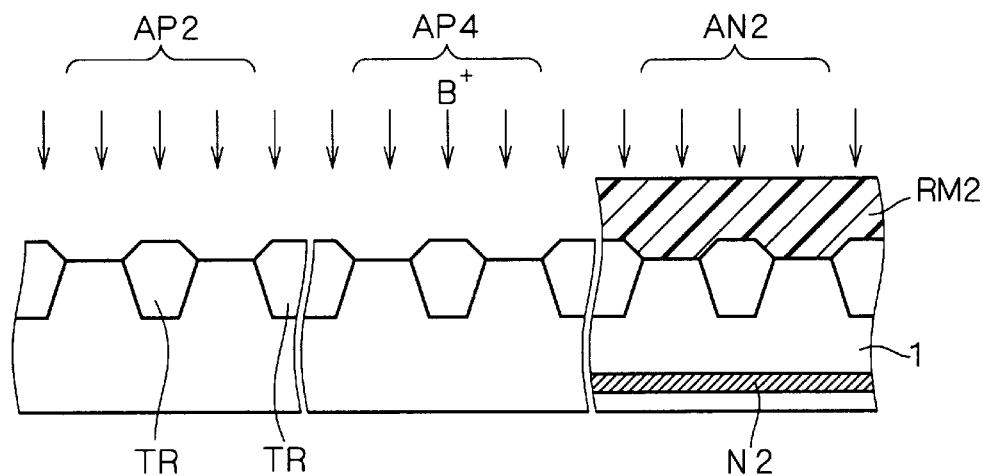
Figure 31:
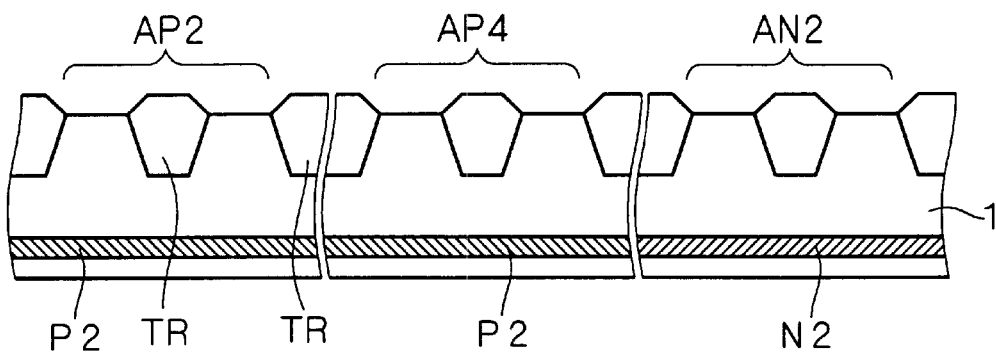

The resist mask RM1 is removed as shown in FIG. 29, thereafter the exposure mask for implantation M2 (see FIG. 24) is employed in the normal position for forming a resist mask RM2 covering the active region AN2 as shown in FIG. 30, and boron (B), for example, is ion-implanted from above the resist mask RM2 as a P-type impurity thereby forming the P region P2 in the active regions AP2 and AP4 not covered with the resist mask RM2 as shown in FIG. 31.

The current ion implantation conditions are energy of 500 keV and a dose of $0.5 \times 10^{13}/cm^2$, for example, and the P region P2 is* formed on positions beyond the trench isolation structures TR.

Figure 32:
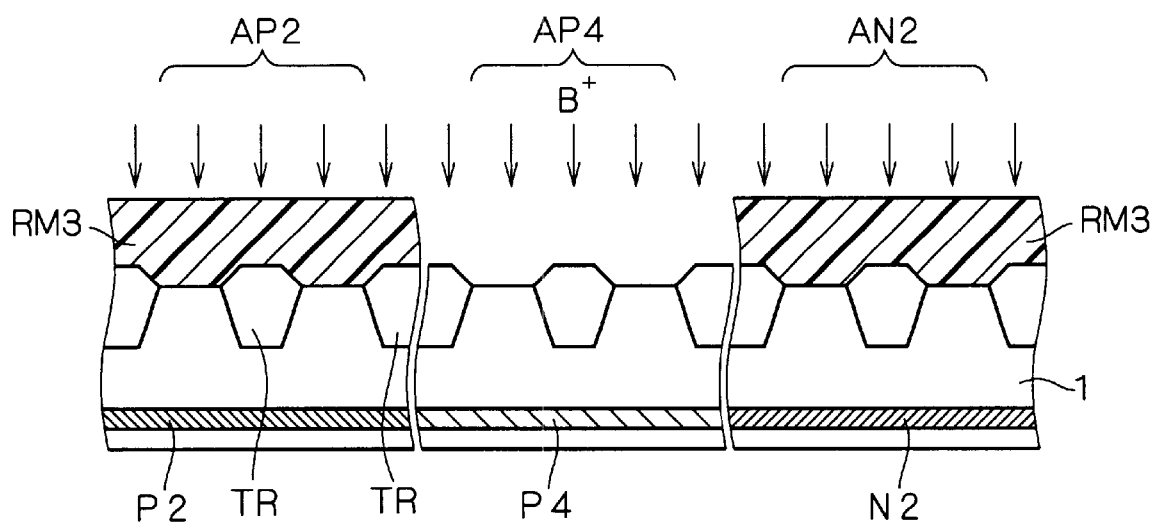

The resist mask RM2 is removed as shown in FIG. 31, thereafter the exposure mask for implantation M2 (see FIG. 24) is employed in the reverse position for forming a resist mask RM3 covering the active regions AN2 and AP2 as shown in FIG. 32, and boron, for example, is ion-implanted from above the resist mask RM3 as a P-type impurity, thereby forming the P region P4 in the active region AP4 not covered with the resist mask RM3 as shown in FIG. 32.

The current ion implantation conditions are energy of 500 keV and a dose of $1.0 \times 10^{13}/cm^2$, for example. The aforementioned ion implantation conditions are mere examples, and the present invention is not restricted to these.

Figure 33:
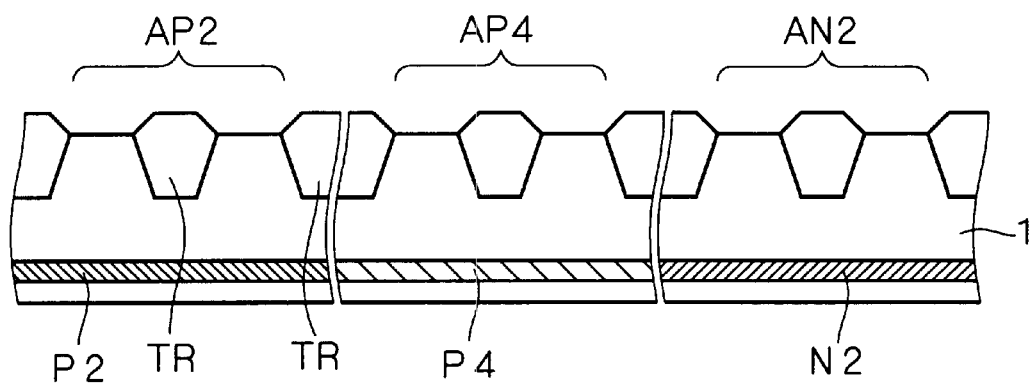
Figure 34:
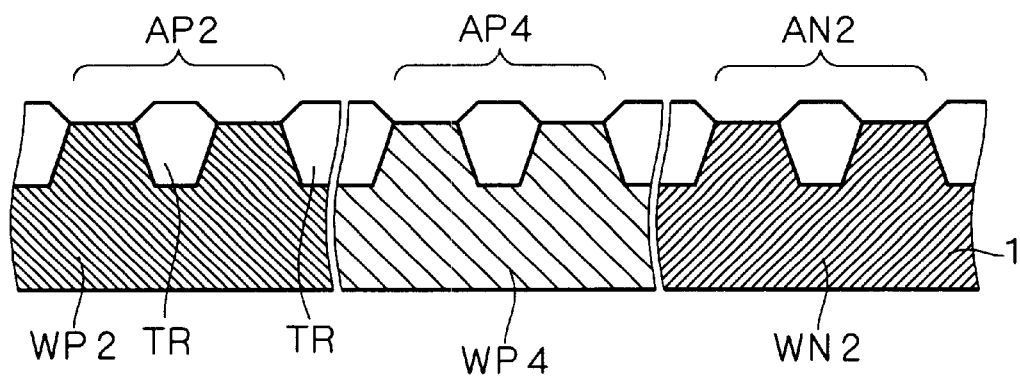

The resist mask RM3 is removed as shown in FIG. 33 and thereafter heat treatment is performed thereby diffusing the N region N2 and the P regions P4 and P2 and forming well regions WN2, WP4 and WP2 as shown in FIG. 34.

While the aforementioned exposure mask for implantations M1 to M8 have openings in regions for performing impurity implantation in consideration of transfer to negative resist, the regions for performing impurity implantation define shading parts when employing positive resist. This also applies to modifications and an embodiment 2 described below.

<A-3. Modification 1>

In the aforementioned first to fourth exemplary structures, the implantation patterns Z1 to Z4 have rotation-symmetrical pattern shapes regardless of the impurity concentrations.

For example, the implantation pattern Z3 described with reference to FIG. 10 has particularly remarkable symmetry such that the regions R1 and R11 and the regions R2 and R21 are identical in pattern shape and impurity concentration to each other. The implantation pattern Z3 is rotation-symmetrical with respect to the center on the intermediate portion between the two N regions N2 of the region R3.

However, the inventive method of manufacturing a semiconductor device is not restricted to manufacturing of a semiconductor device provided with such an implantation pattern having a symmetrical shape but is also applicable to manufacturing of a semiconductor device provided with an implantation pattern having an asymmetrical shape.

Figure 35:
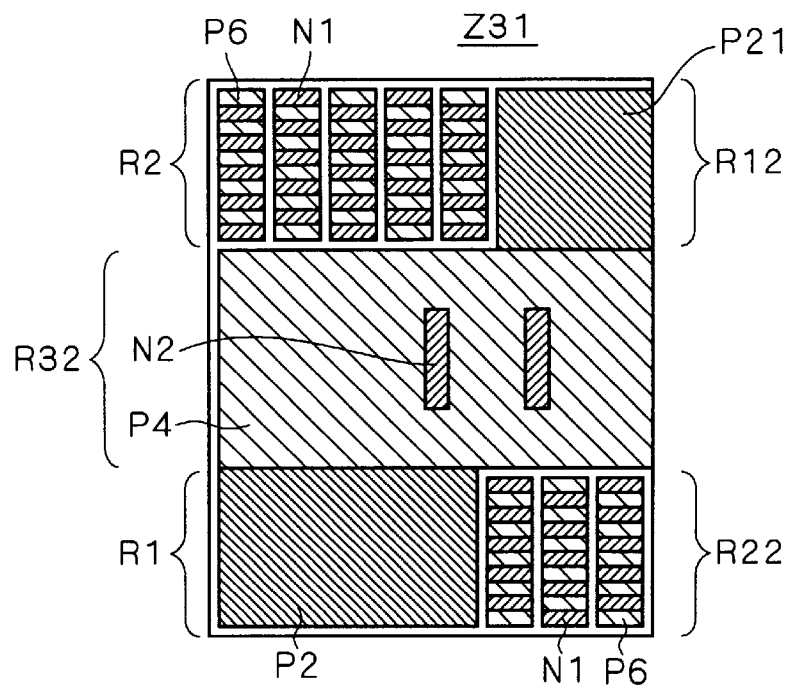
FIG. 35 is a plan view showing an implantation pattern in a modification 1 of the embodiment 1 of the present invention.

For example, FIG. 35 shows an implantation pattern Z31 generally including five regions R1, R2, R32, R12 and R22. Parts identical in structure to those of the implantation pattern Z3 shown in FIG. 10 are denoted by the same reference numerals, to omit redundant description.

A P region P21 is formed in the region R12 as a well region, while the region R22 has such an implantation pattern that a plurality of P regions P6 and a plurality of N regions N1 are alternately arranged as well regions and such arrays are arranged in parallel.

The region R32 has an implantation pattern provided with two N regions N2 and a P region P4 arranged around the N regions N2 as well regions.

When horizontally divided along the center defined by the intermediate portion between the two N regions N2 of the region R32, the shape of the implantation pattern Z31 is not rotation-symmetrical.

Figure 36:
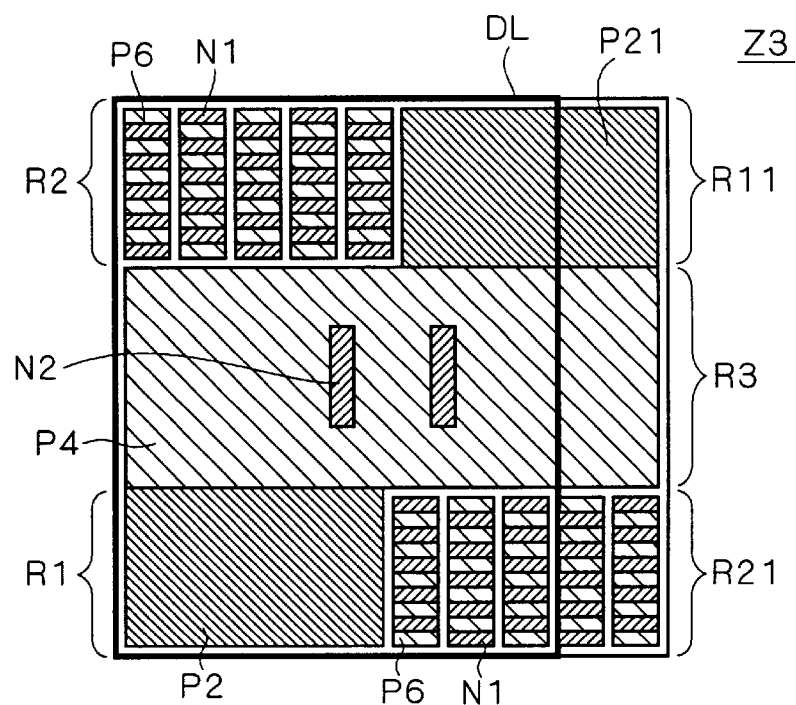
FIGS. 36 to 47 are plan views illustrating steps of manufacturing the implantation pattern in the modification 1 of the embodiment 1 of the present invention.
Figure 37:
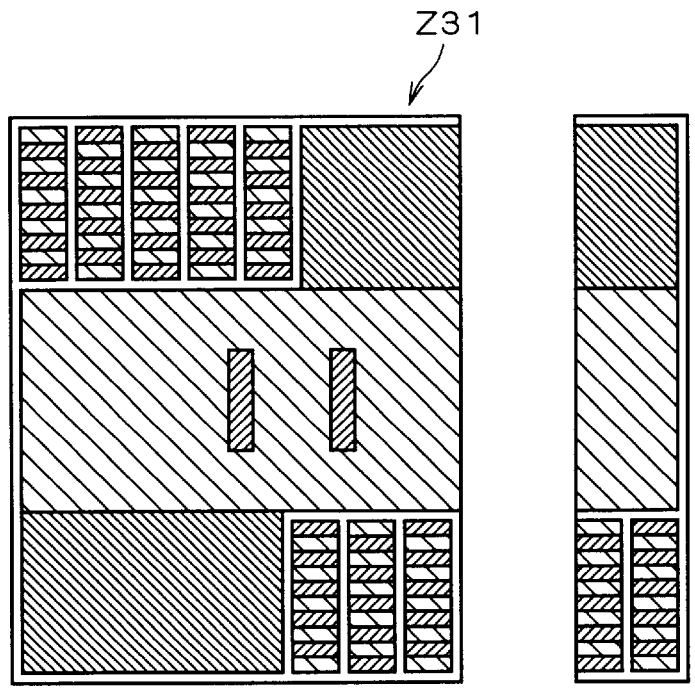

The implantation pattern Z31 can be readily obtained. This implantation pattern Z31 can be obtained by forming the implantation pattern Z3 shown in FIG. 10 with the exposure mask for implantations M5 and M6 as described with reference to the third exemplary structure, thereafter setting a dicing line DL on the implantation pattern Z3 as shown in FIG. 36 and cutting the pattern Z3 along the dicing line DL thereby removing an unnecessary portion as shown in FIG. 37.

Thus, the present invention is also applicable to manufacturing of a semiconductor device provided with an implantation pattern having an asymmetrical shape by forming an implantation pattern having a symmetrical shape such as the implantation pattern Z3 and thereafter dicing this pattern.

In this example, the dicing step, which is carried out in a stage where not only well implantation but all manufacturing steps are completed, has been described with reference to the figures showing the implantation pattern in the process of manufacturing for the purpose of clarification.

A plurality of semiconductor devices are formed on a single semiconductor substrate with arrangement of a plurality of identical implantation patterns Z3, and hence the dicing line DL is set not only along the boundary between the same and the unnecessary portion but also along the edge of the implantation pattern Z3.

The implantation pattern having an asymmetrical shape is not restricted to the implantation pattern Z31 shown in FIG. 35. When horizontally dividing the implantation pattern Z3 along a center line defined by the intermediate portion between the two N regions N2 as shown in FIG. 38, for example, each implantation pattern Z32 obtained by this division has an asymmetrical shape.

Figure 39:
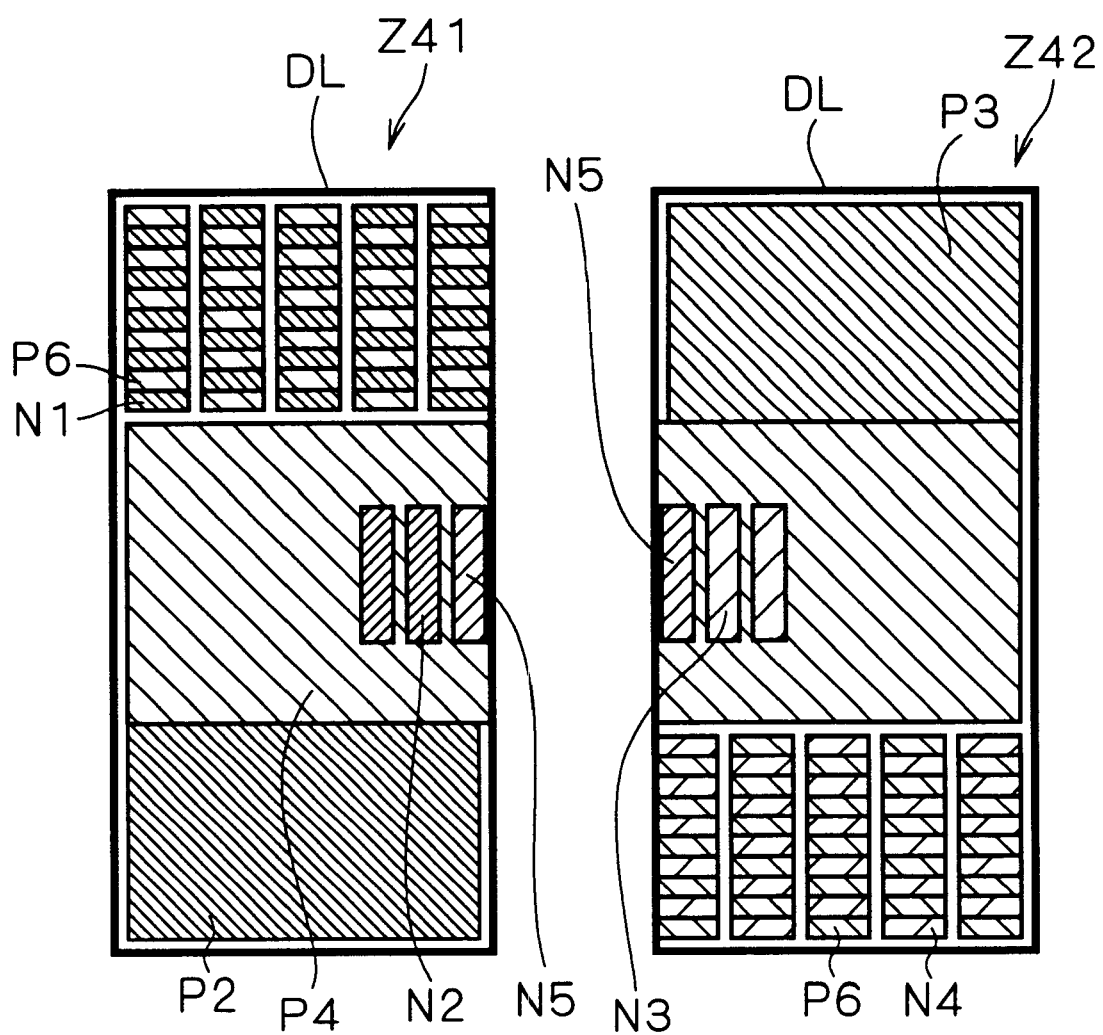

When horizontally dividing the implantation pattern Z4 described with reference to FIG. 13 along a center line defined by the intermediate portion between the two N regions N5 as shown in FIG. 39, for example, individual implantation patterns Z41 and Z42 obtained by this division have asymmetrical shapes. In this case, it follows that the implantation patterns Z41 and Z42 form absolutely different semiconductor devices since the concentrations of impurity regions forming the same are different from each other.

Figure 38:
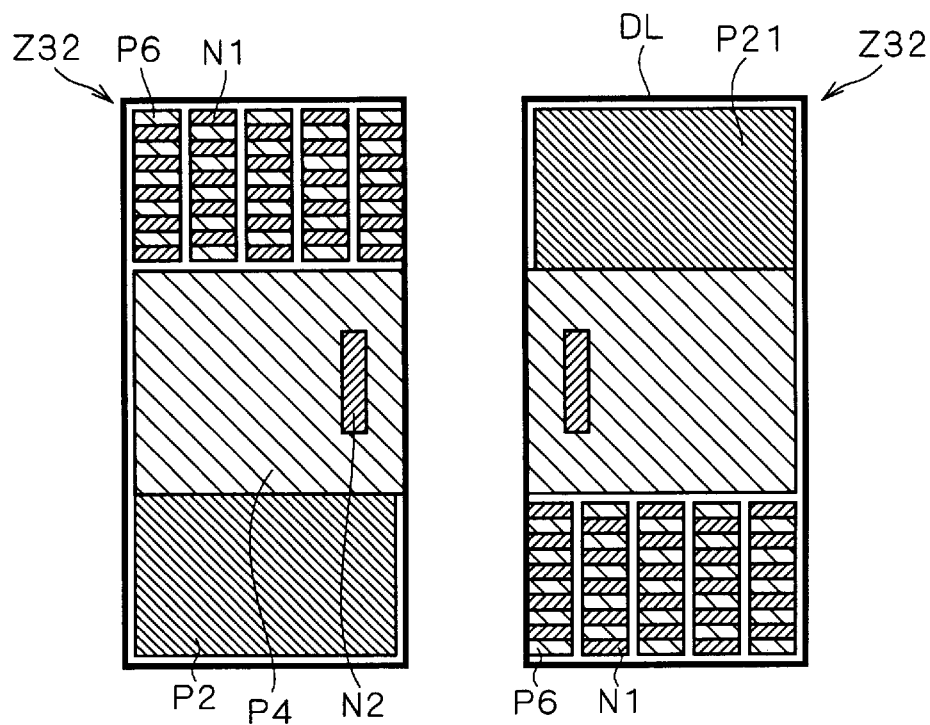

While the implantation patterns Z32 shown in FIG. 38 also indicate that two semiconductor devices can be manufactured from a single implantation pattern, it is desirable that no semiconductor elements are formed in the vicinity of the dicing line in consideration of the dicing step.

An example manufacturing two semiconductor devices from a single implantation pattern in consideration of dicing is described with reference to FIGS. 40 to 47.

Figure 40:
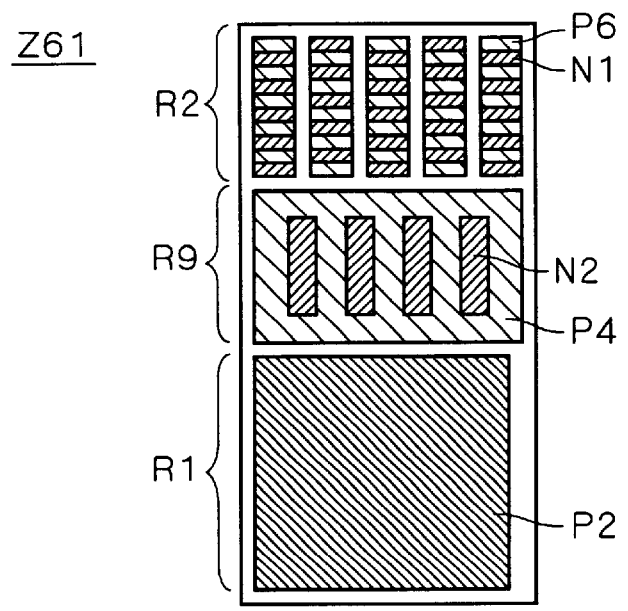

FIG. 40 is a plan view showing an implantation pattern Z61 having an asymmetrical shape. Referring to FIG. 40, the implantation pattern Z61 generally includes three regions R1, R2 and R9.

A P region P2 is formed in the region R1 as a well region, while the region R2 as such an implantation pattern that a plurality of P regions P6 and a plurality of N regions N1 are alternately arranged as well regions and such arrays are arranged in parallel.

The region R9 has an implantation pattern provided with four N regions N2 independently arranged in parallel and a P region P4 arranged around the N regions N2 as well regions.

The N regions N1 and N2 have a first impurity concentration, the P region P2 has a second impurity concentration, and the P regions P4 and P6 have a third impurity concentration twice the second impurity concentration.

Figure 41:
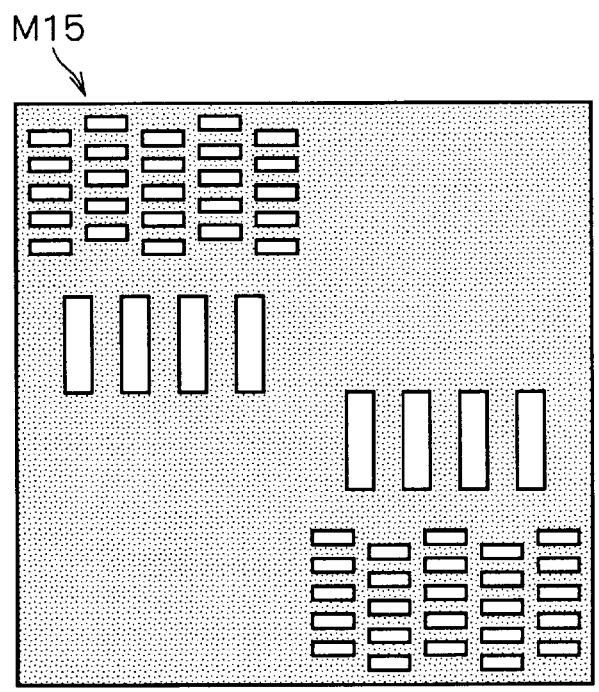

In order to simultaneously form two such implantation patterns Z61, an N-type impurity is first ion-implanted through an exposure mask for implantation M15 shown in FIG. 41.

The exposure mask for implantation M15 for forming the N regions N1 and N2 has pairs of openings rotation-symmetrically provided for rotation-symmetrically forming pairs of N regions N1 and N2 respectively.

Figure 42:
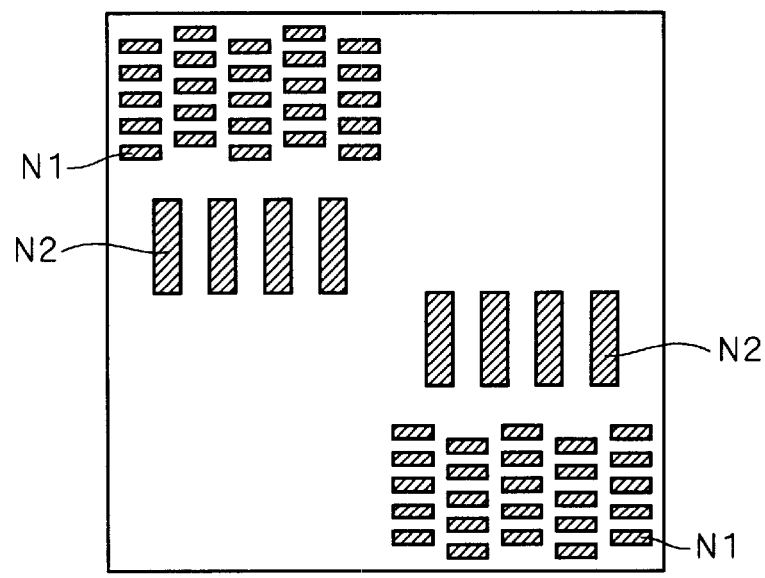

FIG. 42 shows a state resulting from ion implantation of the N-type impurity through the exposure mask for implantation M15 having the aforementioned structure.

Figure 43:
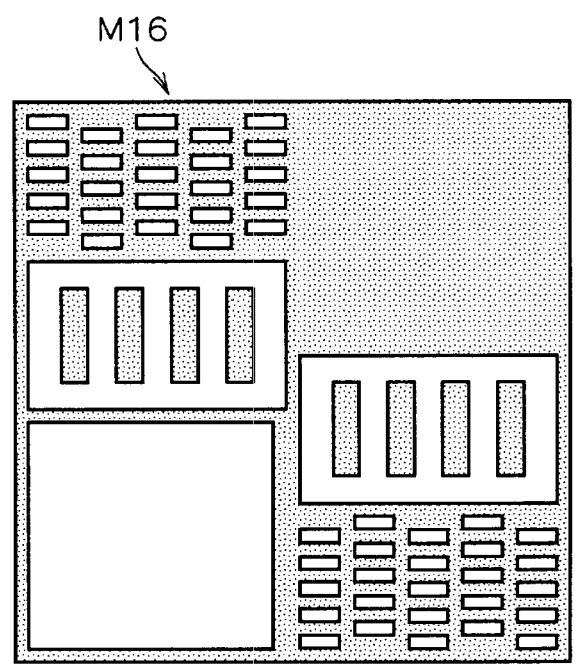

Then, a P-type impurity is ion-implanted through an exposure mask for implantation M16 shown in FIG. 43. The exposure mask for implantation M16 for forming the P regions P2, P4 and P6 has pairs of openings rotation-symmetrically provided for rotation-symmetrically forming pairs of P regions P4 and P6 respectively. The mask M16 also has only one opening for forming the P region P2 at the lower left in FIG. 43.

Figure 44:
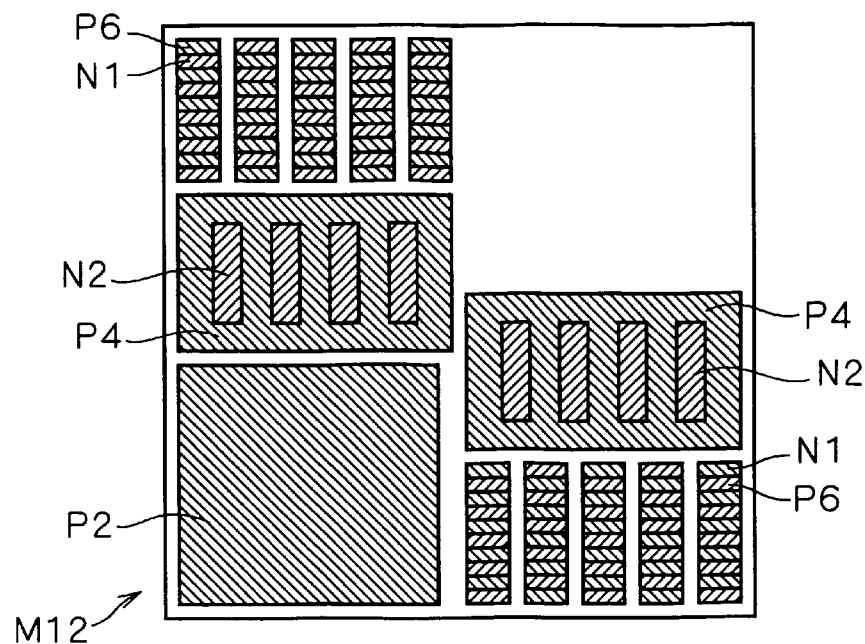

FIG. 44 shows a state resulting from ion implantation of the P-type impurity through the exposure mask for implantation M16. Referring to FIG. 44, the P region P2 having the second impurity concentration is formed at the lower left while P-type impurity ions are implanted also into portions for forming the P regions P4 and P6 in the second impurity concentration.

Figure 45:
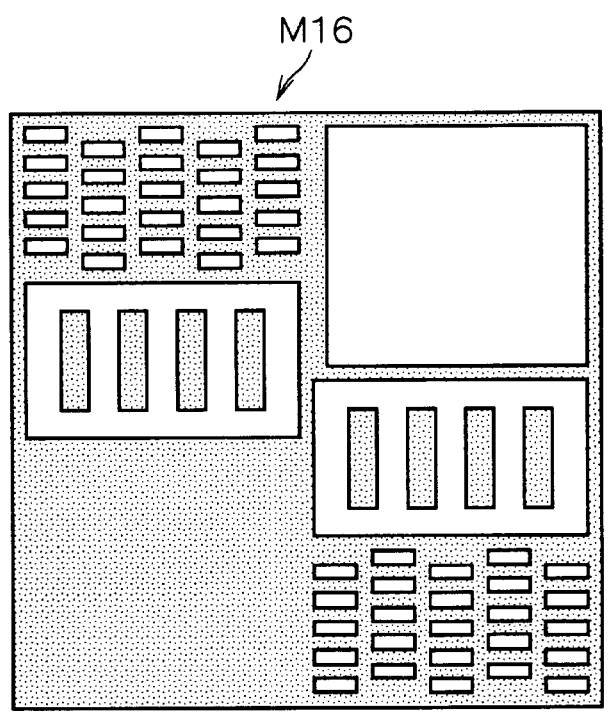

Then, the exposure mask for implantation M16 is rotated by 180° as shown in FIG. 45 for ion-implanting a P-type impurity. The current dose is similar to the preceding one.

Figure 46:
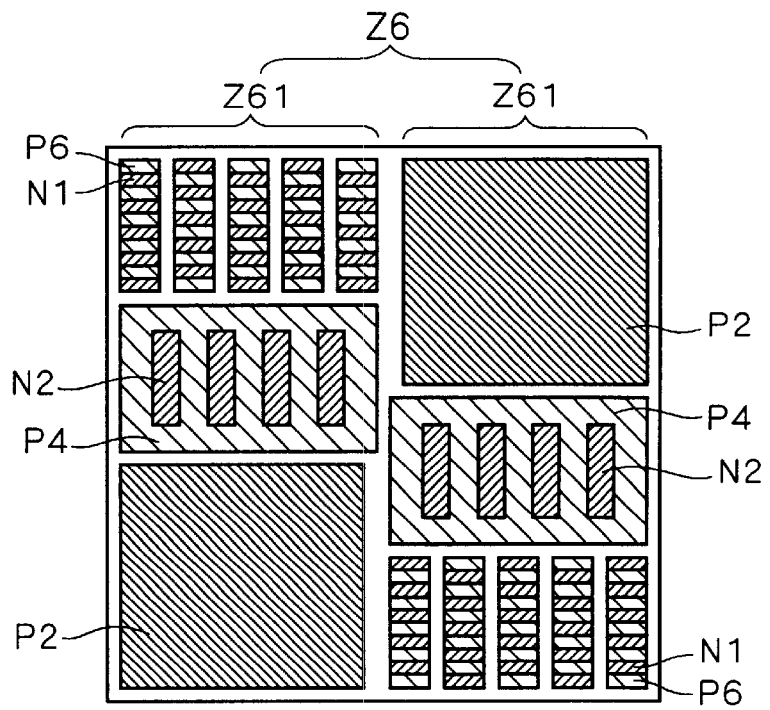

FIG. 46 shows a state resulting from ion implantation of the P-type impurity through the exposure mask for implantation M16 rotated by 180°. Referring to FIG. 46, the P region P2 having the second impurity concentration is formed at the upper right while P-type impurity ions are implanted also into portions for forming the P regions P4 and P6 in the second impurity concentration for forming the P regions P4 and P6 having the third impurity concentration, thereby completing an implantation pattern Z6 having two implantation patterns Z61.

A dicing line may be set on a region, neither subjected to impurity implantation nor formed with semiconductor elements, provided between the two implantation patterns Z61. Also when a well pattern is formed, the dicing line can be set in this region formed with no semiconductor elements.

Figure 47:
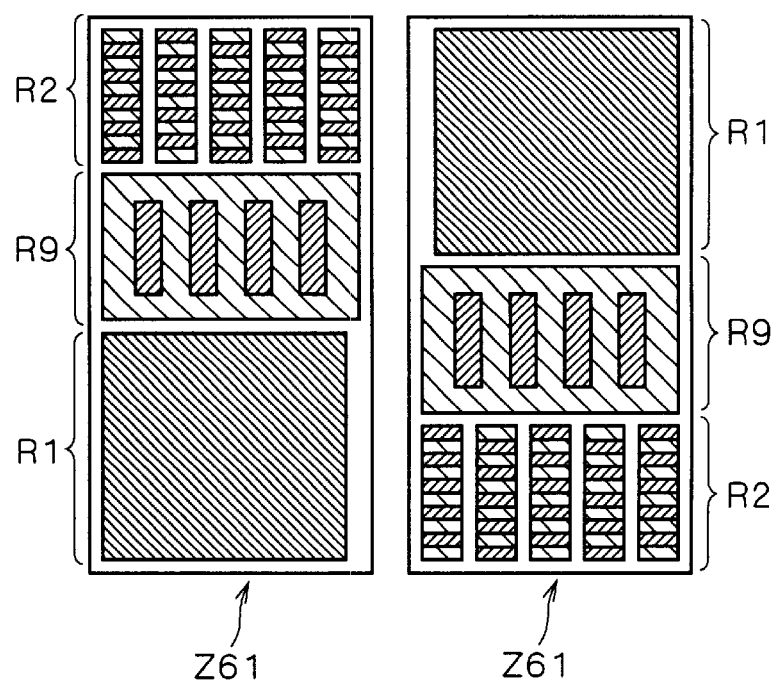

FIG. 47 shows a state obtained by dividing the implantation pattern Z6 by dicing for forming the two implantation patterns Z61.

The expression performing ion implantation with the exposure mask for implantation M15 (M16) indicates an operation of forming a resist mask with the exposure mask for implantation M15 (M16) and implanting an impurity from above the resist mask.

In this example, the dicing step, which is carried out in a stage where not only well implantation but all manufacturing steps are completed, has been described with reference to the figures showing the implantation pattern in the process of manufacturing for the purpose of clarification.

<A-4. Modification 2>

While the implantation patterns Z1 to Z4 have been described as implantation patterns for well regions in relation to the aforementioned first to fourth exemplary structures, the present invention is not restricted to well implantation but is also applicable to channel dope implantation, channel cut implantation, gate implantation, source/drain implantation and pocket implantation in steps of forming MOS transistors. Exemplary applications to these implantation steps are now described.

<A-4-1. Exemplary Application to Channel Dope Implantation>

An exemplary application to channel dope implantation is now described with reference to FIGS. 48 to 52 showing sectional views successively illustrating steps. It is assumed that the implantation pattern Z1 described with reference to FIG. 4, for example, is formed with the exposure mask for implantations M1 (see FIG. 5) and M2 (see FIG. 6).

Figure 48:
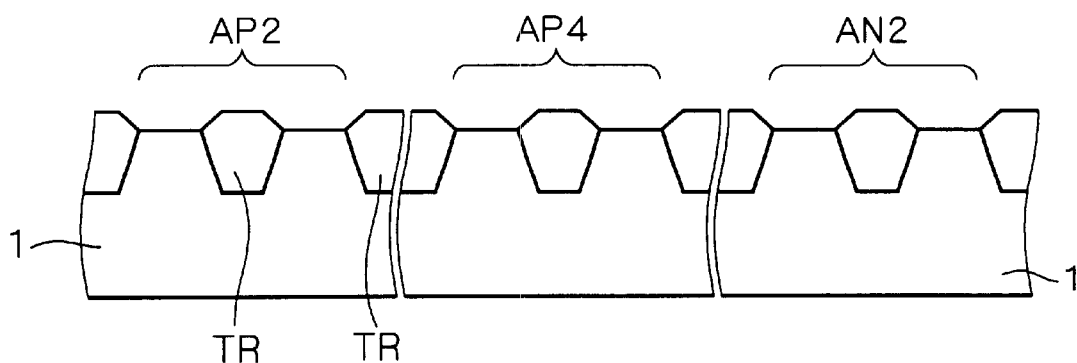
FIGS. 48 to 52 are sectional views illustrating channel dope implantation steps in a modification 2 of the embodiment 1 of the present invention.

As shown in FIG. 48, trench isolation structures TR of a prescribed pattern are formed in the surface of the device forming region of the semiconductor substrate 1 (target layer).

FIG. 48 representatively shows sections of active regions AP2, AP4 and AN2 to be formed with the P regions P2 and P4 and the N region N2 later from the left.

While well regions WN2, WP4 and WP2 are formed in the active regions AP2, AP4 and AN2 respectively through the well implantation steps described with reference to FIGS. 27 to 34 in the state shown in FIG. 48, illustration of these well regions is omitted for convenience.

Figure 49:
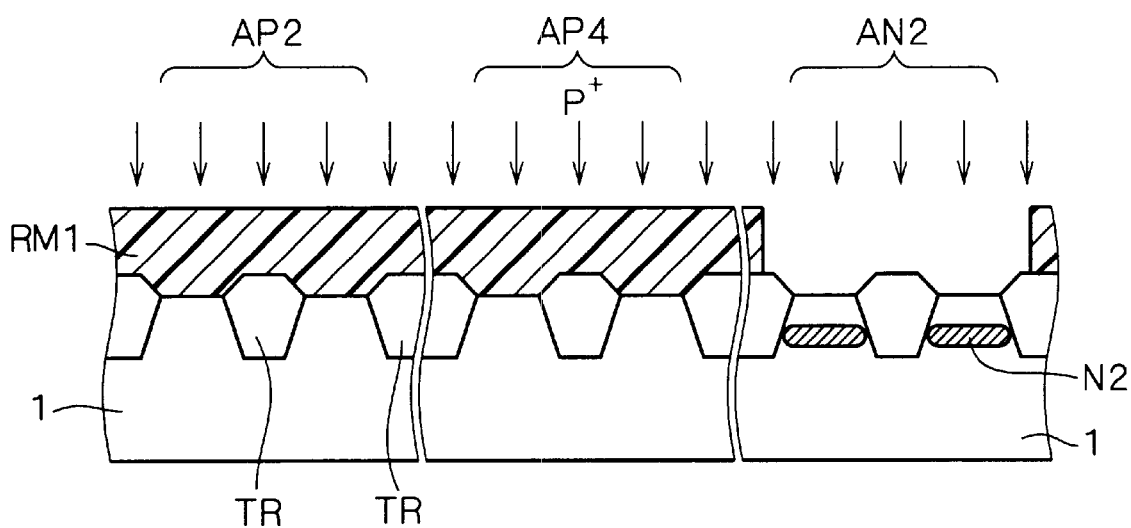

Then, a resist mask RM1 covering the active regions AP2 and AP4 is formed with the exposure mask for implantation M1 (see FIG. 5) and phosphorus, for example, is ion-implanted from above the resist mask RM1 as an N-type impurity thereby forming the N regions N2 in the active region AN2 not covered with the resist mask RM1, as shown in FIG. 49.

The current ion implantation conditions are energy of 80 keV and a dose of $5\times10^{12}/cm^2$ to $5\times10^{14}/cm^2$, for example, and the N regions N2 are formed in regions (depth of about 0.1 μm from the surface of the substrate) enclosed with the trench isolation structures TR.

Figure 50:
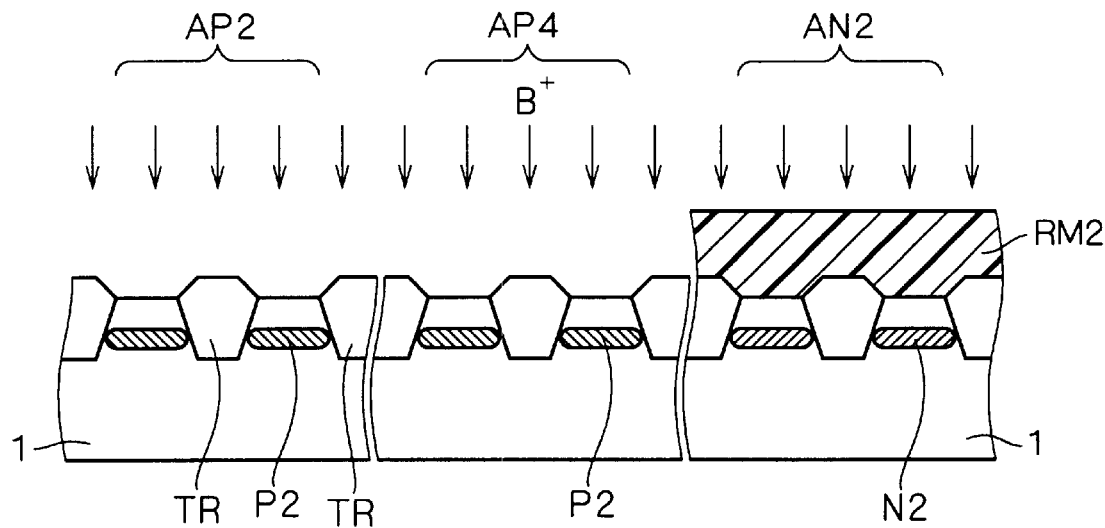

The resist mask RM1 is removed, thereafter the exposure mask for implantation M2 (see FIG. 6) is employed in the normal position for forming a resist mask RM2 covering the active region AN2 and boron, for example, is ion-implanted from above the resist mask RM2 as a P-type impurity thereby forming the P regions P2 in the active regions AP2 and AP4 not covered with the resist mask RM2, as shown in FIG. 50.

The current ion implantation conditions are energy of 30 keV and a dose of $1\times10^{12}/cm^2$ to $1\times10^{14}/cm^2$, for example, and the P regions P2 are formed in regions enclosed with the trench isolation structures TR. The aforementioned ion implantation conditions are mere examples and the present invention is not restricted to these.

Figure 51:
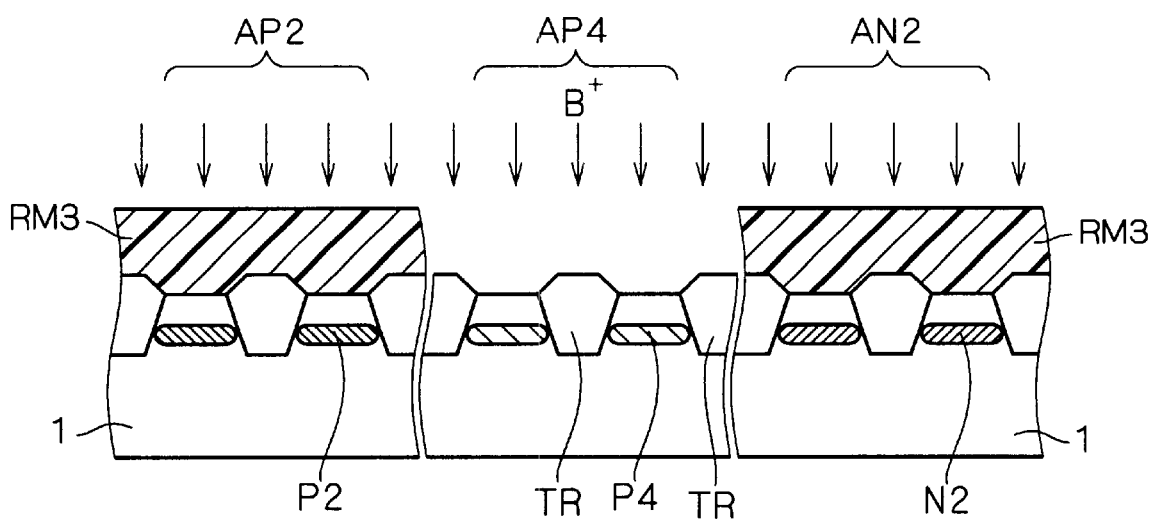

The resist mask RM2 is removed, thereafter the exposure mask for implantation M2 (see FIG. 6) is employed in the reverse position for forming a resist mask RM3 covering the active regions AN2 and AP2 and boron, for example, is ion-implanted from above the resist mask RM3 as a P-type impurity, thereby increasing the impurity concentration of the P region P2 in the active region AP4 not covered with the resist mask RM3 and forming the P region P4, as shown in FIG. 51.

The current ion implantation conditions are energy of 30 keV and a dose of $5\times10^{12}/cm^2$ to $5\times10^{14}/cm^2$, for example.

Figure 52:
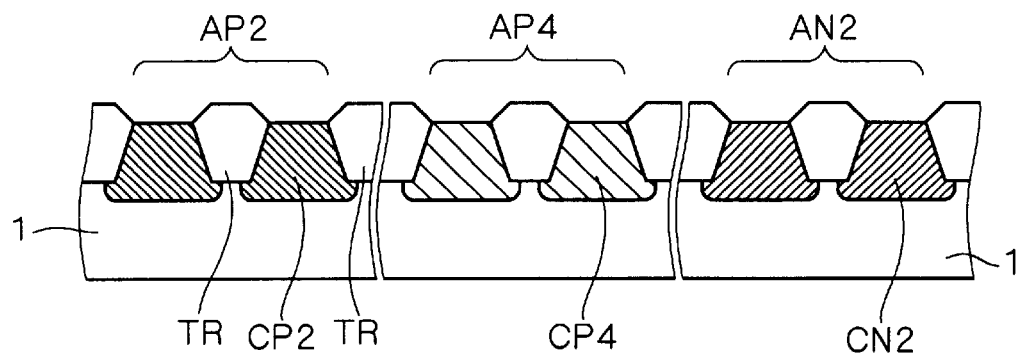

The resist mask RM3 is removed and thereafter heat treatment is performed for diffusing the N regions N2 and the P regions P4 and P2 and forming channel dope regions CN2, CP4 and CP2, as shown in FIG. 52.

The implantation depth for channel dope implantation may be varied with objects. Implantation is performed to a depth substantially identical to that of source/drain layers in order to suppress punch-through between the oppositely arranged source/drain layers, while implantation is performed in the vicinity of a channel surface (in the vicinity of the substrate surface) in order to adjust the thresholds of transistors.

In this example, the impurities are diffused by heat treatment as shown in FIG. 52 for forming impurity layers having prescribed concentrations in both of the position in the vicinity of the channel surface and the position of the depth substantially identical to that of the source/drain layers. Desired impurity concentrations can be attained in desired depths by adjusting the implantation depths and heat treatment conditions.

<A-4-2. Exemplary Application to Channel Cut Implantation>

An exemplary application to channel cut implantation is described with reference to FIGS. 53 to 57 showing sectional views successively illustrating steps.

It is assumed that the implantation pattern Z1 described with reference to FIG. 4, for example, is formed with the exposure mask for implantations M1 (see FIG. 5) and M2 (see FIG. 6).

Figure 53:
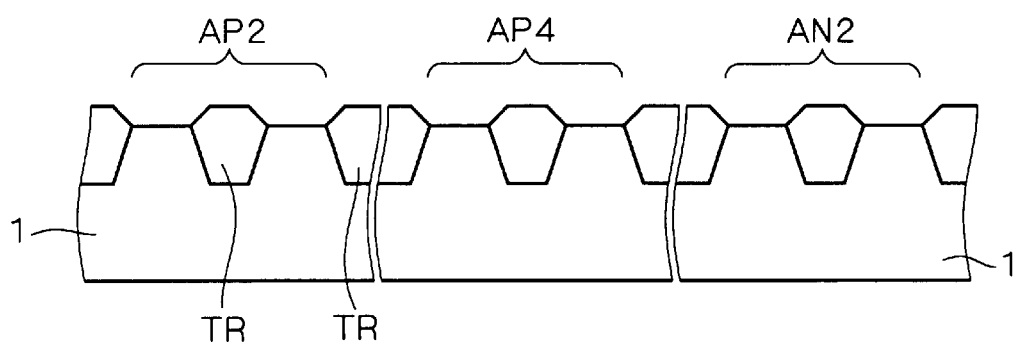
FIGS. 53 to 57 are sectional views illustrating channel cut implantation steps in the modification 2 of the embodiment 1 of the present invention.

It is also assumed that trench isolation structures TR of a prescribed pattern are formed in the surface of the device forming region of the semiconductor substrate 1 (target layer), as shown in FIG. 53.

FIG. 53 representatively shows sections of active regions AP2, AP4 and AN2 to be formed with the P regions P2 and P4 and the N region N2 later successively from the left.

While well regions WN2, WP4 and WP2 are formed in the active regions AP2, AP4 and AN2 respectively through the well implantation steps described with reference to FIGS. 27 to 34 and channel dope regions CN2, CP4 and CP2 are formed in the active regions AP2, AP4 and AN2 respectively through the channel dope implantation steps described with reference to FIGS. 48 to 52 in the state shown in FIG. 53, illustration of these regions is omitted for convenience.

Figure 54:
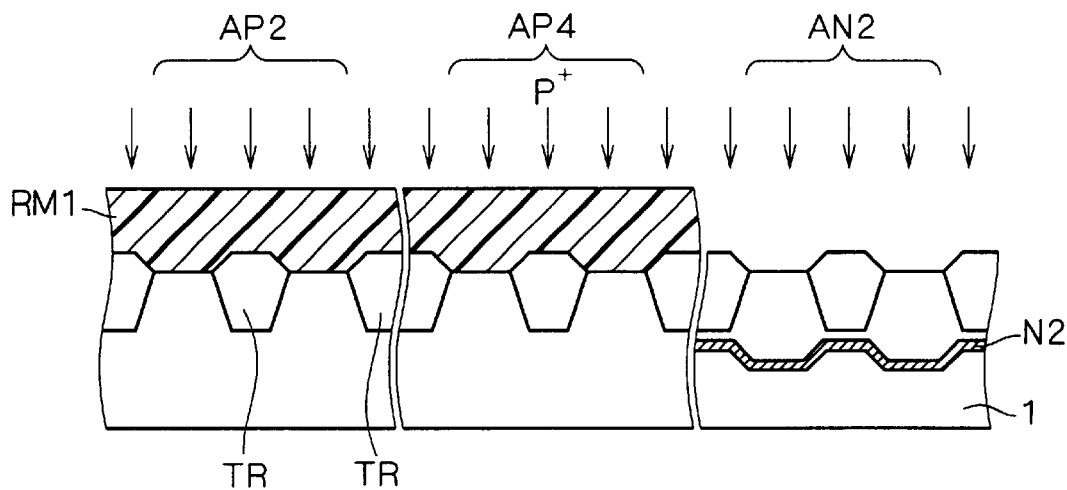

Then, a resist mask RM1 covering the active regions AP2 and AP4 is formed with the exposure mask for implantation M1 (see FIG. 5) and phosphorus, for example, is ion-implanted from above the resist mask RM1 as an N-type impurity thereby forming the N region N2 in the active region AN2 not covered with the resist mask RM1, as shown in FIG. 54.

The current ion implantation conditions are energy of 300 keV and a dose of $3 \times 10^{12}/cm^2$ to $3 \times 10^{14}/cm^2$, for example, and the N region N2 is continuously formed under the peripheral trench isolation structures TR defining the active region AN2 (depth of about 0.35 $\mu$m from the surface of the substrate) and in deep portions of the active region AN2 (portions lower than those under the trench isolation structures TR).

Figure 55:
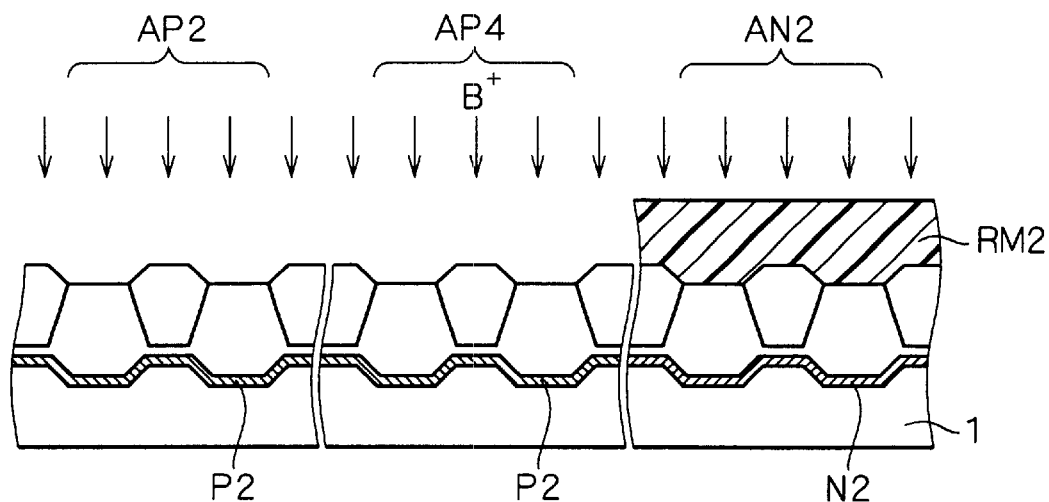

The exposure mask for implantation M1 is removed, thereafter the exposure mask for implantation M2 (see FIG. 6) is employed in the normal position for forming a resist mask RM2 covering the active region AN2 and boron, for example, is ion-implanted from above the resist mask RM2 as a P-type impurity thereby forming the P regions P2 in the active regions AP2 and AP4 not covered with the resist mask RM2, as shown in FIG. 55.

The current ion implantation conditions are energy of 120 keV and a dose of $1 \times 10^{12}/cm^2$ to $1 \times 10^{14}/cm^2$, for example, and the P regions P2 are continuously formed under the peripheral trench isolation structures TR defining the active region AP2 and in a deep portion of the active region AP2 as well as under the peripheral trench isolation structures TR defining the active region AP4 and in a deep portion of the active region AP4.

Figure 56:
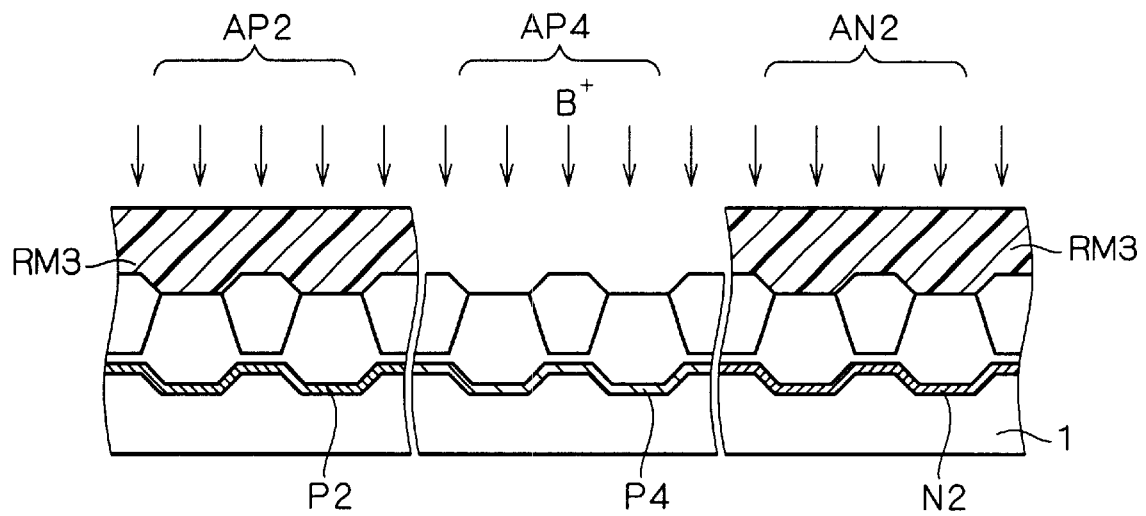

The resist mask RM2 is removed, thereafter the exposure mask for implantation M2 (see FIG. 6) is employed in the reverse position for forming a resist mask RM3 covering the active regions AN2 and AP2 and boron, for example, is ion-implanted from above the resist mask RM3 as a P-type impurity thereby increasing the impurity concentration of the P region P2 in the active region AP4 not covered with the resist mask RM3 and forming the P region P4, as shown in FIG. 56.

The current ion implantation conditions are energy of 120 keV and a dose of $2 \times 10^{12}/cm^2$ to $2 \times 10^{14}/cm^2$, for example. The aforementioned ion implantation conditions are mere examples and the present invention is not restricted to these.

Figure 57:
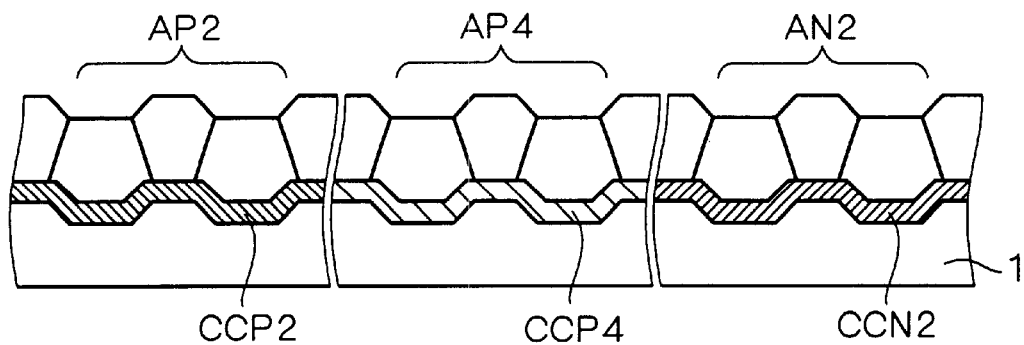

The resist mask RM3 is removed and thereafter heat treatment is performed for diffusing the N region N2 and the P regions P4 and P2, spreading the widths and forming channel cut regions CCN2, CCP4 and CCP2, as shown in FIG. 57.

<A-4-3. Exemplary Application to Gate Implantation>

While the well implantation, the channel dope implantation and the channel cut implantation described above are steps preceding formation of gate electrodes of MOS transistors, an exemplary application to manufacturing steps subsequent to formation of the gate electrodes is now described.

The following description is made with reference to an implantation pattern Z11 shown in FIG. 58 for impurities having conductivity types reverse to those in the implantation pattern Z1 described with reference to FIG. 4.

Figure 58:
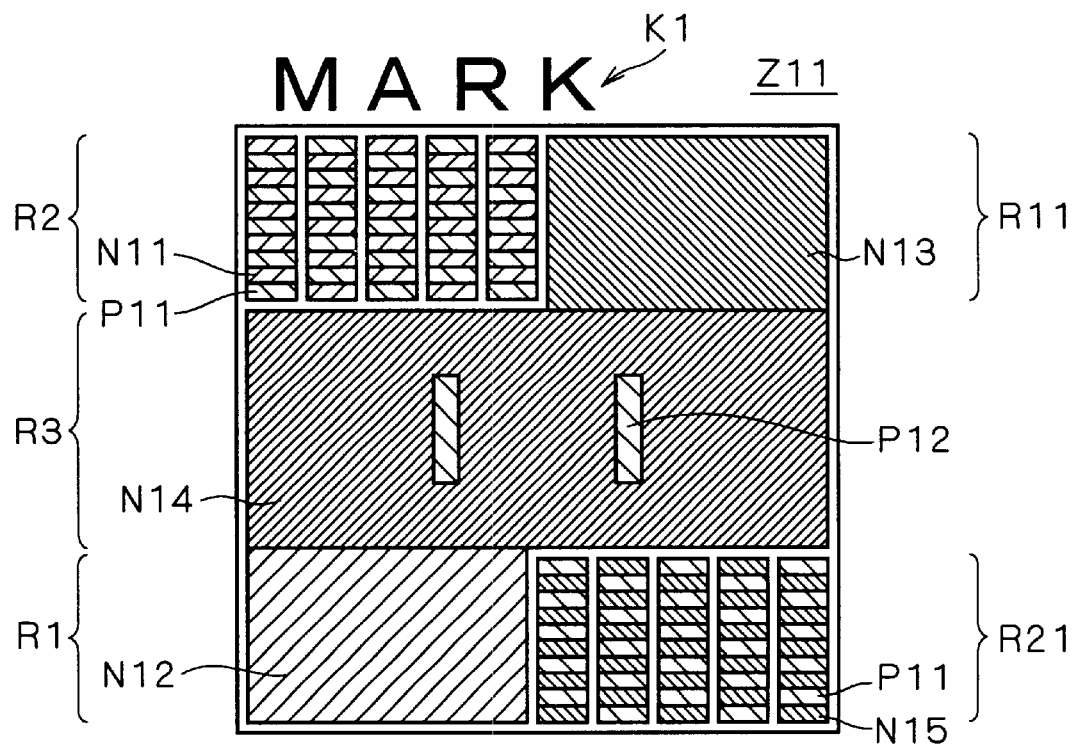
FIG. 58 is a plan view showing an implantation pattern for impurities having reverse conductivity types in the modification 2 of the embodiment 1 of the present invention.

As shown in FIG. 58, the implantation pattern Z11 generally includes five regions R1, R2, R3, R11 and R21 for finally forming a system LSI as a whole, similarly to the implantation pattern Z1 described with reference to FIG. 4. Parts identical in structure to those of the implantation pattern Z1 are denoted by the same reference numerals, to omit redundant description.

N regions N12 and N13 are formed in the regions R1 and R11 respectively.

The region R2 has such an implantation pattern that a plurality of P regions P11 and a plurality of N regions N11 are alternately arranged and such arrays are arranged in parallel.

Similarly, the region R21 has such an implantation pattern that a plurality of N regions N15 and a plurality of P regions P11 are alternately arranged as well regions and such arrays are arranged in parallel.

The region R3 has an implantation pattern provided with two P regions P12 and an N region N14 arranged around the P regions P12 as well regions.

The P regions P11 and P12 have a first impurity concentration, the N regions N11 and N12 have a second impurity concentration, the N regions N13 and N15 have a third impurity concentration, and the N region N14 has a fourth impurity concentration corresponding to the total of the second and third impurity concentrations.

Thus, it follows that the shapes of the used implantation patterns remain unchanged while the conductivity types of the impurities are reversed before and after formation of gate electrodes. This also applies to the implantation patterns Z2, Z3 and Z4 shown in FIGS. 7, 10 and 13. The exemplary application to gate implantation is now described with reference to FIGS. 59 to 63 showing sectional views successively illustrating steps.

It is assumed that the implantation pattern Z11 described with reference to FIG. 58, for example, is formed with the exposure mask for implantations M1 (see FIG. 5) and M2 (see FIG. 6).

Figure 59:
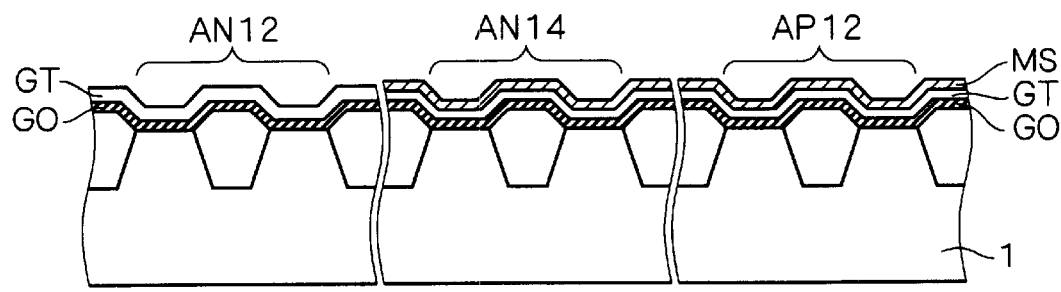
FIGS. 59 to 63 are sectional views illustrating gate implantation steps in the modification 2 of the embodiment 1 of the present invention.

It is also assumed that trench isolation structures TR of a prescribed pattern are formed in the surface of the device forming region of the semiconductor substrate 1 (target layer), as shown in FIG. 59.

FIG. 59 representatively shows sections of active regions AN12, AN14 and AP12 where a polysilicon layer GT to be formed with the N regions N12 and N14 and the P regions P12 later is arranged successively from the left.

Referring to FIG. 59, an oxide film GO for defining a gate oxide film is arranged over the main surface of the semiconductor substrate 1, and the polysilicon layer GT for defining gate electrodes is arranged on the gate oxide film GO. In this case, the polysilicon layer GT serves as the target layer for implantation.

A metal silicide layer M5 is formed on the polysilicon layer GT located in the active regions AN14 and AP12. However, the metal silicide layer M5 is not necessarily formed.

While FIG. 59 shows a state subsequent to the well implantation steps described with reference to FIGS. 27 to 34, the channel dope implantation steps described with reference to FIGS. 48 to 52 and the channel cut implantation steps described with reference to FIGS. 53 to 57, illustration of impurity regions formed through these steps is omitted for convenience.

Figure 60:
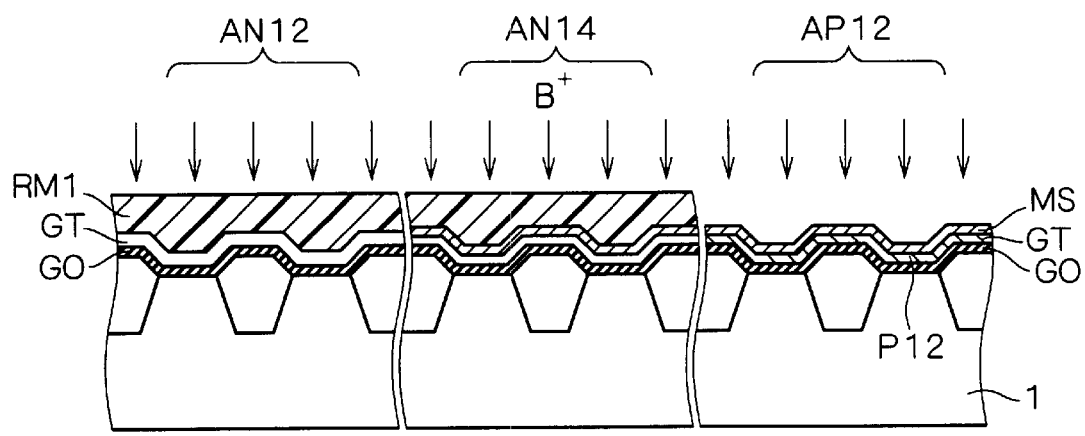

Then, a resist mask RM1 covering the active regions AN12 and AN14 is formed with the exposure mask for implantation M1 (see FIG. 5) and boron, for example, is ion-implanted from above the resist mask RM1 as a P-type impurity thereby forming the P region P12 in the polysilicon layer GT located on the active region AP12 not covered with the resist mask RM1, as shown in FIG. 60.

The current ion implantation conditions are energy of 10 keV and a dose of $2 \times 10^{15}/cm^2$ to $2 \times 10^{16}/cm^2$, for example.

Figure 61:
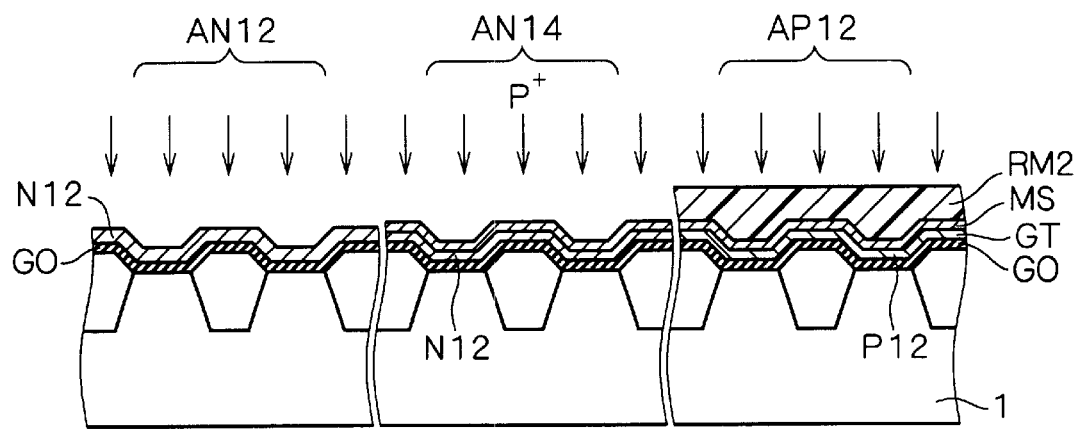

The resist mask RM1 is removed, thereafter the exposure mask for implantation M2 (see FIG. 6) is employed in the normal position for forming a resist mask RM2 covering the active region AP12 and phosphorus, for example, is ion-implanted from above the resist mask RM as an N-type impurity thereby forming the N region N12 in the polysilicon layer GT located on the active regions AN2 and AN4 not covered with the resist mask RM2, as shown in FIG. 61.

The current ion implantation conditions are energy of 20 keV and a dose of $0.5 \times 10^{15}/cm^2$ to $0.5 \times 10^{16}/cm^2$, for example.

Figure 62:
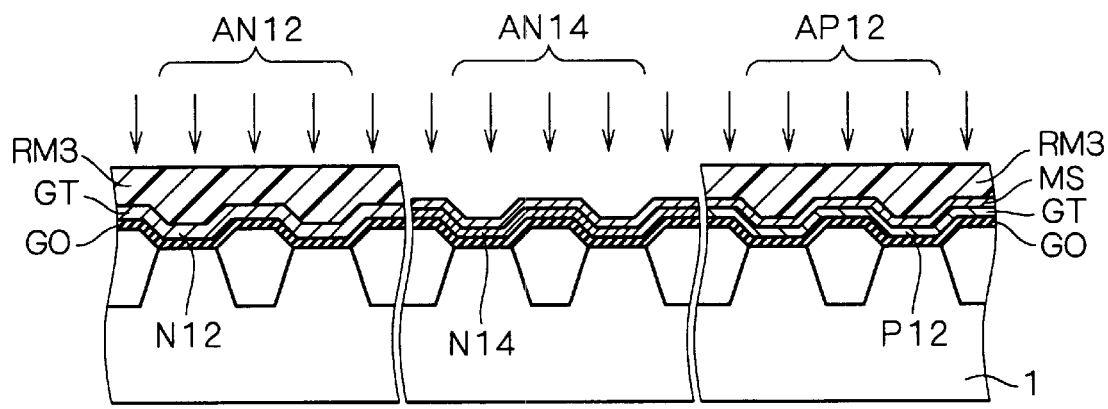

The resist mask RM2 is removed, thereafter the exposure mask for implantation M2 (see FIG. 6) is employed in the reverse position for forming a resist mask RM3 covering the active regions AN12 and AP12 and phosphorus, for example, is ion-implanted from above the resist mask RM3 as an N-type impurity thereby increasing the impurity concentration of the N region N14 in the polysilicon layer GT located on the active region AN14 not covered with the resist mask RM3 and forming the N region 14, as shown in FIG. 62.

The current ion implantation conditions are energy of 20 keV and a dose of $1.5 \times 10^{15}/cm^2$ to $1.5 \times 10^{16}/cm^2$, for example. The aforementioned ion implantation conditions are mere examples, and the present invention is not restricted to these.

Figure 63:
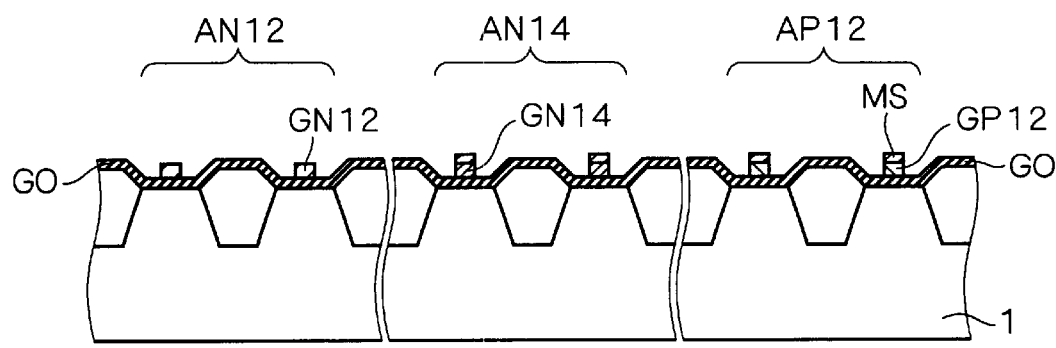

The resist mask RM3 is removed and thereafter the polysilicon layer GT and the metal silicide film M5 are selectively etched on the basis of a prescribed gate pattern thereby forming gate electrodes GN12, GN14 and GP12 containing impurities on the active regions AN12, AN14 and AP12, as shown in FIG. 63. The oxide film GO is not etched but remains on the overall main surface of the semiconductor substrate 1.

<A-4-3-1. Effect of Gate Implantation>

In the gate implantation, MOS transistors having low thresholds can be obtained by increasing the impurity concentrations in the regions for forming the logic parts as in the implantation pattern Z3 described with reference to FIG. 10, for example.

When the gate electrodes are made of polysilicon, depletion layers are formed in the gate electrodes if the impurity concentrations in the gate electrodes are low. Formation of the depletion layers substantially increases the thickness of the gate oxide film, to increase the thresholds. If the impurity concentrations in the gate electrodes are high, on the other hand, no depletion layers are formed but the thresholds can be reduced effectively for the logic parts requiring large currents and high-speed operations to the MOS transistors. This also applies to the peripheral circuit part.

In the memory cell parts, on the other hand, it is important to reduce leakage currents in off states of MOS transistors for preserving data in capacitors. To this end, it is effective to increase the thresholds while reducing the impurity concentrations of the gate electrodes of the MOS transistors forming the memory cell parts. In this regard, the regions R1 and R11 for defining the memory cell parts have relatively low impurity concentrations in the implantation pattern Z3, whereby the thresholds of the MOS transistors can be increased suitably for reducing leakage currents.

While the above description has been made only with reference to the structure implanting the impurities into the gate electrodes, the present invention may also be applied to the case of implanting fluorine or nitrogen into the gate electrodes, as a matter of course.

While a number of crystal defects are present in the vicinity of junction interfaces between the gate electrodes made of polysilicon and the gate oxide film to cause leakage currents and reduce the reliability, atoms of nitrogen or fluorine introduced into the gate electrodes are bonded with dangling bonds causing the crystal defects to recover from the crystal defects thereby improving the reliability of the gate oxide film.

When implanted into the gate electrodes and diffused in later heat treatment or the like, the impurities may pass through the gate oxide film to reach the semiconductor substrate. This phenomenon is referred to as pass-through. When pass-through takes place, it follows that the impurity concentrations of channel regions change to change the basic electric characteristics such as the thresholds. Such pass-through can be prevented by introducing nitrogen or fluorine into the gate electrodes particularly in the vicinity of the gate oxide film.

While the impurities are implanted before formation of the gate electrodes in the above description, the impurities may alternatively be implanted after formation of the gate electrodes. In this case, the impurities are implanted also into the source/drain layers for attaining an effect of reducing parasitic resistance in the source/drain layers.

<A-4-4. Exemplary Application to Source/Drain Implantation>

An exemplary application to source/drain implantation is now described with reference to FIGS. 64 to 68 showing sectional views successively illustrating steps.

It is assumed that the implantation pattern Z11 described with reference to FIG. 58, for example, is formed with the exposure mask for implantations M1 (see FIG. 5) and M2 (see FIG. 6).

Figure 64:
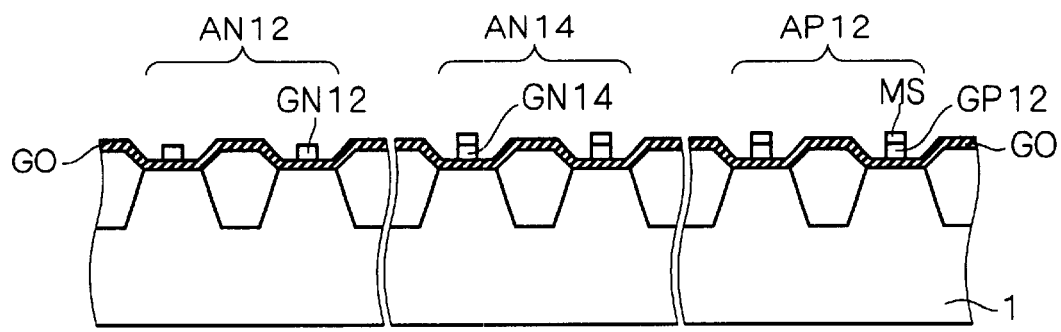
FIGS. 64 to 68 are sectional views illustrating source/drain implantation steps in the modification 2 of the embodiment 1 of the present invention.

FIG. 64 representatively shows active regions AN12, AN14 and AP12 to be formed with the N regions N12 and N14 and the P regions P12 later successively from the left.

Referring to FIG. 64, trench isolation structures TR of a prescribed pattern are formed in the surface of the device forming region of the semiconductor substrate 1 (target layer) and an oxide film GO for defining a gate oxide film is arranged over the main surface of the semiconductor substrate 1. Gate electrodes GN12, GN14 and GP12 containing impurities are arranged on the active regions AN12, AN14 and AN12 respectively, identically to the structure shown in FIG. 63.

While FIG. 64 shows a state subsequent to the well implantation steps described with reference to FIGS. 27 to 34, the channel dope implantation steps described with reference to FIGS. 48 to 52, the channel cut implantation steps described with reference to FIGS. 53 to 57 and the gate implantation steps described with reference to FIGS. 59 to 63, illustration of impurity regions formed through these steps is omitted for convenience.

Figure 65:
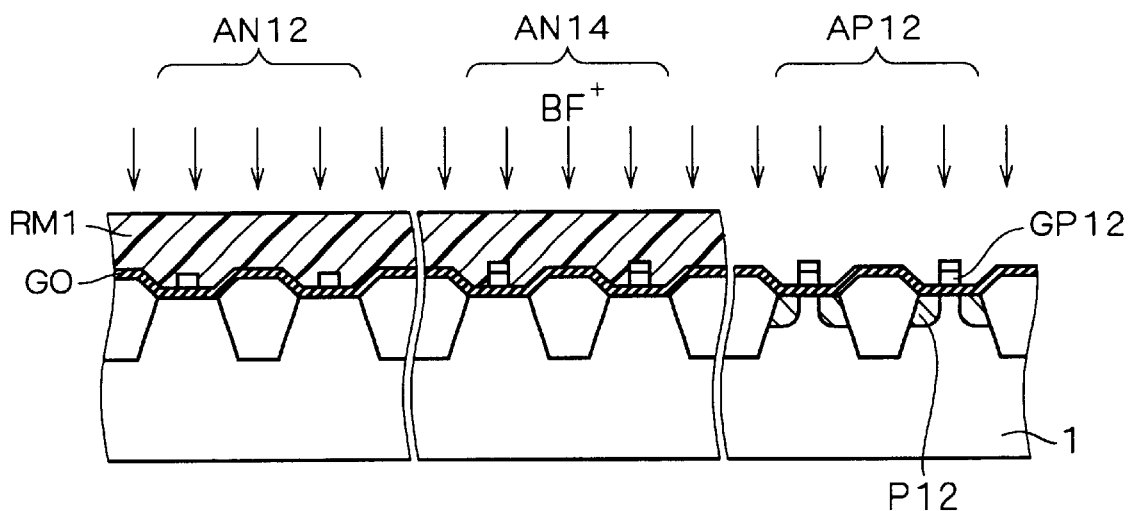

Then, a resist mask RM1 covering the active regions AN12 and AN14 is formed with the exposure mask for implantation RM1 (see FIG. 5) and boron difluoride ($BF_2$), for example, is ion-implanted from above the resist mask RM1 as a P-type impurity thereby forming the P regions P12 in a self alignment manner in the active region AP12 not covered with the resist mask RM1 through the gate electrodes GP12 serving as masks, as shown in FIG. 65.

The current ion implantation conditions are energy of 30 keV and a dose of $5.0 \times 10^{15}/cm^2$, for example.

Figure 66:
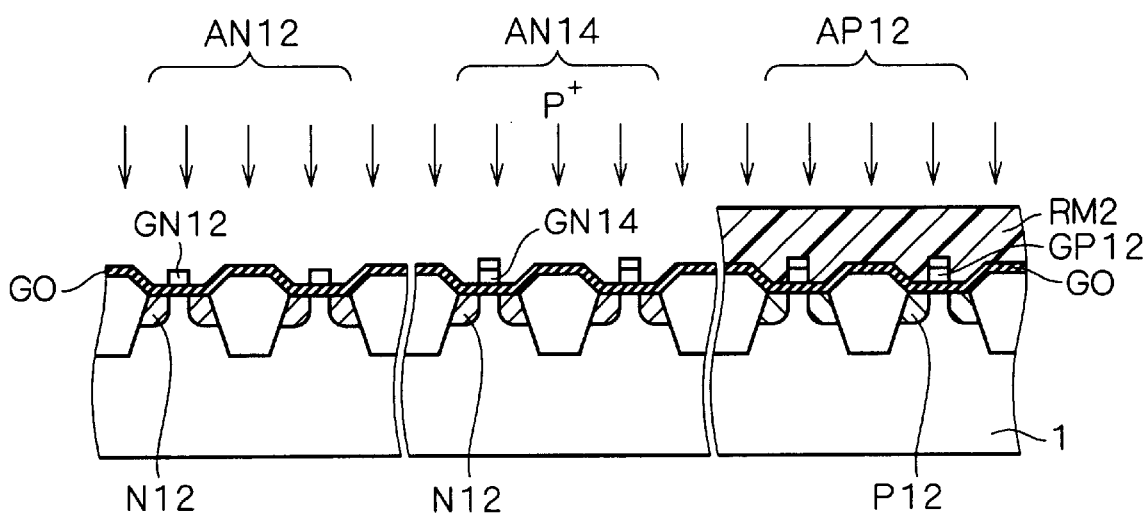

The resist mask RM1 is removed, thereafter the exposure mask for implantation M2 (see FIG. 6) is employed in the normal position for forming a resist mask RM2 covering the active region AP12 and phosphorus, for example, is ion-implanted from above the resist mask RM2 as an N-type impurity thereby forming the N regions N12 in the active regions AN12 and AN14 not covered with the resist mask RM2 in a self alignment manner through the gate electrodes GN12 and GP14 serving as masks, as shown in FIG. 66.

The current ion implantation conditions are energy of 30 keV and a dose of $0.5 \times 10^{15}/cm^2$, for example.

Figure 67:
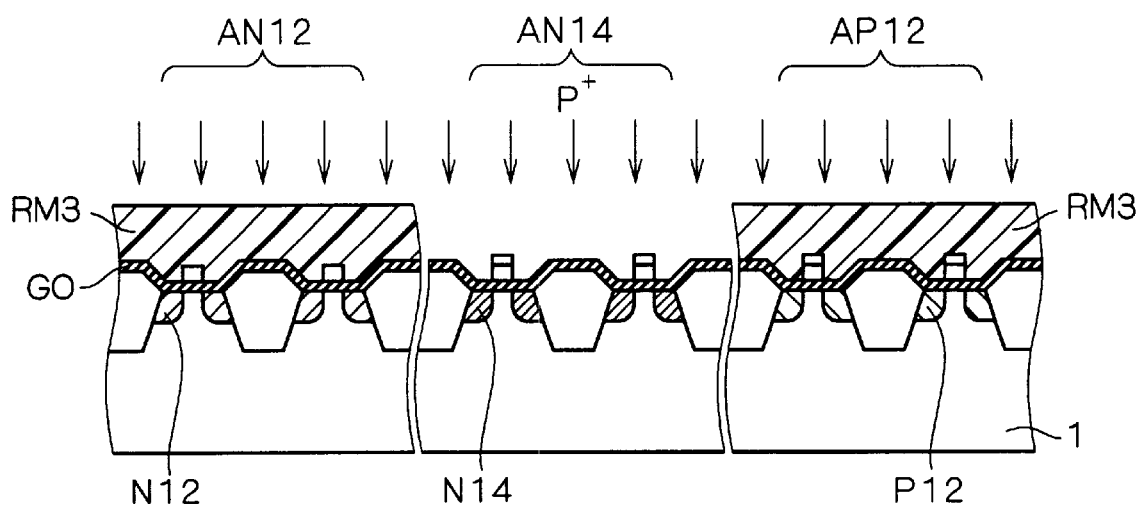

The resist mask RM2 is removed, thereafter the exposure mask for implantation M2 (see FIG. 6) is employed in the reverse position for forming a resist mask RM3 covering the active regions AN12 and AP12 and phosphorus, for example, is ion-implanted from above the resist mask RM3 as an N-type impurity thereby increasing the impurity concentration of the N regions N12 in the polysilicon layer GT located on the active region AN14 not covered with the resist mask RM3 and forming the N regions N14, as shown in FIG. 67.

The current ion implantation conditions are energy of 30 keV and a dose of $4.5 \times 10^{15}/cm^2$, for example. The aforementioned ion implantation conditions are mere examples and the present invention is not restricted to these.

Figure 68:
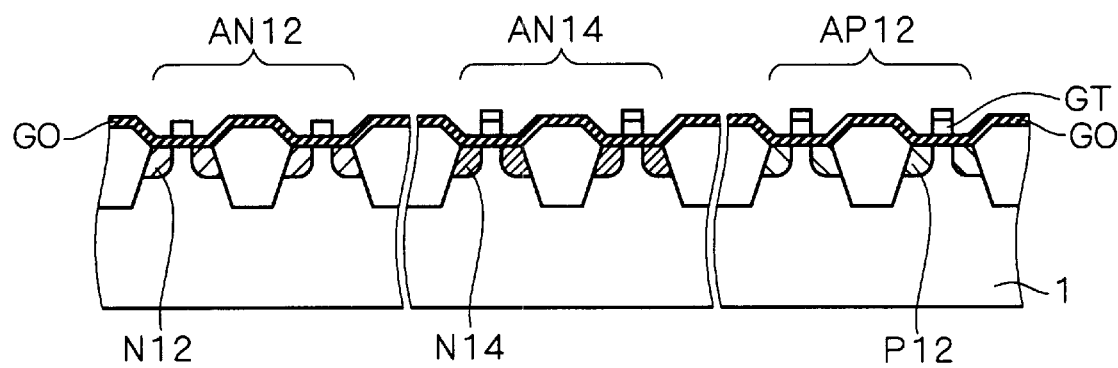

The resist mask RM3 is removed for obtaining such a structure that the N regions N12 and N14 and the P regions P12 are formed in the active regions AN12, AN14 and AP12 as source/drain layers, as shown in FIG. 68.

While the N regions N12 and N14 and the P regions P12 are described as source/drain layers in the above, LDD (lightly doped drain) layers are formed when changing the impurity concentrations.

In order to form both of LDD layers and source/drain layers, the source/drain layers may be formed through steps similar to those shown in FIGS. 64 to 68 after forming LDD layers through the aforementioned steps and forming side wall oxide films on the side surfaces of the gate electrodes GN12, GN14 and GP12. A structure having both of LDD layers and source/drain layers or a structure having LDD layers substituting for source/drain layers can be obtained by employing this technique.

While only the structure implanting the impurities for forming the source/drain layers has been described in the above, the present invention may be applied to the case of implanting fluorine or nitrogen into source/drain layers, as a matter of course.

Nitrogen or fluorine is bonded to dangling bonds to recover from crystal defects as described above, whereby leakage currents resulting from crystal defects can be reduced. Further, diffusion of the impurities can be suppressed.

<A-4-5. Exemplary Application to Pocket Implantation>

Figure 69:
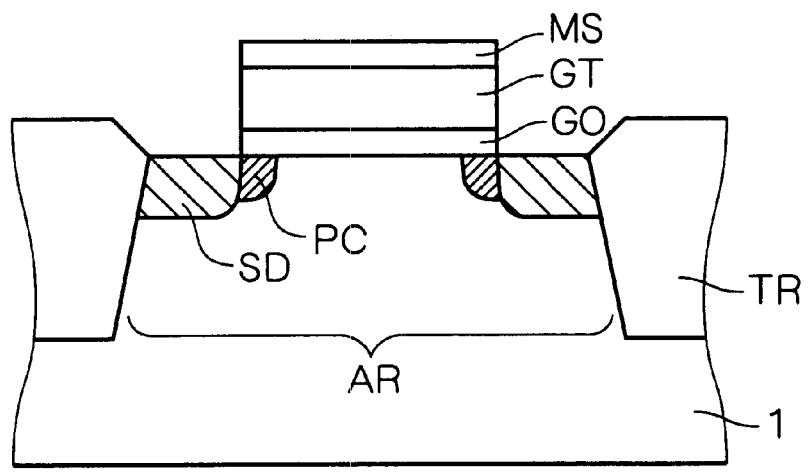
FIG. 69 is a sectional view illustrating a structure having pocket layers in the modification 2 of the embodiment 1 of the present invention.

FIG. 69 shows the sectional structure of a MOS transistor having pocket layers. Referring to FIG. 69, a gate oxide film GO, a gate electrode GT of polysilicon and a metal silicide layer M5 are stacked on an active region AR defined by trench isolation structures TR formed in the surface of the semiconductor substrate 1 (target layer).

Source/drain layers SD are oppositely arranged in the active region AR on both sides of the gate electrode GT at a space, and pocket layers PC extend from the opposite side surfaces of the source/drain layers SD.

The pocket layers PC, containing an impurity of a conductivity type reverse to that of the source/drain layers SD, have an effect of suppressing punch-through. While it follows that the channel dope regions formed for suppressing punch-through as described above are formed over the whole areas of channels before formation of the gate electrodes, the pocket layers PC formed after formation of the gate electrodes have such an effect that the threshold can be reduced since the impurity concentration (of a conductivity type reverse to that of the source/drain layers SD) at the channel center part can be reduced.

Figure 70:
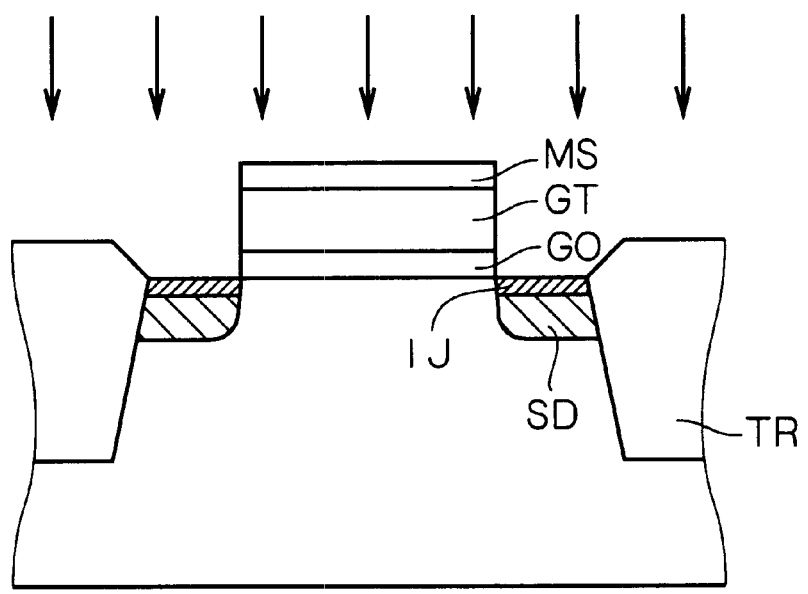
FIG. 70 is a sectional view illustrating a pocket implantation step in the modification 2 of the embodiment 1 of the present invention.

FIG. 70 shows a principal part of a manufacturing step. Referring to FIG. 70, impurity ions of a conductivity type reverse to that of the source/drain layers SD are implanted from above the active region AR formed with the source/drain layers SD for forming ion implantation layers IJ in a depth close to the surface of the substrate 1. Thereafter heat treatment is performed for diffusing the ion implantation layers IJ, thereby obtaining the structure shown in FIG. 69.

Figure 71:
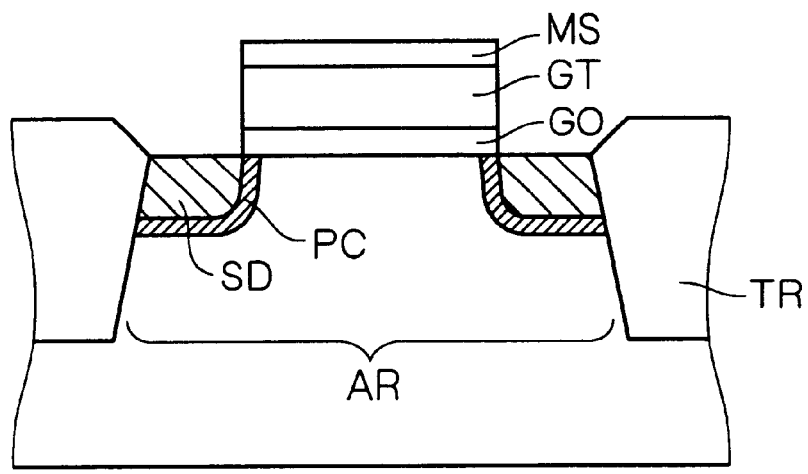
FIG. 71 is a sectional view illustrating another structure having pocket layers in the modification 2 of the embodiment 1 of the present invention.

The pocket layers PC may alternatively have shapes shown in FIG. 71. In other words, the pocket layers PC may be arranged to enclose source/drain layers SD respectively, as shown in FIG. 71.

Figure 72:
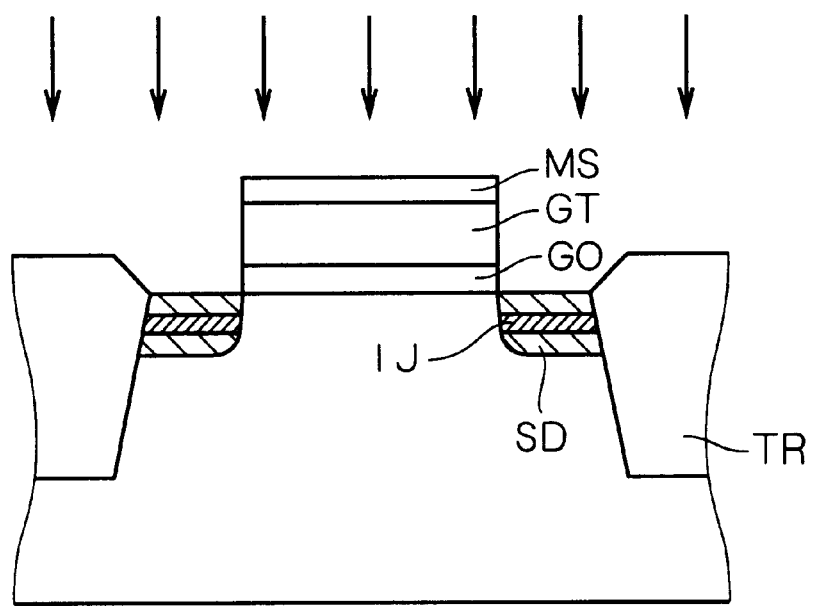
FIG. 72 is a sectional view illustrating another pocket implantation step in the modification 2 of the embodiment 1 of the present invention.

FIG. 72 shows a principal part of a manufacturing step. Referring to FIG. 72, impurity ions of a conductivity type reverse to that of the source/drain layers SD are implanted from above the active region AR formed with the source/ drain layers SD for forming the ion implantation layers IJ in a depth close to the center along the direction of the thickness of the source/drain layers SD. Thereafter heat treatment is performed for diffusing the ion implantation layers IJ thereby obtaining the structure shown in FIG. 71.

Thus, the steps of forming the pocket layers PC are similar to those of forming the source/drain layers described with reference to FIGS. 64 to 68. The pocket layers PC can be obtained by employing the exposure mask for implantations M1 and M2 used for forming the source/drain layers and changing the conductivity types of the impurities.

<A-5. Modification 3>

While the structure of obtaining two independent implantation patterns Z32 by horizontally dividing the implantation pattern Z3 through dicing along the center line between the two N regions N2 in a rotation-symmetrical implantation pattern such as the implantation pattern Z3 described with reference to FIG. 38, for example, in relation to the aforementioned first to fourth exemplary structures, the number of patterns obtained by dividing such an implantation pattern is not restricted to two.

<A-5-1. Structure of Implantation Pattern>

A structure of dividing a single implantation pattern into four is described as exemplary division of the implantation pattern.

Figure 73:
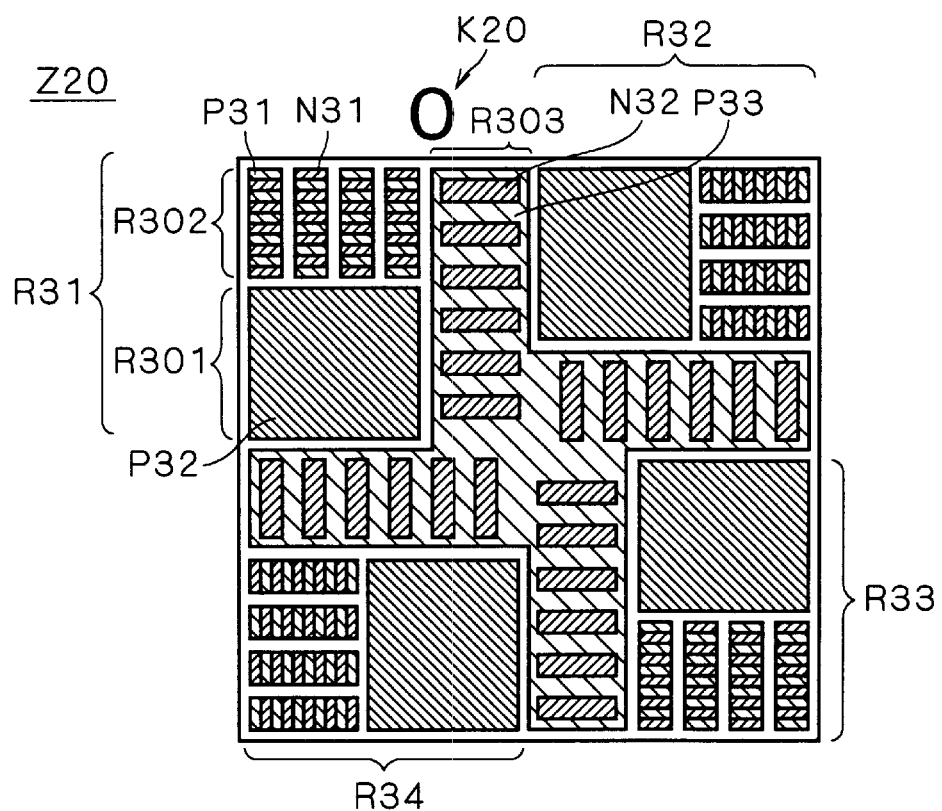
FIG. 73 is a plan view showing an implantation pattern in a modification 3 of the embodiment 1 of the present invention.

FIG. 73 shows an implantation pattern Z20, which can be divided into four. Referring to FIG. 73, the implantation pattern Z20 generally includes four rotation-symmetrical rectangular regions R31, R32, R33 and R34, which are alternately arranged in directions different by 90° from each other for forming the rectangular implantation pattern Z20 as a whole.

Each of the regions R31 to R34 is formed by three regions. For example, the region R31 is formed by a lower left region R301, an upper left region R302 and a right region R303. This also applies to the regions R32 to R34.

A P region P32 is formed in the region R301, while the region R302 has such an implantation pattern that a plurality of P regions P31 and a plurality of N regions N31 are alternately arranged and such arrays are arranged in parallel. A plurality of N regions N32 are aligned at intervals in the region R303, and a P region P33 is arranged to enclose the N regions N32.

The N regions N31 and N32 have a first impurity concentration, the P region P32 has a second impurity concentration, the P regions 31 have a third impurity concentration twice the second impurity concentration, and the P region P33 has a fourth impurity concentration four times the second impurity concentration.

An alignment mark K20 for mask alignment is provided on a semiconductor substrate outside the implantation pattern Z20 in the form of the numeral "0".

Figure 74:
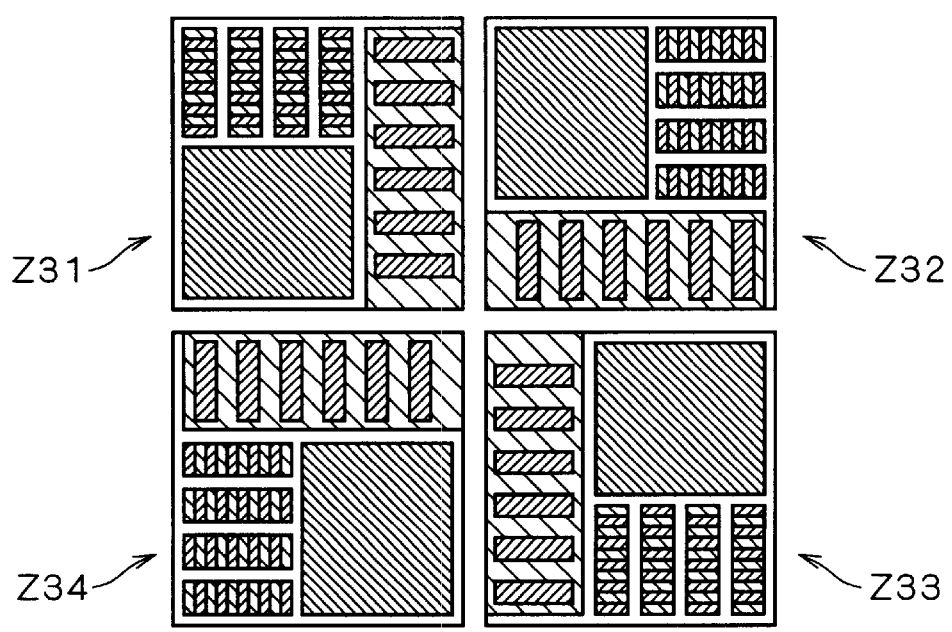
FIGS. 74 and 75 are plan views showing exemplary division of the implantation pattern in the modification 3 of the embodiment 1 of the present invention.

FIG. 74 shows the implantation pattern Z20 having the aforementioned structure, which is divided into four. As shown in FIG. 74, independent implantation patterns Z31, Z32, Z33 and Z34 corresponding to the regions R31 to R34 respectively can be obtained by dividing the implantation pattern Z20 along the boundaries between the regions R31 to R34 serving as dicing lines.

Figure 75:
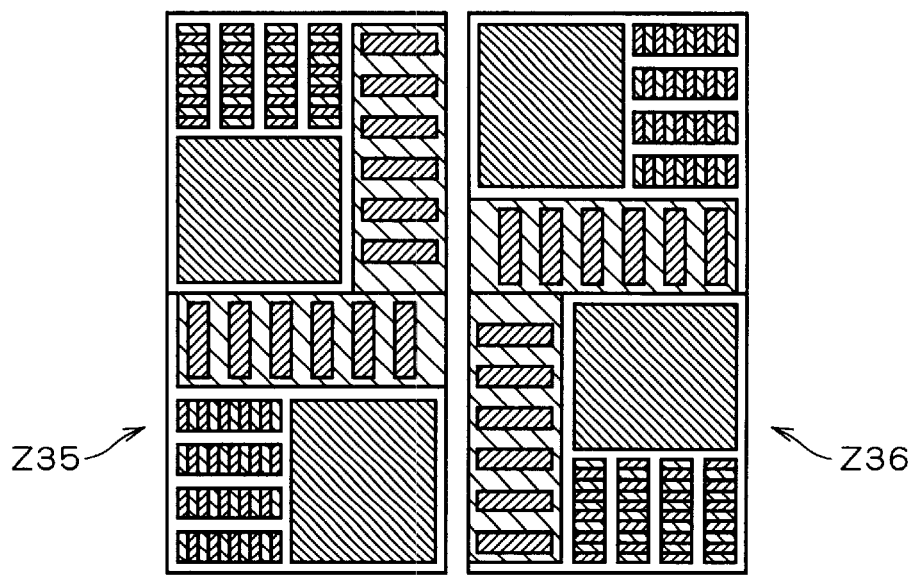

The implantation pattern Z20 can also be divided into two as shown in FIG. 75, depending on setting of the dicing line.

In other words, an implantation pattern Z35 formed by the regions R31 and R34 and an implantation pattern Z36 formed by the regions R32 and R33 can be obtained by dividing the implantation pattern Z20 along the boundary between the regions R31 and R34 and the region R33 serving as a dicing line, as shown in FIG. 75.

<A-5-2. Method of Manufacturing Implantation Pattern>

First, the structures of exposure mask for implantations M20 and M30 for forming the implantation pattern Z20 are described with reference to FIGS. 76 and 77.

Figure 76:
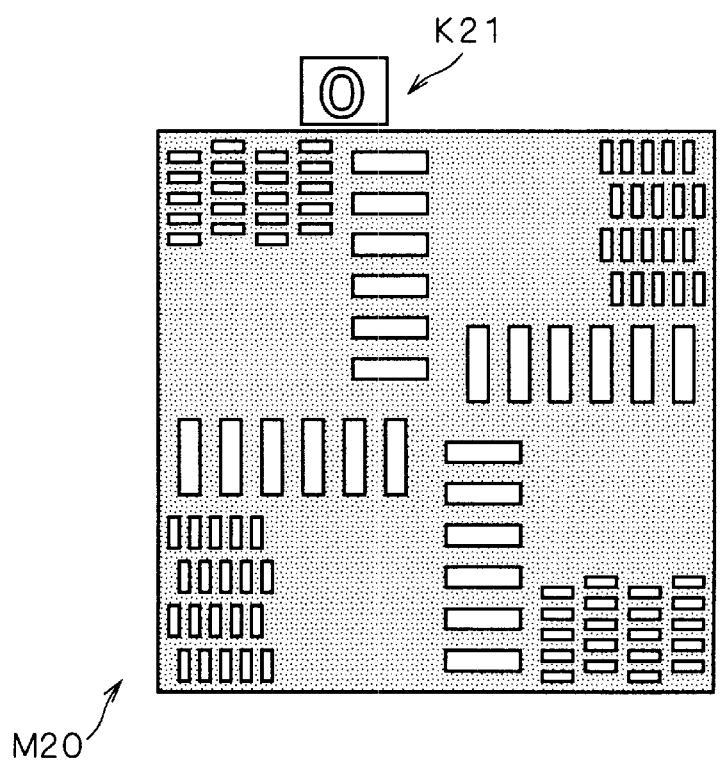
FIGS. 76 and 77 illustrate exposure mask for implantations for manufacturing the implantation pattern in the modification 3 of the embodiment 1 of the present invention.

The exposure mask for implantation M20 shown in FIG. 76 for forming the N regions N31 and N32 in the regions R31 to R34 has such a pattern that portions corresponding to the N regions N31 and N32 are openings. The mask M20 is provided on its outer edge with an alignment mark K21 to be superposed with the alignment mark K20 on the semiconductor substrate.

Figure 77:
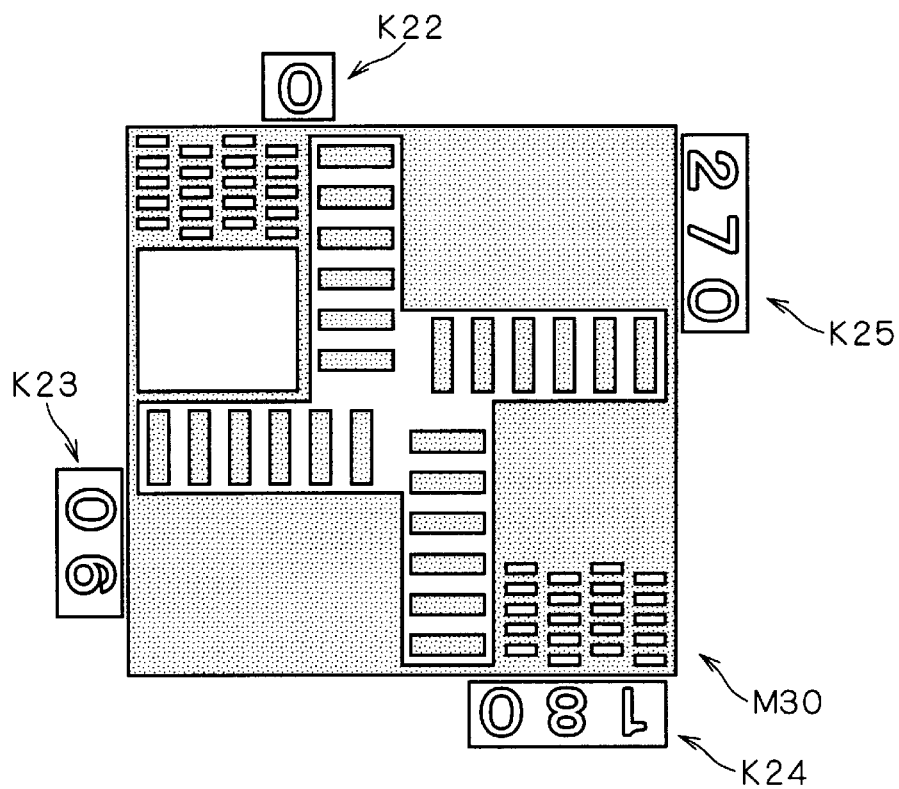

The exposure mask for implantation M30 shown in FIG. 77 for forming the P regions P31 to P33 has such a pattern that portions corresponding to the P regions P31 and P32 in the region R31 and the P regions P31 in the region R33 are openings in the normal position. Further, portions corresponding to the P regions P33 in the regions R31 to R34 are openings.

The mask M30 is provided on its outer edges with alignment marks K22, K23, K24 and K25 to be superposed with the alignment mark K20 on the semiconductor substrate in the normal position, a position rotated by 90° (rotated clockwise by 90° with respect to the normal position), a position rotated by 180° (position rotated clockwise by 180° with respect to the normal position) and a position rotated by 270° (position rotated clockwise by 270° with respect to the normal position) with respect to the alignment mark K20 respectively.

A method of manufacturing the implantation pattern Z20 is now described with reference to FIGS. 78 to 85.

Figure 78:
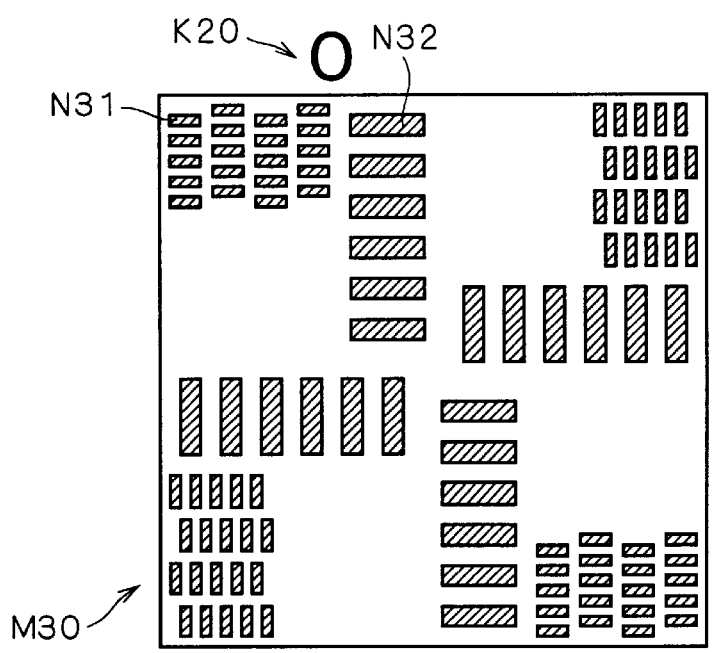
FIGS. 78 to 85 are plan views illustrating steps of manufacturing the implantation pattern in the modification 3 of the embodiment 1 of the present invention.

First, a resist material (not shown) is applied onto the semiconductor substrate (target layer) and thereafter the exposure mask for implantation M20 shown in FIG. 76 is so arranged as to superpose the alignment mark K21 with the alignment mark K20. The mask pattern is transferred to the resist material through photolithography for forming a resist mask (not shown) and an N-type impurity is ion-implanted from above the resist mask thereby forming the N regions N31 and N32 having the first impurity concentration in the regions R31 to R34, as shown in FIG. 78.

Figure 79:
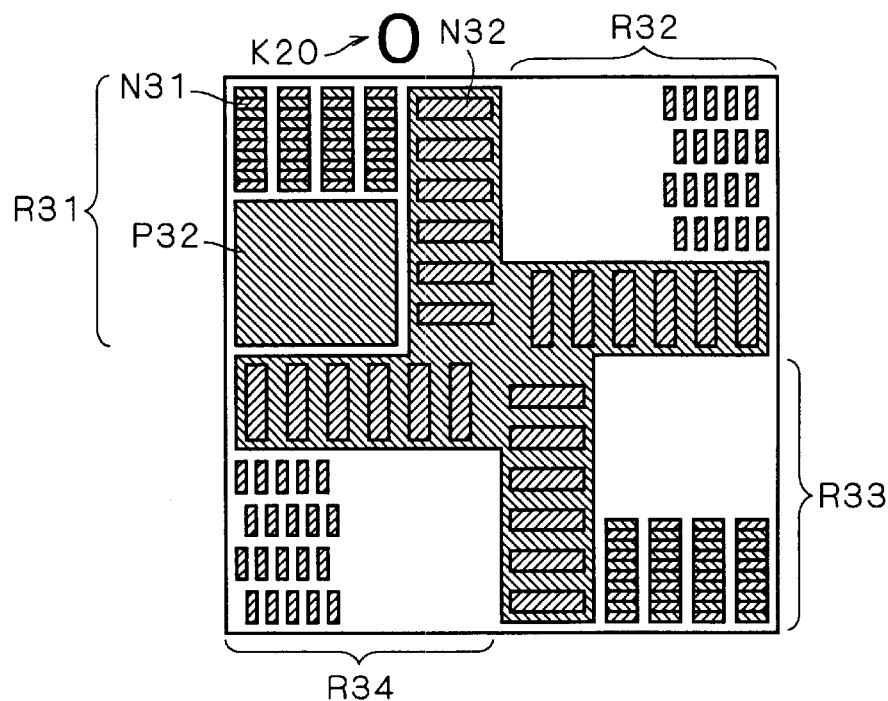
Figure 80:
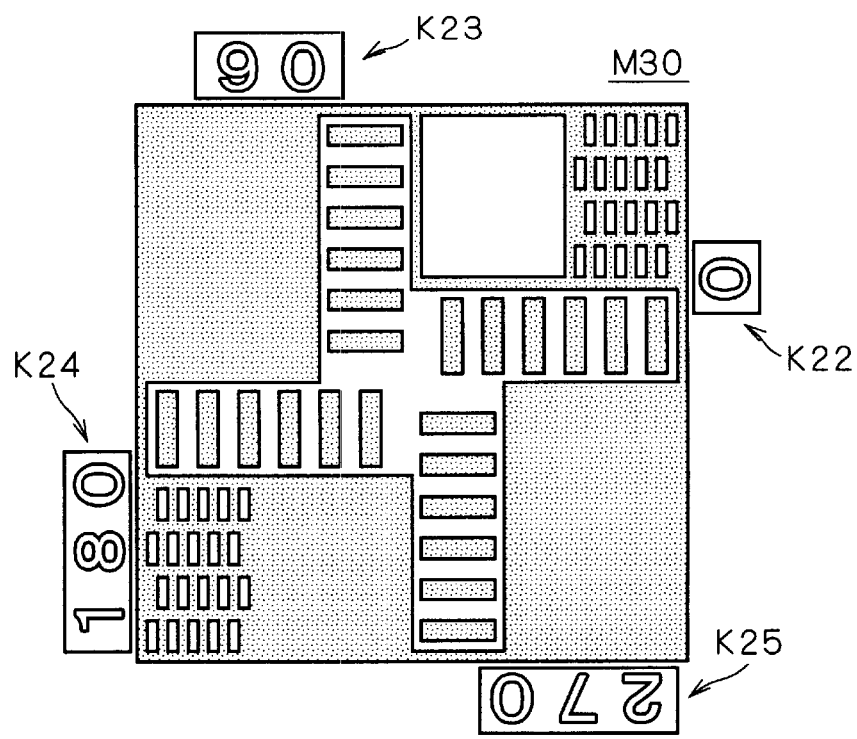

Then, the resist mask is removed, thereafter a new resist material is applied and the exposure mask for implantation M30 shown in FIG. 77 is so arranged in the normal position as to superpose the part of the numeral "0" of the alignment mark K22 with the alignment mark K20 on the semiconductor substrate. The mask pattern is transferred to the resist material through photolithography for forming a resist mask (not shown) and a p-type impurity is ion-implanted for forming the P region P32 having the second impurity concentration in the region R31 as shown in FIG. 79. At this time, P-type impurity ions are implanted also into portions for forming the P regions P31 in the regions R31 and R33 and the P regions P33 in the regions R31 to R34 in the second impurity concentration.

Figure 81:
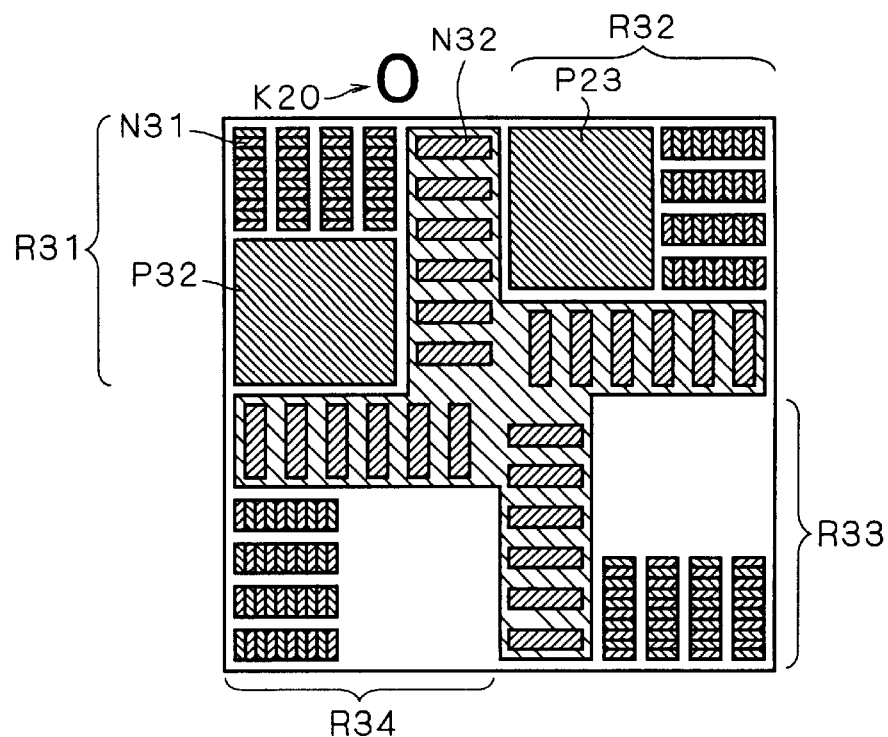
Figure 82:
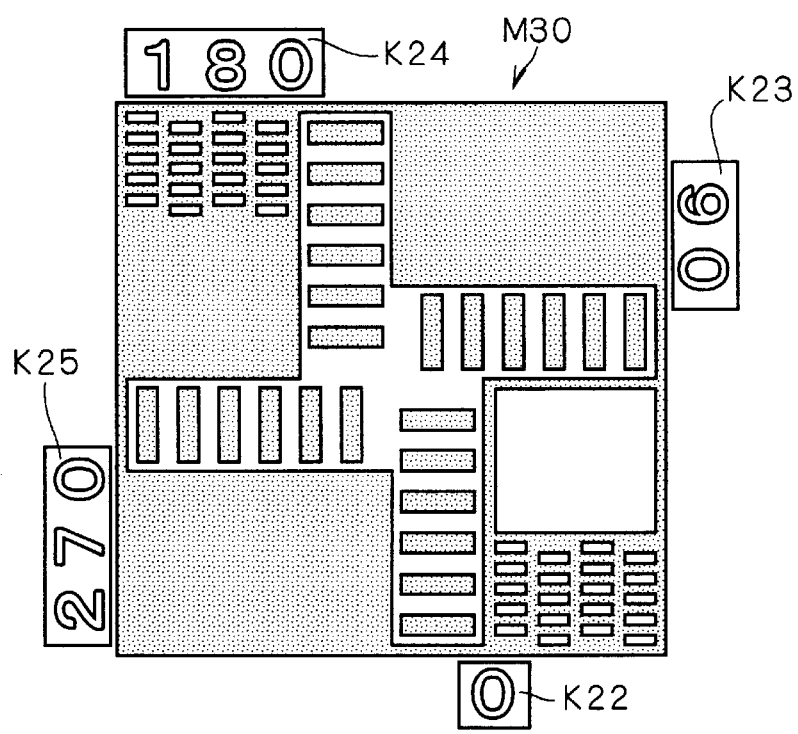

Then, the resist mask is removed, thereafter a new resist material is applied and the exposure mask for implantation M30 is so arranged in the normal position rotated by 90° as to superpose the part of the numeral "0" of the alignment mark K23 with the alignment mark K20 on the semiconductor substrate. The mask pattern is transferred to the resist material through photolithography for forming a resist mask (not shown) and a P-type impurity is ion-implanted for forming the P region P32 having the second impurity concentration in the region R32 as shown in FIG. 81. At this time, P-type impurity ions are implanted also into portions for forming the P regions P31 in the regions R32 and R34 and the P regions P33 in the regions R31 to R34.

Figure 83:
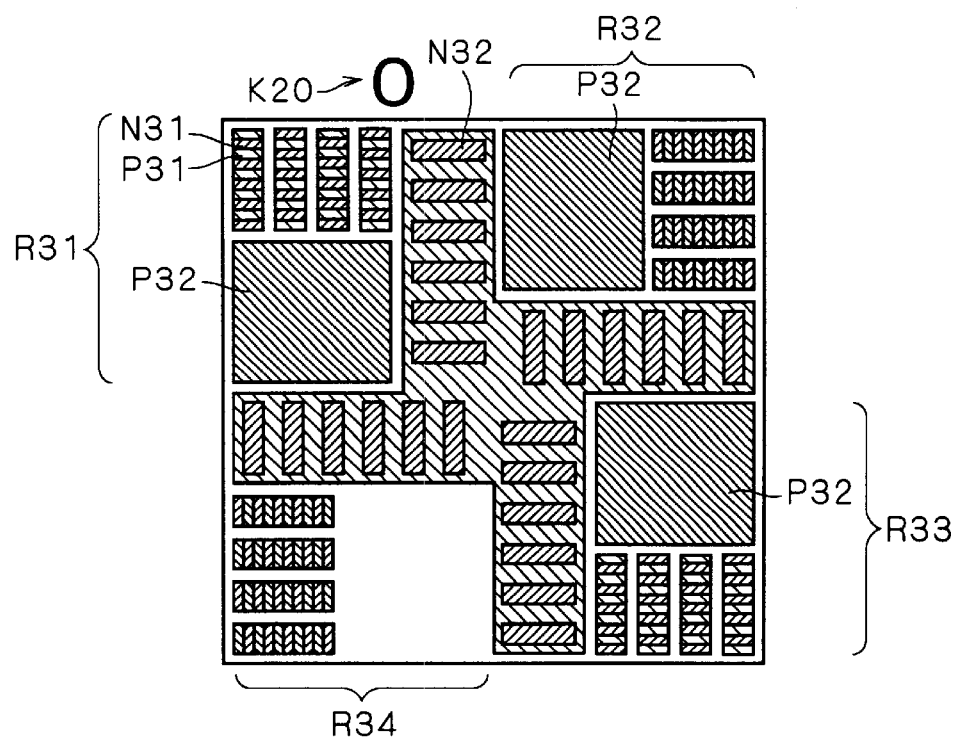

Then, the resist mask is removed, thereafter a new resist material is applied and the exposure mask for implantation M30 is so arranged in the position rotated by 180° as to superpose the part of the numeral "0" in the alignment mark K24 with the alignment mark K20 on the semiconductor substrate. The mask pattern is transferred to the resist material through photolithography for forming a resist mask (not shown) and a P-type impurity is ion-implanted thereby forming the P region P32 having the second impurity concentration in the region R33 as shown in FIG. 83. At this time, P-type impurity ions are implanted also into the P regions P31 in the regions R31 and R33 in the second impurity concentration, so that the P regions P31 in the regions R31 and R33 have the third impurity concentration.

P-type impurity ions are implanted also into portions for forming the P regions P33 in the regions R31 to R34 in the second impurity concentration.

Figure 84:
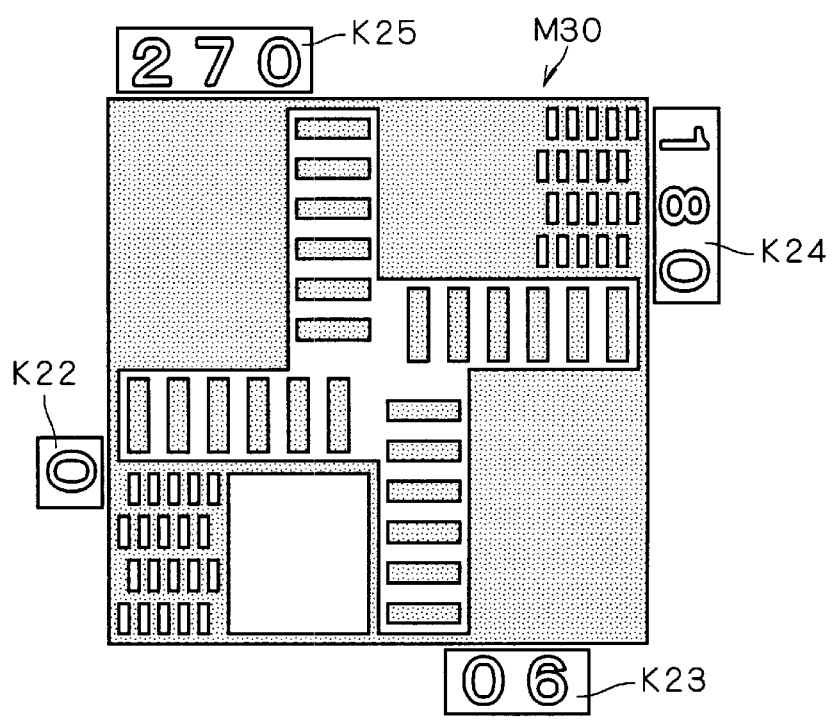
Figure 85:
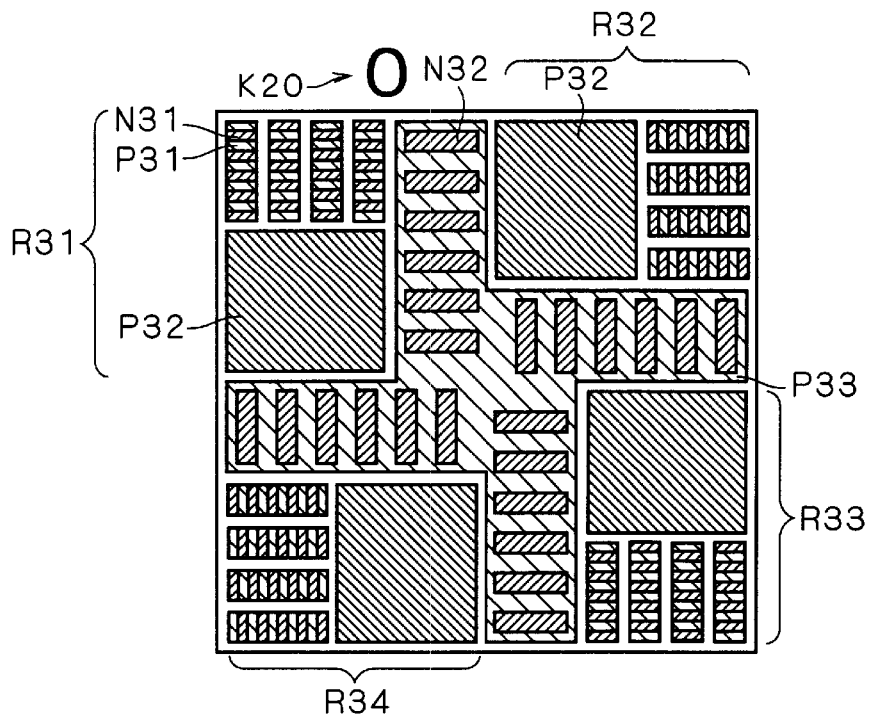

Then, the resist mask is removed, thereafter a new resist material is applied and the exposure mask for implantation M30 is so arranged in the position rotated by 270° as to superpose the part of the numeral "0" of the alignment mark K25 with the alignment mark K20 on the semiconductor substrate, as shown in FIG. 84. The mask pattern is transferred to the resist material through photolithography for forming a resist mask (not shown) and a P-type impurity is ion-implanted thereby forming the P region P32 having the second impurity concentration in the region R34 as shown in FIG. 85. At this time, P-type impurity ions are implanted also into the P regions P31 in the regions R32 and R34 in the second impurity concentration so that the P regions P31 in the regions R32 and R34 have the third impurity concentration.

P-type impurity ions are implanted also into portions for forming the P regions P33 in the regions R31 to R34 in the second impurity concentration so that the P regions P33 have the fourth impurity concentration for forming the implantation pattern Z20.

Figure 86:
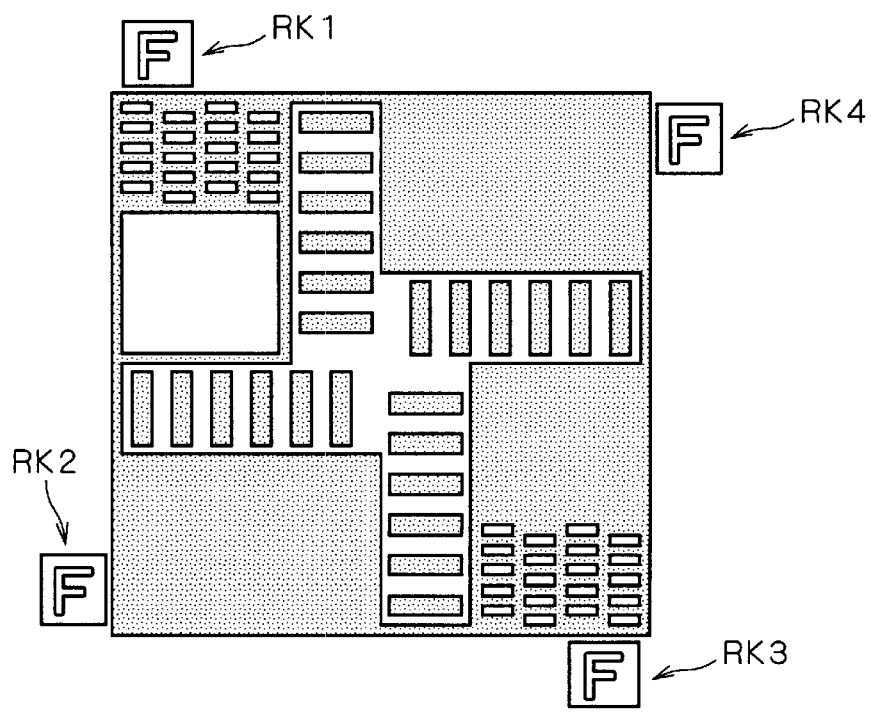
FIG. 86 illustrates still another exposure mask for implantation for manufacturing the implantation pattern in the modification 3 of the embodiment 1.

While the exposure mask for implantation M30 shown in FIG. 77 includes rotational information of the mask M30 in the alignment marks K22 to K25 in the form of the numerals "0", "90", "180" and "270" indicating the angles of rotation, a structure shown in FIG. 86 may alternatively be employed as the rotational information.

Referring to FIG. 86, characters "F" are arranged on outer edges of the mask as rotation marks RK1 to RK4.

With the rotation marks RK1 to RK4 arranged in different states, the angles of rotation of the mask can be recognized for preventing erroneous arrangement of the mask.

While the structure having the rotation-symmetrically arranged regions R31 to R34 has been shown in the above description, a structure having a plurality of line symmetrically arranged regions can also be manufactured by turning over the exposure mask for implantation in different directions a plurality of times.

<A-5-3. Rotation Frequency of Exposure Mask for Implantation>

While three types of impurity regions are formed with the aforementioned exposure mask for implantation M30, 16 types of impurity regions, inclusive of regions not subjected to impurity implantation, can be formed in theory by using a single mask four times at different angles.

The number of such impurity regions can be further increased by complicating the mask shape.

Figure 87:
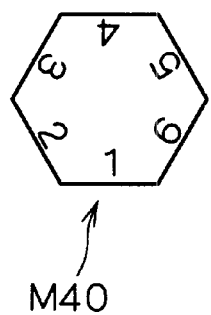
FIG. 87 illustrates a mask for hexagonal implantation.

For example, 36 types of impurity regions can be formed with an exposure mask for implantation M40 shown in FIG. 87 having a hexagonal shape. FIG. 87 shows the angles of rotation of the mask M40 with numerals 1 to 6.

Figure 88:
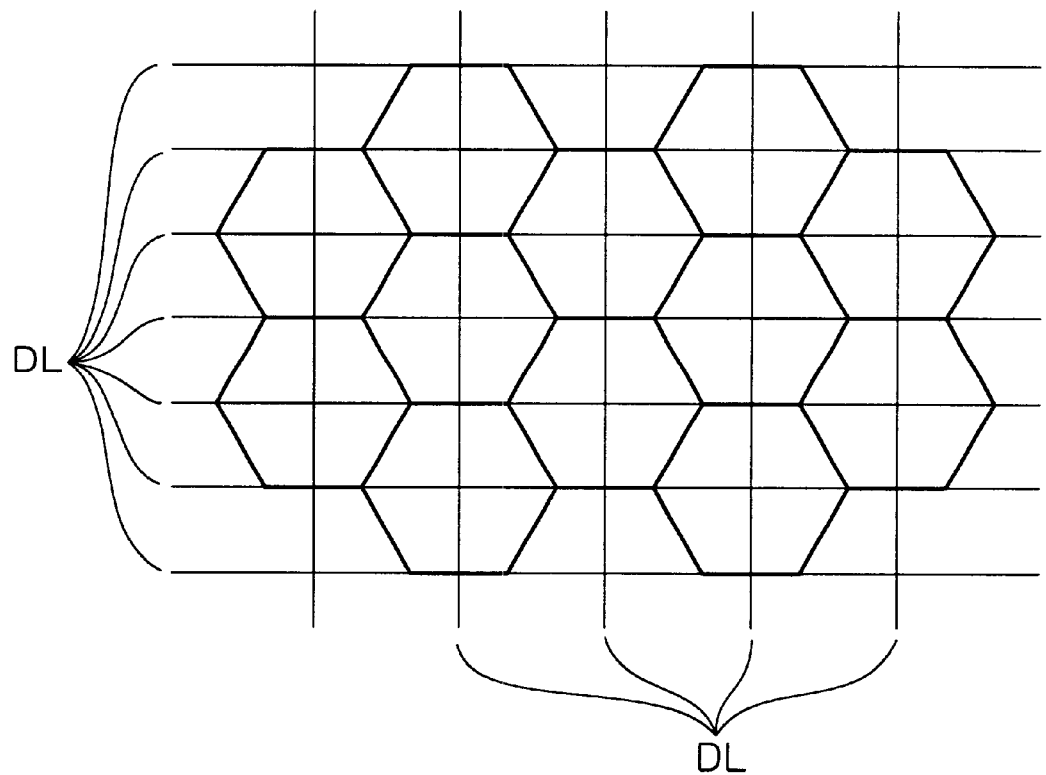
FIG. 88 illustrates an arrangement state of masks for hexagonal implantation.

Such exposure mask for implantations M40 are arranged on a semiconductor substrate in the form of a honeycomb, as shown in FIG. 88. In this structure, dicing lines DL are so set as to form a single semiconductor device by combining parts of adjacent implantation patterns as shown in FIG. 88.

<A-6. Modification 4>

While the structures of rotation-symmetrical implantation patterns have been described with reference to the first to fourth exemplary structures, the present invention is also applicable to a line-symmetrical implantation pattern.

Figure 89:
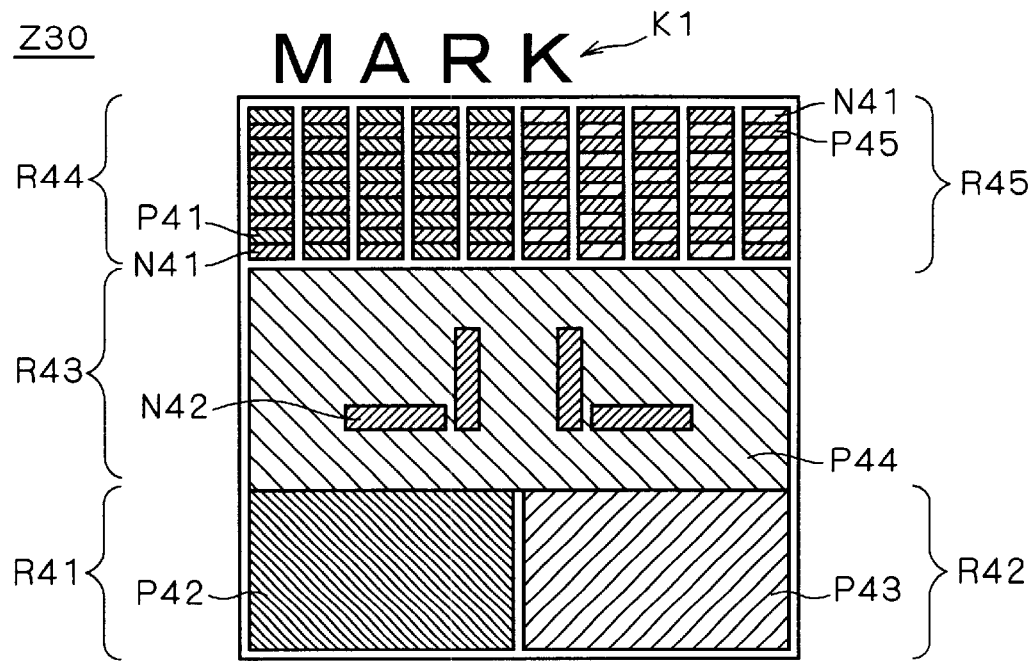
FIG. 89 is a plan view showing an implantation pattern in a modification 4 of the embodiment 1 of the present invention.

FIG. 89 shows an exemplary line-symmetrical implantation pattern Z30. The implantation pattern Z30 shown in FIG. 89 has a rectangular shape and generally includes five regions, i.e., a lower left region R41, a lower right region R42 line-symmetrical with the region R41, a central region R43, an upper left region R44 and an upper right region R45 line-symmetrical with the region R44.

An alignment mark K1 for mask alignment is provided on a semiconductor substrate outside the implantation pattern Z30.

P regions P42 and P43 are formed in the regions R41 and R42 respectively.

The region R44 has such an implantation pattern that a plurality of P regions P41 and a plurality of N regions N41 are alternately arranged and such arrays are arranged in parallel.

Similarly, the region R45 has such an implantation pattern that a plurality of P regions P45 and a plurality of N regions N41 are alternately arranged and such arrays are arranged in parallel.

The region R43 has an implantation pattern provided with four N regions N42 and a P region P44 arranged around the N regions N42. Two pairs of N regions N42 are arranged on the left and right sides of FIG. 89 in a horizontally line-symmetrical manner.

The N regions N41 and N42 have a first impurity concentration, the P regions P41 and P42 have a second impurity concentration, the P regions P43 and P45 have a third impurity concentration, and the P region P44 has a fourth impurity concentration corresponding to the total of the second and third impurity concentrations.

Figure 90:
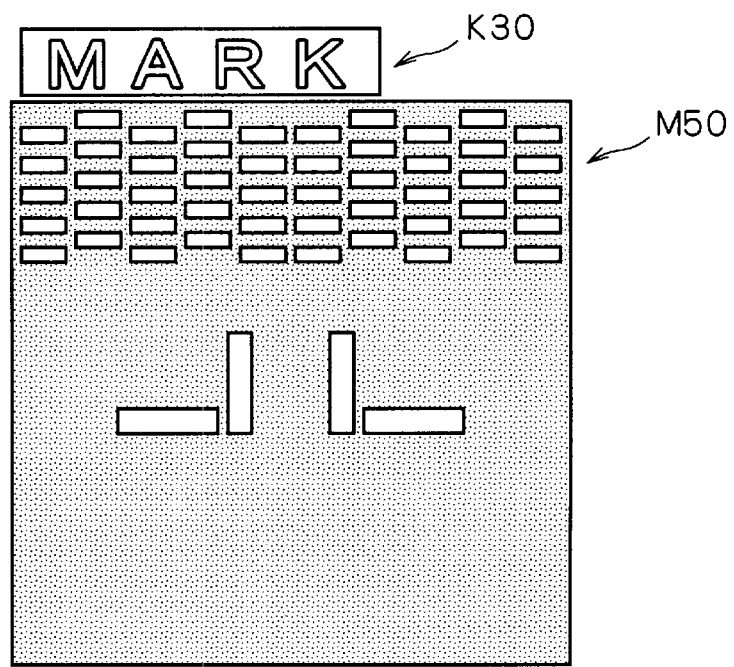
FIGS. 90 and 91 illustrate exposure mask for implantations for manufacturing the implantation pattern in the modification 4 of the embodiment 1 of the present invention.

FIG. 90 shows an exposure mask for implantation M50 for forming the N regions N41 and N42, having openings in portions corresponding to the N regions N41 and N42. The mask M50 is provided on its outer edge with an alignment mark K30 to be superposed with the alignment mark K1 on the semiconductor substrate.

Figure 91:
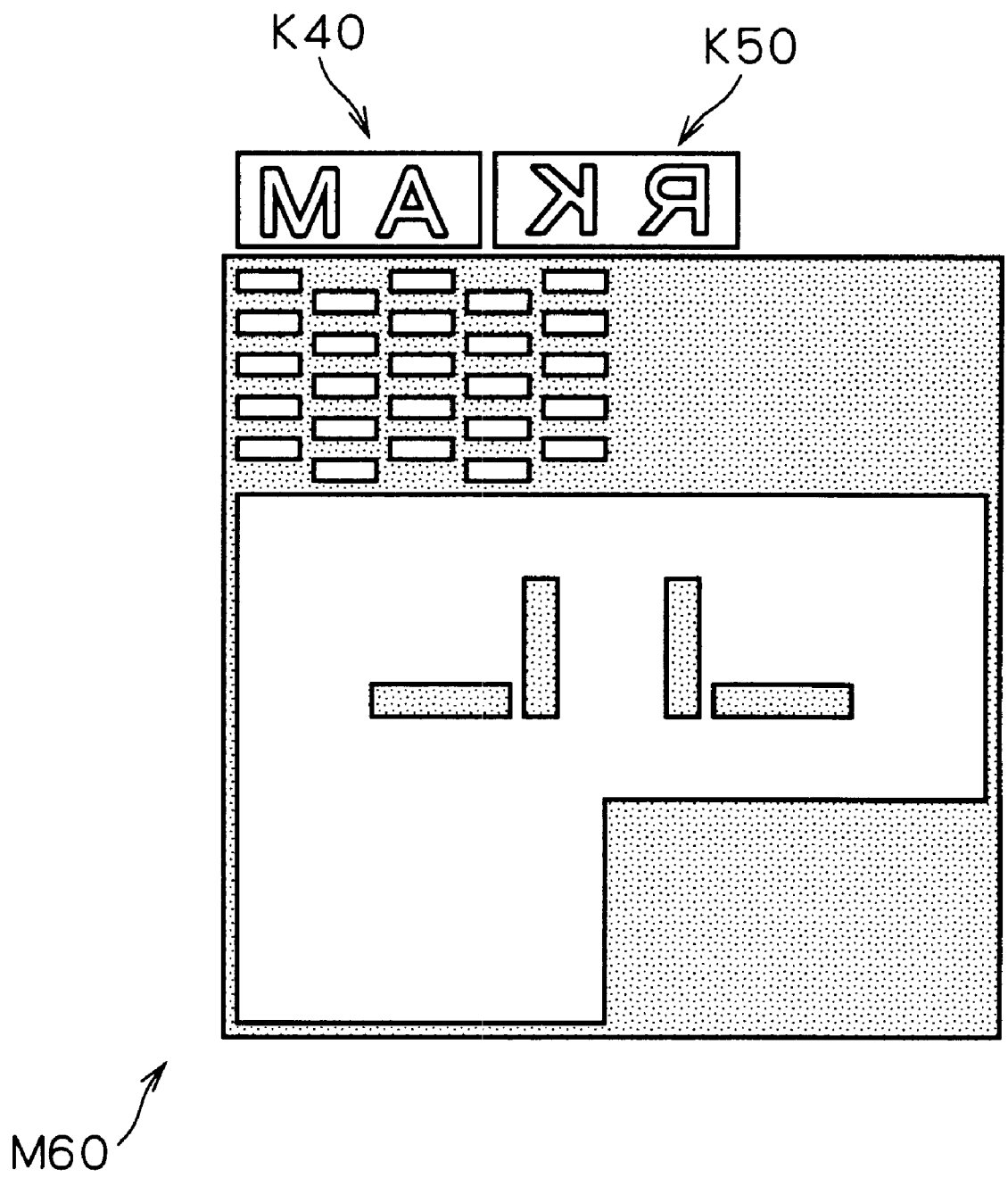

FIG. 91 shows an exposure mask for implantation M60 for forming the P regions P41 to P45, having openings in portions corresponding to the P regions P41, P42 and P44 in the normal position. The mask M60 is provided on its outer edge with alignment marks K40 and K50 to be superposed with the alignment mark K1 on the semiconductor substrate in the normal position and in a reverse position (turned over with respect to the normal position) respectively.

In order to form the implantation pattern Z30 with the exposure mask for implantations M50 and M60 having the aforementioned structures, the exposure mask for implantation M50 is first arranged on the semiconductor substrate (target layer) to which a resist material is applied, for forming a resist pattern by performing pattern transfer through photolithography and ion-implanting an N-type impurity into the semiconductor substrate through the resist pattern thereby forming the N regions N41 and N42 having the first impurity concentration.

Then, the exposure mask for implantation M60 is arranged on the semiconductor substrate formed with the N regions n41 and N42 in the normal position, for forming a resist pattern by performing pattern transfer through photolithography and ion-implanting a P-type impurity through the resist pattern thereby forming the P regions P41 and P42 having the second impurity concentration. At this time, P-type impurity ions are implanted also into a portion for defining the P region P44 in the second impurity concentration.

Then, the exposure mask for implantation M60 is arranged on the semiconductor substrate formed with the P regions P41 and P42 in the reverse position, for forming a resist pattern by performing pattern transfer through photolithography and ion-implanting a P-type impurity through the resist pattern thereby forming the P regions P43 and P45 having the third impurity concentration while implanting P-type impurity ions also into the portion for forming the P region P44 in the third impurity concentration thereby forming the P region P44 having the fourth impurity concentration.

Thus, the exposure mask for implantation M50 has such an opening pattern that superposed and non-superposed portions are present when used in turnover, whereby three types of implantation patterns having different concentrations can be obtained with a single type of mask by setting doses on the normal and reverse positions to different values so that four types of implantation patterns can be obtained with two types of masks inclusive of the exposure mask for implantation M50.

<B. Embodiment 2>
<B-1. Device Structure>

While the structure applying the present invention to impurity implantation steps in a semiconductor device has been described with reference to the aforementioned embodiment 1 of the present invention, a structure applying the present invention to formation of wire layers is described with reference to an embodiment 2.

Figure 92:
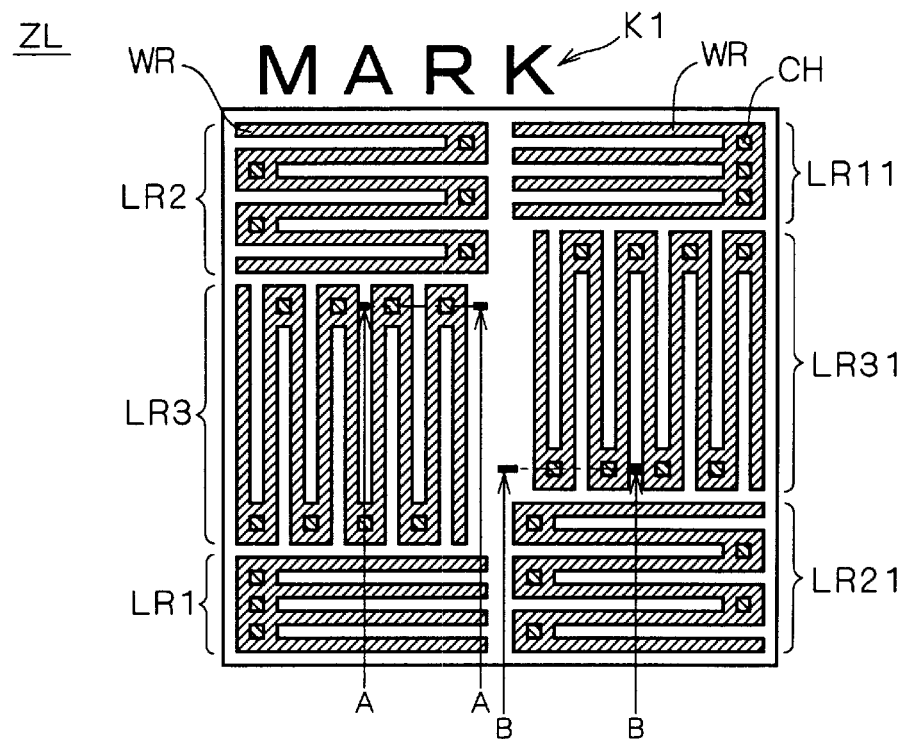
FIG. 92 is a plan view illustrating the structure of a wire pattern in an embodiment 2 of the present invention.

FIG. 92 shows a wire pattern ZL as an exemplary wire pattern to which the present invention is applicable.

As shown in FIG. 92, the wire pattern ZL generally includes six patterns, i.e., a lower left pattern LR, an upper left pattern LR2, a central left pattern LR3, a pattern LR11 diagonal with the pattern LR1, a pattern LR21 diagonal with the pattern LR2 and a pattern LR31 adjacent to the pattern LR3.

These patterns are structured by wires WR formed by filling up grooves formed in an interlayer isolation film serving as an underlayer with a wire material and contact parts CH, which are formed by a dual damascene method simultaneously filling up the wire grooves and contact holes.

The pattern LR11 has a shape obtained by rotating the pattern LR1 by 180°, the pattern LR21 has a shape obtained by rotating the pattern LR2 by 180° and the pattern LR31 has a shape obtained by rotating the pattern LR3 by 180°.

An alignment mark K1 for mask alignment is provided on a semiconductor substrate outside the wire pattern ZL.

The wire pattern ZL is shown in a simplified manner for convenience of illustration of the present invention.

While the wire pattern ZL is formed in the interlayer isolation film arranged on the semiconductor substrate, illustration of the semiconductor substrate and the interlayer isolation film is omitted in FIG. 92.

The wire pattern ZL having the patterns horizontally rotation-symmetrical by 180° is so formed as to obtain two independent identical wire patterns by horizontally dividing the wire pattern ZL.

Figure 93:
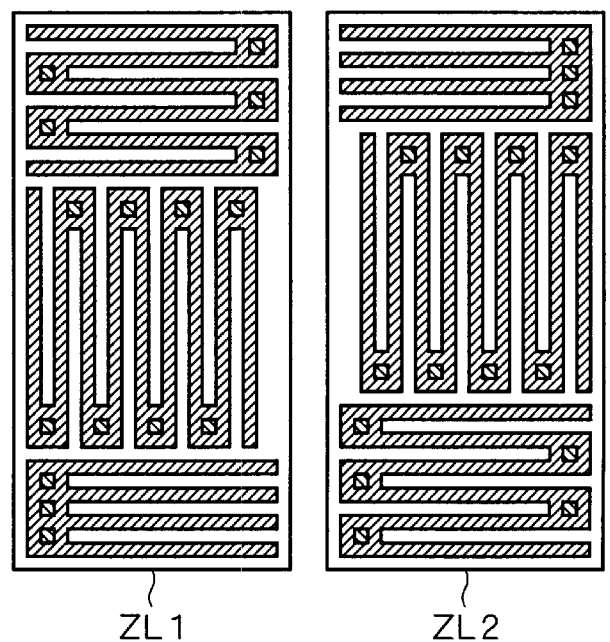
FIG. 93 is a sectional view showing exemplary division of the wire pattern in the embodiment 2 of the present invention.

FIG. 93 shows the wire pattern ZL divided into two wire patterns ZL1 and ZL2. Referring to FIG. 93, the wire patterns ZL1 and ZL2 are obtained by horizontally dividing the wire pattern ZL along a blank part between the right and left patterns.

<B-2. Method of Manufacturing Wire Pattern>

The structure of an exposure mask for wire formation MP for forming the wire pattern ZL is described with reference to FIG. 94.

Figure 94:
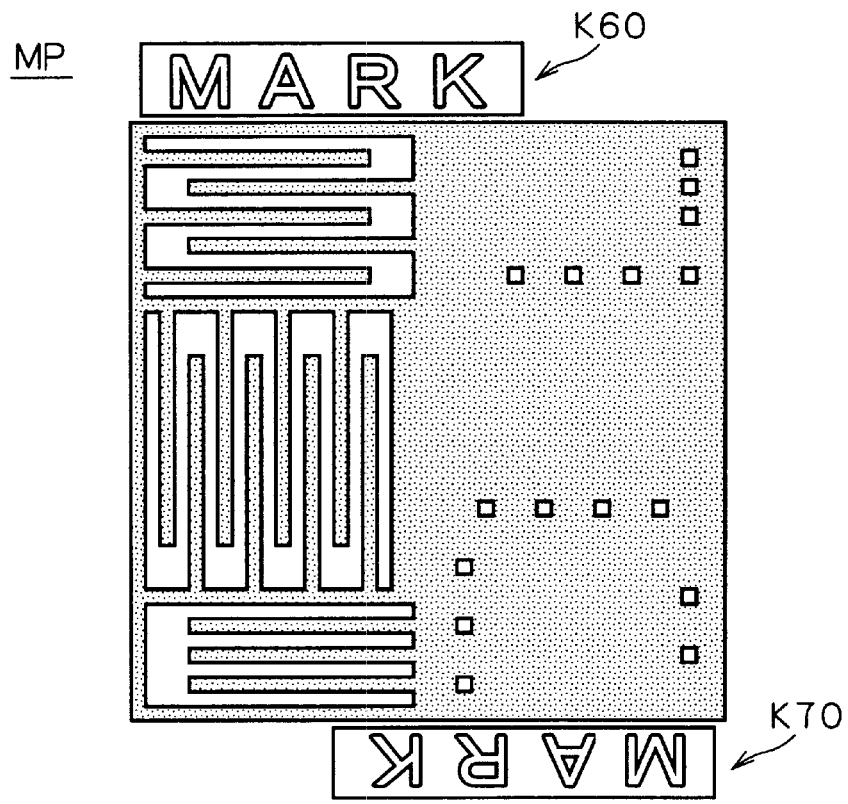
FIG. 94 illustrates an exposure mask for implantation for manufacturing the wire pattern in the embodiment 2 of the present invention.

The exposure mask for wire formation MP shown in FIG. 94 for forming the wires WR and the contact parts CH of the respective patterns has openings in portions corresponding to the wires WR of the patterns LR1 to LR3 and the contact parts CH of the patterns LR11 to LR31. The mask MP is provided on its outer edges with alignment marks K60 and K70 to be superposed with the alignment mark K1 on the semiconductor substrate in the normal position and a reverse position (position rotated by 180° with respect to the normal position) respectively.

A method of manufacturing the wire pattern ZL is now described with reference to FIGS. 95 to 102.

Figure 95:
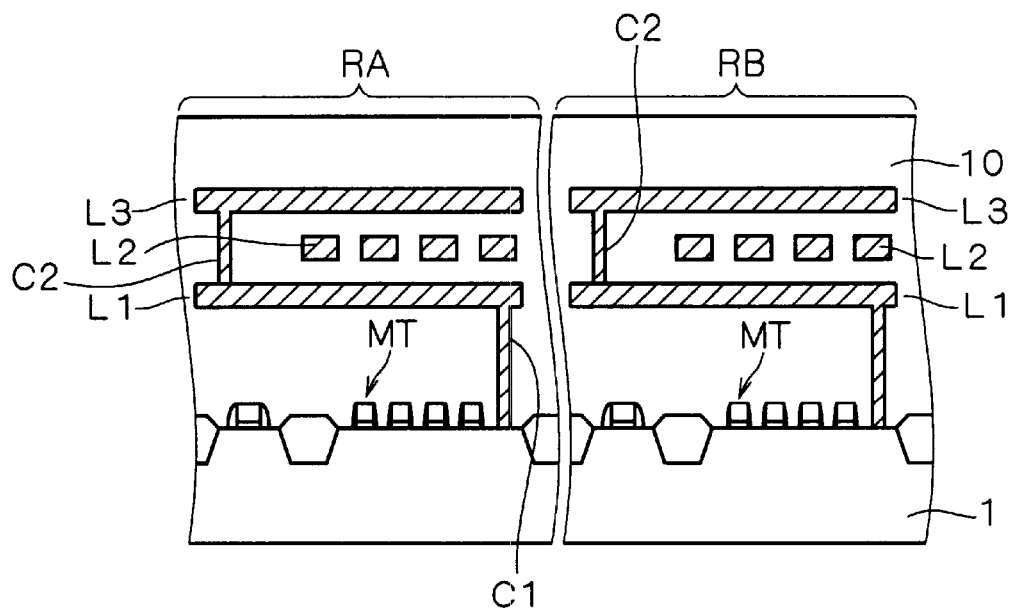
FIGS. 95 to 102 are sectional views illustrating steps of manufacturing the wire pattern in the embodiment 2 of the present invention.

FIG. 95 is a sectional view showing a state preceding formation of the wire pattern ZL with sections of regions RA and RB of the patterns LR3 and LR31 taken along the lines A—A and B—B in FIG. 92 respectively.

As shown in FIG. 95, each of the regions RA and RB has a plurality of MOS transistors MT arranged on a semiconductor substrate 1, an interlayer isolation film 10 arranged to cover the MOS transistors MT and wires L1, L2 and L3 embedded in the interlayer isolation film 10. The wires L1 to L3 are formed in different layers respectively, so that the wire L1 is electrically connected to a semiconductor layer in the semiconductor substrate 1 through a contact part C1 and electrically connected to the wire L3 through a contact part C2.

The wires L2 extend in a direction perpendicular to the wires L1 and L3 and connected to any wire or semiconductor layer (not shown).

The structures of the regions RA and RB are simplified for convenience of illustration of the present invention.

Figure 96:
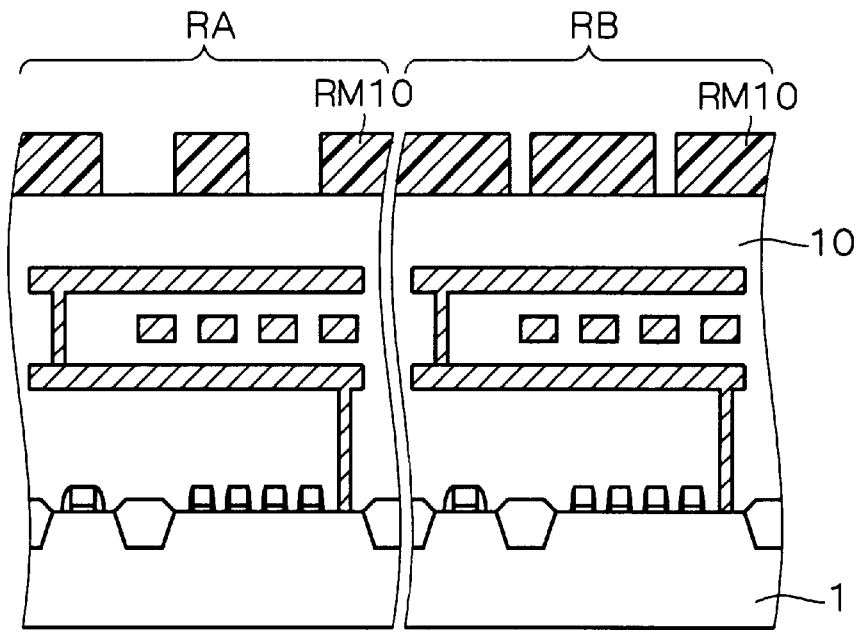

First, the exposure mask for wire formation MP (see FIG. 94) is employed in the normal position for forming a resist mask RM1O covering the interlayer isolation film 10 located on the regions RA and RB, as shown in FIG. 96. At this time, an opening pattern corresponding to the wire WR is formed in the region RA while opening patterns corresponding to the contact parts CH are formed in the region RB.

Figure 97:
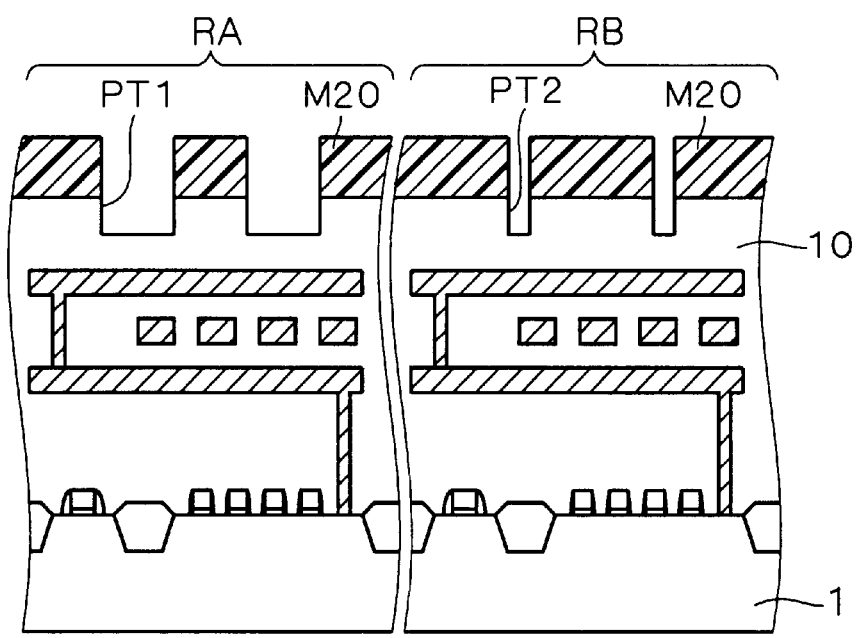

Then, the interlayer isolation film 10 located on the regions RA and RB is etched up to a prescribed depth on the basis of the opening patterns of the resist mask RM10 for forming etching patterns PT1 and PT2, as shown in FIG. 97. This depth is set in coincidence with the depth of the wire WR.

Figure 98:
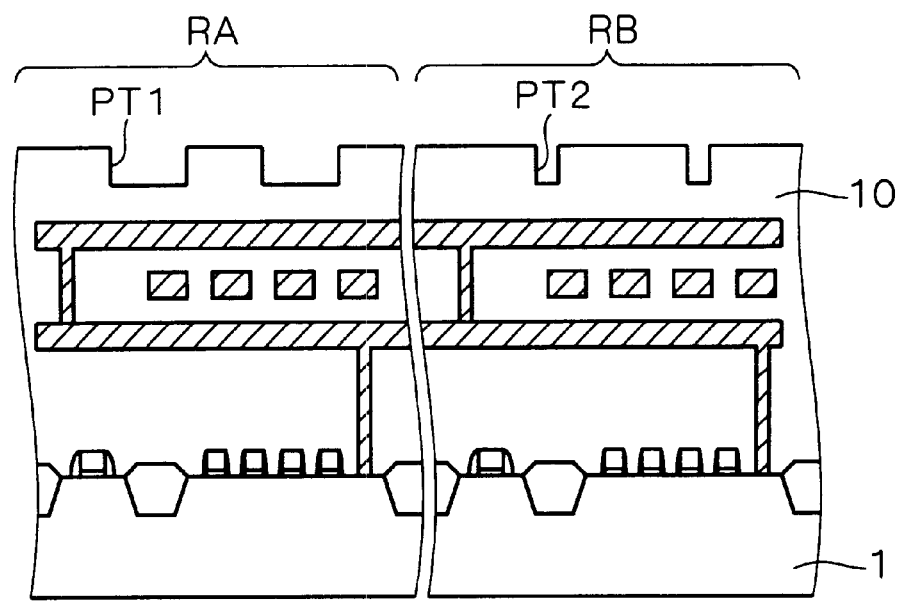
Figure 99:
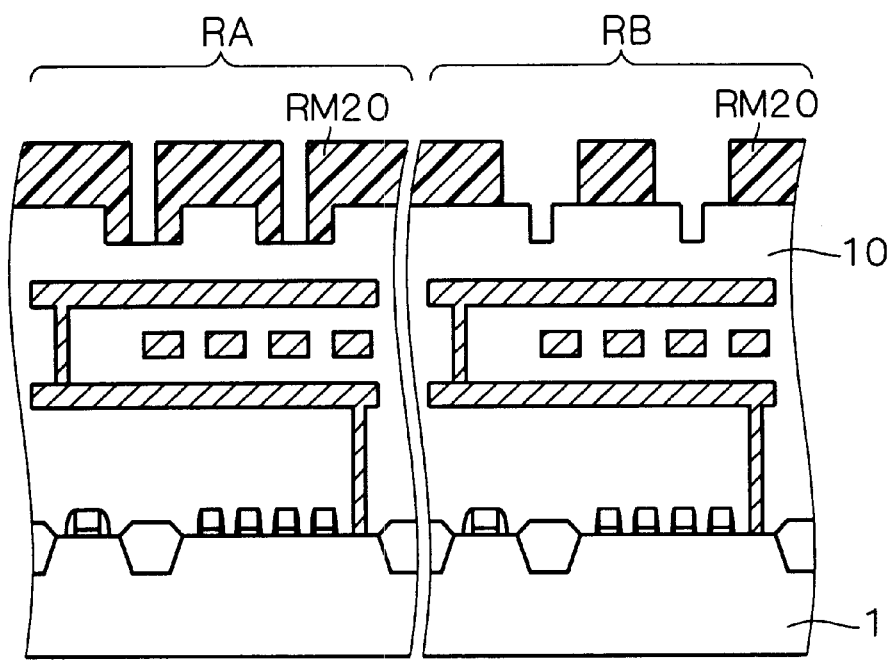

The resist mask RM10 is removed as shown in FIG. 98, and thereafter the exposure mask for wire formation MP (see FIG. 94) is employed in the reverse position for forming a resist mask RM20 covering the interlayer isolation film 10 located on the regions RA and RB, as shown in FIG. 98. At this time, opening patterns corresponding to the contact parts CH are formed in the region RA while an opening pattern corresponding to the wire WR is formed in the region RB.

Figure 100:
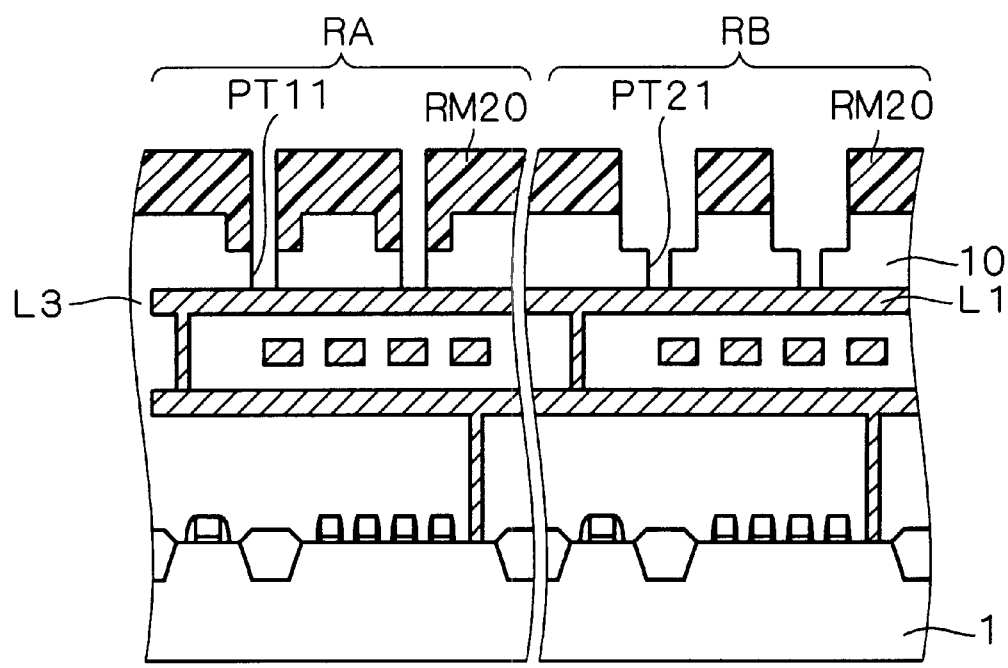
Figure 101:
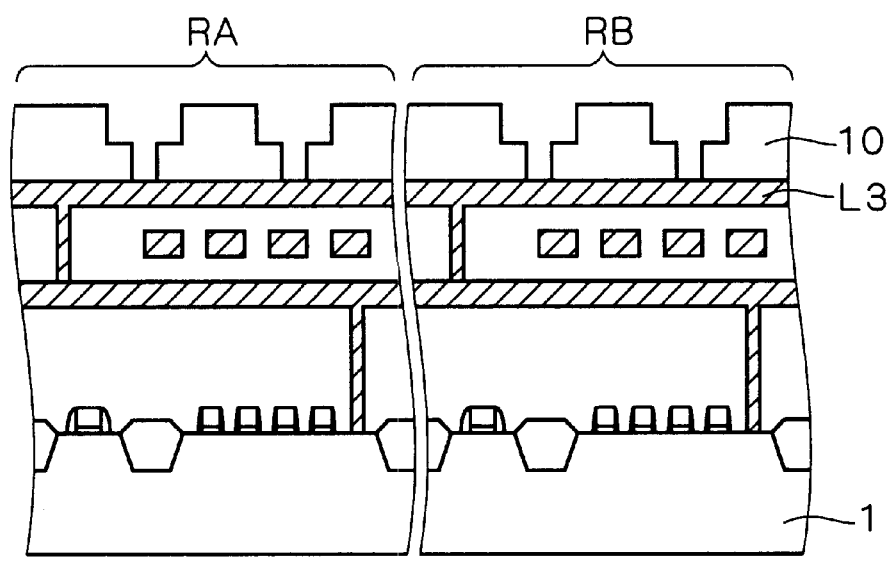
Figure 102:
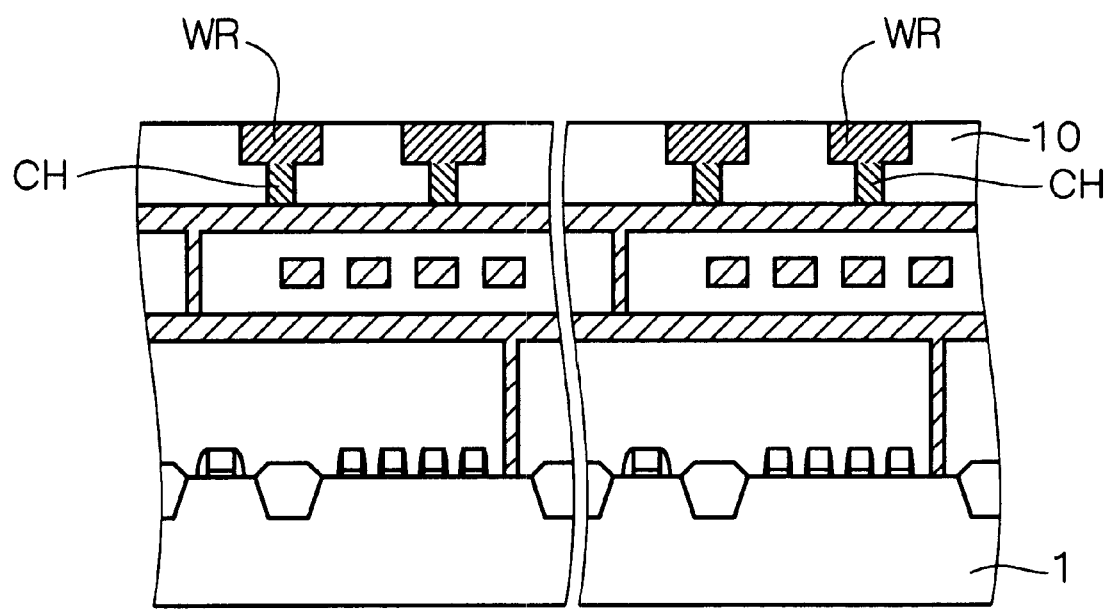

Then, the interlayer isolation film 10 located on the regions RA and RB is further etched on the basis of the opening patterns of the resist mask RM10 for forming etching patterns PT11 and PT21, as shown in FIG. 100. The depth is set in coincidence with the depth of the contact parts CH reaching the wire L3.

The resist mask RM20 is removed, thereafter hole patterns of the etching patterns PT11 and PT12 corresponding to the contact parts CH are filled up with a conductor for forming the contact parts CH, then groove patterns corresponding to the wires WR are also filled up with a conductor for forming the wires WR, and the interlayer isolation film 10 is flattened thereby obtaining the wire pattern ZL shown in FIG. 94.

While the patterns LR1 to LR3 and the patterns LR11 to LR31 are rotationsymmetrically arranged in the wire pattern ZL, the patterns LR1 to LR3 and the patterns LR11 to LR31 may alternatively be line-symmetrical. In this case, it follows that openings of the exposure mask for wire formation MP corresponding to the wires WR and the contact parts CH change in coincidence with the line-symmetrical patterns so that the exposure mask for wire formation MP is used in turnover.

<B-3. Function/Effect>

As hereinabove described, a plurality of equal wire patterns can be simultaneously obtained for reducing the manufacturing cost by forming a single rotation-symmetrical or line-symmetrical wire pattern by varying the arrangement state of a single type of exposure mask for wire formation with the so-called dual damascene method and dividing the same.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device at least comprising:
   a first impurity region of a first impurity concentration having a first pattern formed in a target layer;
   a second impurity region of a second impurity concentration formed in said target layer; and
   a third impurity region having a third impurity concentration corresponding to the total of said first and second impurity concentrations formed in said target layer,
   wherein said first pattern and said second pattern are identical plane patterns or plane patterns having a turnover relationship with each other.

2. The semiconductor device according to claim 1, wherein
   said first and second patterns are rotation-symmetrical.

3. The semiconductor device according to claim 1, wherein
   said first and second patterns are line-symmetrical.

4. The semiconductor device according to claim 1, wherein
   said first and second impurity concentrations are different from each other.

5. The semiconductor device according to claim 1, wherein
   said first and second impurity concentrations are identical to each other.

6. An exposure mask for implantation employed for manufacturing the semiconductor device according to claim 1, used in a first or second arrangement state to satisfy the symmetry between said first and second patterns,
   for forming a pattern for implanting an impurity into said target layer corresponding to said first impurity region and said third impurity region when used in said first arrangement state and implanting an impurity into said target layer in regions corresponding to said second impurity region and said third impurity region when used in said second arrangement state.

7. A semiconductor device at least comprising:
   a plurality of first impurity regions of a first impurity concentration having predetermined patterns formed in a target layer; and
   a symmetrical second impurity region having a second impurity concentration integral times said first impurity concentration formed in said target layer, wherein
   respective said predetermined patterns of said plurality of first impurity regions are formed in symmetry.

8. The semiconductor device according to claim 7, wherein
   each of said predetermined patterns of said plurality of first impurity regions is rotation-symmetrical.

9. The semiconductor device according to claim 7, wherein
   each of said predetermined patterns of said first impurity regions is line-symmetrical.

* * * * *